(12) United States Patent
Lee et al.

(10) Patent No.: US 12,557,477 B2
(45) Date of Patent: Feb. 17, 2026

(54) LIGHT EMITTING DISPLAY DEVICE

(71) Applicant: Samsung Display Co., LTD., Yongin-si (KR)

(72) Inventors: Jun Hee Lee, Hwaseong-si (KR); Hyeon Bum Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 792 days.

(21) Appl. No.: 17/880,436

(22) Filed: Aug. 3, 2022

(65) Prior Publication Data

US 2023/0217717 A1     Jul. 6, 2023

(30) Foreign Application Priority Data

Dec. 30, 2021   (KR) .................. 10-2021-0193390

(51) Int. Cl.
*H01L 27/32* (2006.01)
*H10K 59/122* (2023.01)
*H10K 59/88* (2023.01)

(52) U.S. Cl.
CPC .......... *H10K 59/122* (2023.02); *H10K 59/88* (2023.02)

(58) Field of Classification Search
CPC ...... H10K 59/122; H10K 59/88; H10K 59/38; H10K 59/8792; H10K 71/00; H10K 59/131; H10K 59/124
See application file for complete search history.

(56) References Cited

U.S. PATENT DOCUMENTS

2018/0190750 A1*   7/2018   Choi ................... H10K 59/131

FOREIGN PATENT DOCUMENTS

| KR | 10-2018-0030365 A | 3/2018 |
|----|-------------------|--------|
| KR | 10-2018-0088550 A | 8/2018 |
| KR | 10-2018-0101656 A | 9/2018 |
| KR | 10-2019-0024464 A | 3/2019 |
| KR | 10-2060013 B1     | 12/2019 |
| KR | 10-2020-0108395 A | 9/2020 |
| KR | 10-2020-0115944 A | 10/2020 |
| KR | 10-2020-0133095 A | 11/2020 |

* cited by examiner

*Primary Examiner* — Elmito Breval
(74) *Attorney, Agent, or Firm* — Womble Bond Dickinson (US) LLP

(57) ABSTRACT

A light emitting display device includes: a substrate; a first, a second, and a third conductive pattern on the substrate and extending in a first direction; an organic film covering the first, the second, and the third conductive pattern; an anode on the organic film; and a pixel defining layer having an opening overlapping the anode. The opening of the pixel defining layer overlaps the first, the second, and the third conductive pattern in a plan view. The first, the second, and the third conductive pattern are sequentially positioned in a second direction perpendicular to the first direction. In a portion overlapping the opening of the pixel defining layer in a plan view, a gap between the first conductive pattern and the second conductive pattern in the second direction and a gap between the second conductive pattern and the third conductive pattern in the second direction are the same.

20 Claims, 35 Drawing Sheets

LIGHT EMITTING DISPLAY DEVICE

CROSS-REFERENCE TO RELATED APPLICATION

This application claims priority to and the benefit of Korean Patent Application No. 10-2021-0193390 filed in the Korean Intellectual Property Office (KIPO) on Dec. 30, 2021, the entire content of which is incorporated by reference herein.

BACKGROUND

1. Field

The present disclosure relates to a light emitting display device, and more particularly, to a light emitting display device that may reduce reflective color bands by flattening (e.g., planarizing) an organic film.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

A display device such as an organic light emitting display device may have a structure that can be bent or folded by using a flexible substrate.

In addition, in a small electronic device such as a mobile phone, an optical element such as a camera sensor and an optical sensor is formed in a bezel area around a display area, but as a size of the display area is increased while a size of a peripheral area of the display area is gradually decreased, a technology in which a camera or an optical sensor may be positioned on a rear surface of the display area is being developed.

The above information disclosed in this Background section is only for enhancement of understanding of the background of the described technology, and therefore it may contain information that does not form the prior art.

SUMMARY

Aspects of one or more embodiments of the present disclosure are directed to a light emitting display device that may improve display quality by reducing reflective color bands generated while being asymmetrically reflected due to reflection of external light.

In one or more embodiments, a light emitting display device includes: a substrate; a first conductive pattern, a second conductive pattern, and a third conductive pattern on the substrate, the first conductive pattern, the second conductive pattern, and the third conductive pattern extending in a first direction; an organic film covering the first conductive pattern, the second conductive pattern, and the third conductive pattern; an anode on the organic film; and a pixel defining layer having an opening overlapping the anode. The opening of the pixel defining layer overlaps the first conductive pattern, the second conductive pattern, and the third conductive pattern in a plan view. The first conductive pattern, the second conductive pattern, and the third conductive pattern are sequentially positioned in a second direction perpendicular to the first direction. In a portion overlapping the opening of the pixel defining layer in a plan view, a gap between the first conductive pattern and the second conductive pattern in the second direction and a gap between the second conductive pattern and the third conductive pattern in the second direction are the same.

The first conductive pattern, the second conductive pattern, and the third conductive pattern may be at different conductive layers.

The first conductive pattern may be at a third gate conductive layer, the second conductive pattern may be at a first gate conductive layer, and the third conductive pattern may be at a second gate conductive layer.

The first conductive pattern and the second conductive pattern may be at the same conductive layer, and the third conductive pattern may be at a different conductive layer.

The first conductive pattern and the second conductive pattern may be at a third gate conductive layer, and the third conductive pattern may be at a second gate conductive layer.

The light emitting display device may further include an additional conductive pattern at a different conductive layer from the first conductive pattern, the second conductive pattern, and the third conductive pattern.

The additional conductive pattern may at least partially overlap the second conductive pattern in a plan view.

The additional conductive pattern may be at a first gate conductive layer.

In one or more embodiments, a light emitting display device includes: a substrate; a first conductive pattern, a second conductive pattern, and a third conductive pattern on the substrate and at different conductive layers, the first conductive pattern, the second conductive pattern, and the third conductive pattern extending in a first direction; an organic film covering the first conductive pattern, the second conductive pattern, and the third conductive pattern; an anode on the organic film; and a pixel defining layer having an opening overlapping the anode. The opening of the pixel defining layer overlaps the first conductive pattern, the second conductive pattern, and the third conductive pattern in a plan view. The first conductive pattern, the second conductive pattern, and the third conductive pattern are sequentially positioned in a second direction perpendicular to the first direction. In a portion overlapping the opening of the pixel defining layer in a plan view, at least two of the first conductive pattern, the second conductive pattern, and the third conductive pattern have boundaries that coincide with each other in a plan view.

The first conductive pattern may be at a third gate conductive layer, the second conductive pattern may be at a first gate conductive layer, and the third conductive pattern may be at a second gate conductive layer.

The first conductive pattern may extend in the opening of the pixel defining layer to contact the second conductive pattern in a plan view.

The second conductive pattern may extend in the opening of the pixel defining layer to contact the third conductive pattern in a plan view.

Another embodiment provides a light emitting display device, including: a substrate; a first conductive pattern, a second conductive pattern, a third conductive pattern, and a dummy conductive pattern on the substrate, the first conductive pattern, the second conductive pattern, the third conductive pattern, and the dummy conductive pattern extending in a first direction; an organic film covering the first conductive pattern, the second conductive pattern, the third conductive pattern, and the dummy conductive pattern; an anode on the organic film; a pixel defining layer having an opening overlapping the anode. The opening of the pixel defining layer overlaps the second conductive pattern and the dummy conductive pattern in a plan view. The first conductive pattern, the second conductive pattern, and the third conductive pattern are sequentially positioned in a second direction perpendicular to the first direction. The first conductive pattern and the third conductive pattern do not overlap the opening of the pixel defining layer in a plan view, and are formed along an outer edge of the opening of the pixel defining layer.

The dummy conductive pattern may be between the first conductive pattern and the second conductive pattern in a plan view. In a portion overlapping the opening of the pixel defining layer in a plan view, a gap between the first conductive pattern and the dummy conductive pattern in the second direction and a gap between the second conductive pattern and the third conductive pattern in the second direction may be the same.

In a portion overlapping the opening of the pixel defining layer in a plan view, a gap between the second conductive pattern and the dummy conductive pattern in the second direction may be the same as the gap between the first conductive pattern and the dummy conductive pattern in the second direction and the gap between the second conductive pattern and the third conductive pattern in the second direction.

The first conductive pattern may be at a third gate conductive layer, the second conductive pattern and the dummy conductive pattern may be at a first gate conductive layer, and the third conductive pattern may be at a second gate conductive layer.

In one or more embodiments, a light emitting display device includes: a substrate; a first data conductive layer on the substrate and including a first expansion including a first expansion portion and a second expansion portion; a first organic film covering the first data conductive layer and including a data conductive layer connecting opening overlapping the first expansion portion and the second expansion portion; a second data conductive layer on the first organic film and including a second expansion; a second organic layer covering the second data conductive layer and including a first anode connecting opening and a second anode connecting opening; a first anode on the second organic layer, overlapping the first expansion in a plan view, and connected through the first anode connecting opening; a second anode overlapping the second expansion in a plan view and connected through the second anode connecting opening; and a pixel defining layer having a first opening overlapping the first anode and a second opening overlapping the second anode. The first expansion is asymmetric in a plan view with respect to the first opening of the pixel defining layer.

The first expansion portion and the second expansion portion of the first expansion may protrude in a first direction. Gaps from two sides perpendicular to the first direction of the first expansion up to the first opening of the pixel defining layer may be different from each other. Gaps from two sides in the first direction of the first expansion up to the first opening of the pixel defining layer may be different from each other.

The first expansion portion and the second expansion portion of the first expansion may protrude in a first direction. A width of the first expansion in a second direction perpendicular to the first direction may be different from a width of the second expansion in the second direction.

In one or more embodiments, a light emitting display device includes: a substrate; a first data conductive layer on the substrate and including a first expansion including a first expansion portion and a second expansion portion; a first organic film covering the first data conductive layer and including a data conductive layer connecting opening overlapping the first expansion portion and the second expansion portion; a second data conductive layer on the first organic film and including a second expansion; a second organic layer covering the second data conductive layer and including a first anode connecting opening and a second anode connecting opening; a first anode on the second organic layer, overlapping the first expansion in a plan view, and connected through the first anode connecting opening; a second anode overlapping the second expansion in a plan view and connected through the second anode connecting opening; and a pixel defining layer having a first opening overlapping the first anode and a second opening overlapping the second anode. The second expansion is asymmetric in a plan view with respect to the second opening of the pixel defining layer.

According to one or more embodiments, gate conductive layers positioned under an anode are positioned at set gaps (e.g., predetermined gaps) so that they are formed symmetrically based on an opening of the anode or a pixel defining layer, so that the anode is evenly flattened (e.g., evenly planarized), thereby preventing or substantially preventing reflected light from asymmetrically spreading. In addition, according to one or more embodiments, an expansion positioned under an anode is formed asymmetrically based on an opening of the anode or a pixel defining layer, so that a portion of the anode that is not flattened is more flattened, thereby preventing or substantially preventing reflected light from asymmetrically spreading. As a result, it is possible to improve display quality by reducing reflective color bands due to color spread (color separation) caused by the reflected light. In addition, in one or more embodiments, it is possible to reduce a ratio of external light being reflected by using a pixel defining layer that separates light emitting layers from each other instead of a polarizing plate.

DETAILED DESCRIPTION

Figure 1:
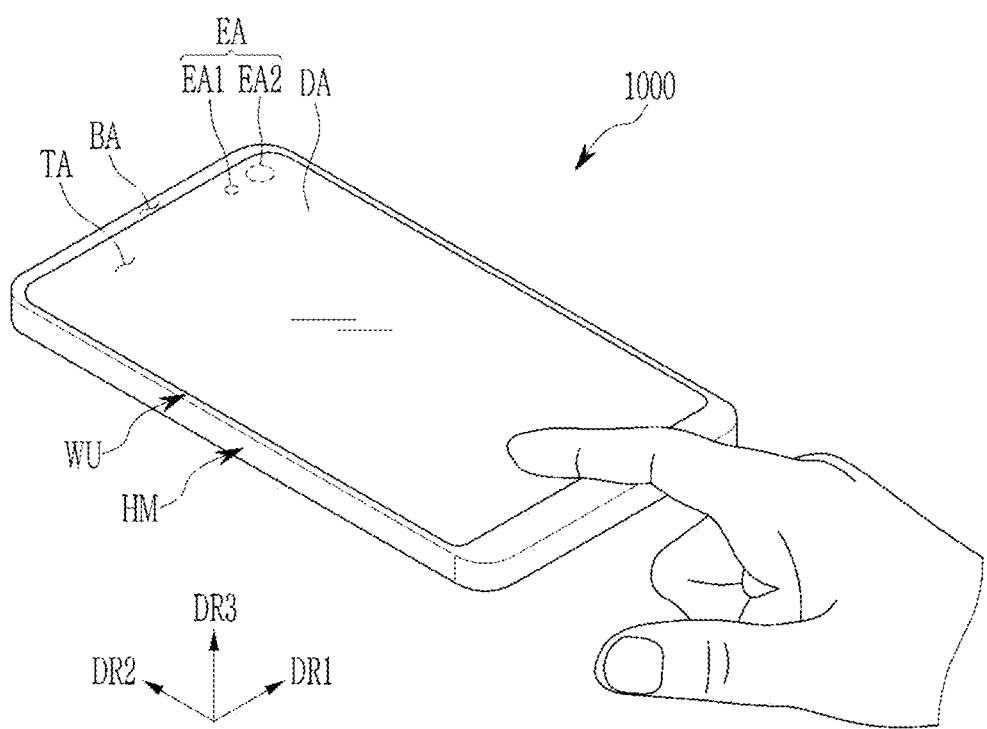
FIG. 1 illustrates a schematic perspective view of a use state of a display device according to one or more embodiments.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, in the drawings, the size and thickness of each element may be arbitrarily illustrated for ease of description, and the present disclosure is not necessarily limited to those illustrated in the drawings. In the drawings, the thicknesses of layers, films, panels, regions, areas, etc., may be exaggerated for clarity.

It will be understood that when an element such as a layer, film, region, area, substrate, plate, or constituent element is referred to as being "on" another element, it can be directly on the other element or intervening elements may also be present. In contrast, when an element is referred to as being "directly on" another element, there are no intervening elements present. Further, in the specification, the word "on" or "above" can refer to positioned on or below the object portion, and does not necessarily refer to positioned on the upper side of the object portion based on a gravitational direction.

As used herein, the singular forms "a," "an," and "the" are intended to include the plural forms as well, unless the context clearly indicates otherwise.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure."

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure.

Further, throughout the specification, the phrase "in a plan view" or "on a plane" refers to viewing a target portion from the top, and the phrase "in a cross-sectional view" or "on a cross-section" refers to viewing a cross-section formed by vertically cutting a target portion from the side.

In addition, throughout the specification, "connected" does not refer to only when two or more elements are directly connected, but when two or more elements are indirectly connected through other elements, and when they are physically connected or electrically connected, and further, it may be referred to by different names depending on a position or function, and may also be referred to as a case in which respective parts that are substantially integrated are linked to each other.

In addition, throughout the specification, when it is said that an element such as a wire, layer, film, region, area, substrate, plate, or constituent element "is extended (or extends) in a first direction or second direction", this does not refer to only a straight shape extending straight in the corresponding direction, but may refer to a structure that substantially extends in the first direction or the second direction, is partially bent, has a zigzag structure, or extends while having a curved structure.

In addition, an electronic device (e.g., a mobile phone, a TV, a monitor, a laptop computer, etc.) including a display device, or a display panel described in the specification, and an electronic device including a display device and a display panel manufactured by a manufacturing method described in the specification, are not excluded from the scope of the present disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
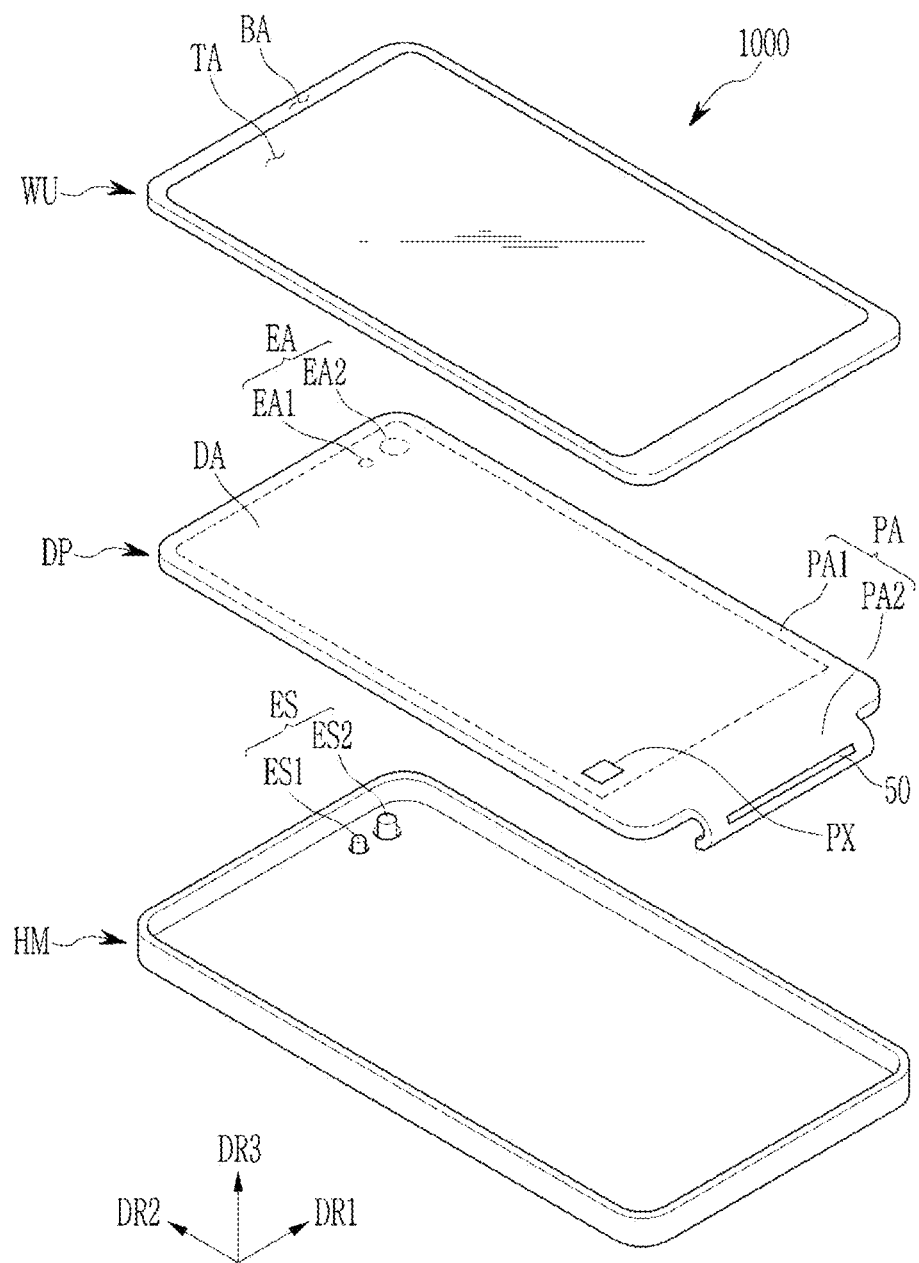
FIG. 2 illustrates an exploded perspective view of a display device according to one or more embodiments.
Figure 3:
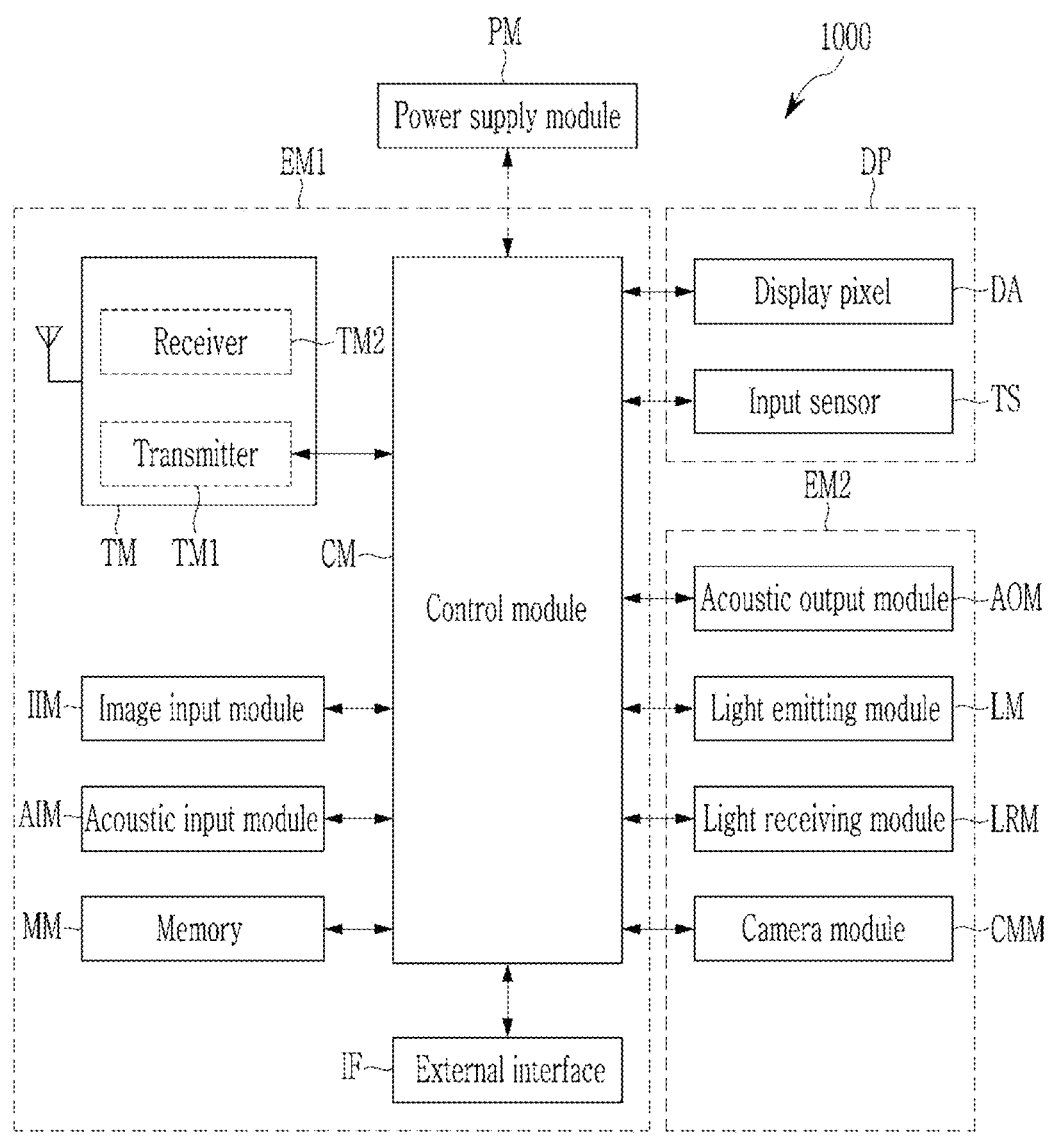
FIG. 3 illustrates a block diagram of a display device according to one or more embodiments.

Hereinafter, a schematic structure of a display device will be described with reference to FIG. 1 to FIG. 3. FIG. 1 illustrates a schematic perspective view of a use state of a display device according to one or more embodiments, FIG. 2 illustrates an exploded perspective view of a display device according to one or more embodiments, and FIG. 3 illustrates a block diagram of a display device according to one or more embodiments.

Referring to FIG. 1, a display device 1000 according to one or more embodiments is a device for displaying a moving image or a still image, and may be used as a display screen of a portable electronic device such as a mobile phone, a smart phone, a tablet personal computer (PC), a mobile communication terminal, an electronic notebook, an electronic book, a portable multimedia player (PMP), a navigation device, and/or an ultra-mobile PC (UMPC), and may be used as display screens of various suitable products such as a television set, a laptop computer, a monitor, a billboard, and/or an Internet of things (IOT) device. In addition, the display device 1000 according to one or more embodiments may be used in a wearable device such as a smart watch, a watch phone, a glasses display, and/or a head mounted display (HMD). In addition, the display device 1000 according to one or more embodiments may be used as an instrument panel of a vehicle, a center information display (CID) disposed on a center fascia or dashboard of a vehicle, a room mirror display that replaces a side mirror of a vehicle, and a display disposed on the back of a front seat for entertainment for a rear seat of a vehicle. For better comprehension and ease of description, FIG. 1 illustrates a case in which that the display device 1000 is used for a smart phone.

The display device 1000 may display an image toward a third direction DR3 on a display surface perpendicular to each of a first direction DR1 and a second direction DR2. A display surface on which an image is displayed may correspond to a front surface of the display device 1000, and may correspond to a front surface of a cover window WU. An image may include a static image as well as a dynamic image.

In the present embodiment, a front surface (or a top surface) and a rear surface (or a bottom surface) of each member are defined based on a direction in which an image is displayed. The front and rear surfaces may be opposite to each other in the third direction DR3, and a normal direction of each of the front and rear surfaces may be parallel to the third direction DR3. A separation distance in the third direction DR3 between the front and rear surfaces may correspond to a thickness of a display panel in the third direction DR3.

The display device 1000 according to one or more embodiments may detect a user's input (e.g., see a hand of FIG. 1) applied from the outside. The user's input may include various suitable types of external inputs such as a part of the user's body, light, heat, and/or pressure. In one or more embodiments, the user's input is shown to be the user's hand applied to the front surface. However, the present disclosure is not limited thereto. The user's input may be variously provided, and the display device 1000 may sense the user's input applied to the lateral or rear surface of the display device 1000 according to the structure of the display device 1000.

Referring to FIG. 1 and FIG. 2, the display device 1000 may include the cover window WU, a housing HM, a display panel DP, and an optical element ES. In one or more embodiments, the cover window WU and the housing HM may be combined to form an appearance of the display device 1000.

The cover window WU may include an insulating panel. For example, the cover window WU may be made of glass, plastic, or a combination thereof.

A front surface of the cover window WU may define the front surface of the display device 1000. A transmissive area TA may be an optically transparent area. For example, the transmissive area TA may be an area having visible ray transmittance of about 90% or more.

A blocking area BA may define a shape of the transmissive area TA. The blocking area BA may be adjacent to the transmissive area TA, and may surround the transmissive area TA. The blocking area BA may be an area having relatively low light transmittance compared with the transmissive area TA. The blocking area BA may include an opaque material that blocks light. The blocking area BA may have a set or predetermined color. The blocking area BA may be defined by a bezel layer provided separately from a transparent substrate defining the transmissive area TA, or may be defined by an ink layer formed by being inserted into or coloring the transparent substrate.

The display device 1000 may include a display panel DP for displaying an image and a driver 50. The display panel DP may include a front surface that includes a display area DA and a non-display area PA. The display area DA may be an area in which a pixel operates to emit light according to an electrical signal.

In one or more embodiments, the display area DA may be an area that includes a pixel and in which an image is displayed, and may be an area in which a touch sensor is positioned at an upper side of the pixel in the third direction DR3 to sense an external input.

The transmissive area TA of the cover window WU may at least partially overlap the display area DA of the display panel DP. For example, the transmissive area TA may overlap the front surface of the display area DA, or may overlap at least a portion of the display area DA. Accordingly, a user may view an image through the transmissive area TA, or may provide an external input based on the image. However, the present disclosure is not limited thereto. For example, the display area DA may be divided into an area in which an image is displayed and an area in which an external input is sensed.

The non-display area PA of the display panel DP may at least partially overlap the blocking area BA of the cover window WU. The non-display area PA may be an area covered by the blocking area BA. The non-display area PA may be adjacent to the display area DA, and may surround the display area DA. No image is displayed in the non-display area PA, and a driving circuit or driving wire for driving the display area DA may be disposed therein. The non-display area PA may include a first peripheral area PA1 in which the display area DA is positioned at an outer side thereof, and a second peripheral area PA2 including the driver 50, a connecting wire, and a bending area. In the embodiment of FIG. 2, the first peripheral area PA1 is positioned at three sides of the display area DA, while the second peripheral area PA2 is positioned on the other side of the display area DA.

In one or more embodiments, the display panel DP may be assembled in a flat state in which the display area DA and the non-display area PA are directed toward the cover window WU. However, the present disclosure is not limited thereto. A portion of the non-display area PA of the display panel DP may be bent. In this case, a portion of the non-display area PA faces the rear surface of the display device 1000, so that the blocking area BA shown on the front surface of the display device 1000 may be reduced, and in FIG. 2, the second peripheral area PA2 is bent, so that it may be assembled after disposing it on the rear surface of the display area DA.

In one or more embodiments, the display panel DP may include a component area EA, specifically, a first component area EA1 and a second component area EA2. The first component area EA1 and the second component area EA2 may be at least partially surrounded by the display area DA. The first component area EA1 and the second component area EA2 are illustrated as being spaced from each other, but are not limited thereto. For example, the first component area EA1 and the second component area EA2 may be partially connected. The first component area EA1 and the second component area EA2 may be areas in which a component using infrared light, visible light, or sound is disposed thereunder.

A plurality of light emitting diodes, and a plurality of pixel circuits that generate and transmit a light emitting current to each of the plurality of light emitting diodes, are formed in the display area DA. Here, one light emitting diode and one pixel circuit are referred to as a pixel PX. One pixel circuit part and one light emitting diode are formed at a one-to-one ratio in the display area DA.

The first component area EA1 includes an area formed of a transparent layer to allow light to pass therethrough, a conductive layer or a semiconductor layer is not positioned therein, and a pixel defining layer and a light blocking layer including a light blocking material include an opening overlapping a position corresponding to the first component area EA1, so that the first component area EA1 may have a structure that does not block light.

The second component area EA2 may include a transmissive part through which light and/or sound may pass and a display part including a plurality of pixels. The transmissive part is positioned between adjacent pixels, and is configured of a transparent layer through which light and/or sound may pass. The display part may be formed to have one unit structure by combining the plurality of pixels, and the transmissive part may be positioned between adjacent unit structures.

Referring to FIG. 3 together with FIG. 1 and FIG. 2, the display panel DP may include the display area DA including a display pixel, and a touch sensor TS. The display panel DP may be viewed by a user from the outside through the transmissive area TA, by including the pixel, which is a component that displays an image. In one or more embodiments, the touch sensor TS may be positioned on the pixel, and may sense an external input applied from the outside. The touch sensor TS may sense an external input provided to the cover window WU.

Referring back to FIG. 2, the second peripheral area PA2 may include a bending part. The display area DA and the first peripheral area PA1 may have a flat state substantially parallel to a plane defined by the first direction DR1 and the second direction DR2, and one side of the second peripheral area PA2 may extend from the flat state through the bending part to have a flat state again. As a result, at least a portion of the second peripheral area PA2 may be bent to be assembled to be positioned on the rear surface side of the display area DA. Because at least a portion of the second peripheral area PA2 overlaps the display area DA in a plan view when assembled, the blocking area BA of the display device 1000 may be reduced. However, the present disclosure is not limited thereto. For example, the second peripheral area PA2 may not be bent.

The driver 50 may be mounted on the second peripheral area PA2, mounted on the bending part, or positioned at one of opposing sides of the bending part. The driver 50 may be provided in a form of a chip.

The driver 50 may be connected (e.g., electrically connected) to the display area DA to transmit an electrical signal to the display area DA. For example, the driver 50 may provide data signals to pixels PX disposed in the display area DA. In one or more embodiments, the driver 50 may include a touch driving circuit, and may be connected (e.g., electrically connected) to the touch sensor TS disposed in the display area DA. In one or more embodiments, the driver 50 may include various suitable circuits in addition to the above-described circuits, or may be designed to provide various suitable electrical signals to the display area DA.

In one or more embodiments, a pad part may be positioned at an end of the second peripheral area PA2, and the display device 1000 may be connected (e.g., electrically connected) to a flexible printed circuit board (FPCB) including a driving chip by the pad part. Here, the driving chip positioned on the flexible printed circuit board may include various suitable driving circuits for driving the display device 1000 or connectors for supplying of power. In one or more embodiments, instead of the flexible printed circuit board, a rigid printed circuit board (PCB) may be used.

The optical element ES may be disposed under the display panel DP. The optical element ES may include a first optical element ES1 overlapping the first component area EA1 and a second optical element ES2 overlapping the second component area EA2.

The first optical element ES1 may be an electronic element using light and/or sound. For example, the first optical element ES1 may be a sensor that receives and uses light such as an infrared sensor, a sensor that outputs and detects light and/or sound to measure a distance or recognize a fingerprint, a small-sized lamp that outputs light, a speaker that outputs sound, and/or the like. In a case of an electronic element using light, light of various suitable wavelength bands such as visible light, infrared light, and ultraviolet light may be used.

The second optical element ES2 may be at least one of a camera, an infrared camera (IR camera), a dot projector, an infrared illuminator, and a time-of-flight sensor (ToF sensor).

Referring to FIG. 3, the display device 1000 may include the display panel DP, a power supply module PM, a first electronic module EM1, and a second electronic module EM2. The display panel DP, the power supply module PM, the first electronic module EM1, and the second electronic module EM2 may be connected (e.g., electrically connected) to each other. FIG. 3 shows the display pixel and the touch sensor TS positioned in the display area DA of the display panel DP by way of example.

The power supply module PM may supply power required for an overall operation of the display device 1000. The power supply module PM may include any suitable battery module.

The first electronic module EM1 and the second electronic module EM2 may include various suitable functional modules for operating the display device 1000. The first electronic module EM1 may be directly mounted on a motherboard connected (e.g., electrically connected) to the display panel DP, or mounted on a separate substrate to be connected (e.g., electrically connected) to the motherboard through a connector.

The first electronic module EM1 may include a control module CM, a wireless communication module TM, an image input module IIM, an audio input module AIM, a memory MM, and an external interface IF. Some of the modules are not mounted on the motherboard, but may be connected (e.g., electrically connected) to the motherboard through the flexible printed circuit board connected thereto.

The control module CM may control the overall operation of the display device 1000. The control module CM may be a microprocessor. For example, the control module CM activates or deactivates the display panel DP. The control module CM may control other modules such as the image input module IIM or the audio input module AIM based on a touch signal received from the display panel DP.

The wireless communication module TM may transmit/receive a wireless signal with another terminal by using a Bluetooth or Wi-Fi line. The wireless communication module TM may transmit/receive a voice signal by using a general communication line. The wireless communication module TM includes a transmitter TM1 that modulates and transmits a signal to be transmitted, and a receiver TM2 that demodulates a received signal.

The image input module IIM may process an image signal to convert it into image data that may be displayed on the display panel DP. The audio input module AIM may receive an external audio signal inputted by a microphone in a recording mode, a voice recognition mode, etc. and convert it into electrical voice data.

The external interface IF may serve as an interface connected to an external charger, a wired/wireless data port, a card socket (e.g., a memory card, a SIM/UIM card), and/or the like.

The second electronic module EM2 may include an audio output module AOM, a light emitting module LM, a light receiving module LRM, and a camera module CMM, and at least some of them are the optical elements ES and may be positioned on the rear surface of the display panel DP as shown in FIG. 1 and FIG. 2. The optical element ES may include the light emitting module LM, the light receiving module LRM, and the camera module CMM. In one or more embodiments, the second electronic module EM2 may be directly mounted on the motherboard, mounted on a separate substrate to be connected (e.g., electrically connected) to the display panel DP through a connector, or connected (e.g., electrically connected) to the first electronic module EM1.

The audio output module AOM may convert audio data received from the wireless communication module TM or audio data stored in the memory MM to output it to the outside.

The light emitting module LM may generate and output light. The light emitting module LM may output infrared rays. For example, the light emitting module LM may include an LED element. For example, the light receiving module LRM may detect infrared rays. The light receiving module LRM may be activated when infrared rays of a set level (e.g., a predetermined level) or more are sensed. The light receiving module LRM may include a CMOS sensor. After the infrared light generated by the light emitting module LM is outputted, it may be reflected by an external object (e.g., a user's finger or face), and then the reflected infrared light may be incident on the light receiving module LRM. The camera module CMM may capture an external image.

In one or more embodiments, the optical element ES may additionally include a light sensor or a thermal sensor. The optical element ES may sense an external object received through the front surface thereof, or may provide a sound signal such as a voice through the front surface to the outside. In one or more embodiments, the optical element ES may include a plurality of constituent elements, and is not limited to any one embodiment.

Referring back to FIG. 2, the housing HM may be combined with the cover window WU. The cover window WU may be disposed on the front surface of the housing HM. The housing HM may be combined with the cover window WU to provide a set accommodation space (e.g., a predetermined accommodation space). The display panel DP and the optical element ES may be accommodated in the set accommodation space (e.g., the predetermined accommodation space) provided between the housing HM and the cover window WU.

The housing HM may include a material with relatively high rigidity. For example, the housing HM may include a plurality of frames and/or plates made of glass, plastic, or metal, or a combination thereof. The housing HM may stably protect the components of the display device 1000 accommodated in an inner space thereof from external impact.

Figure 4:
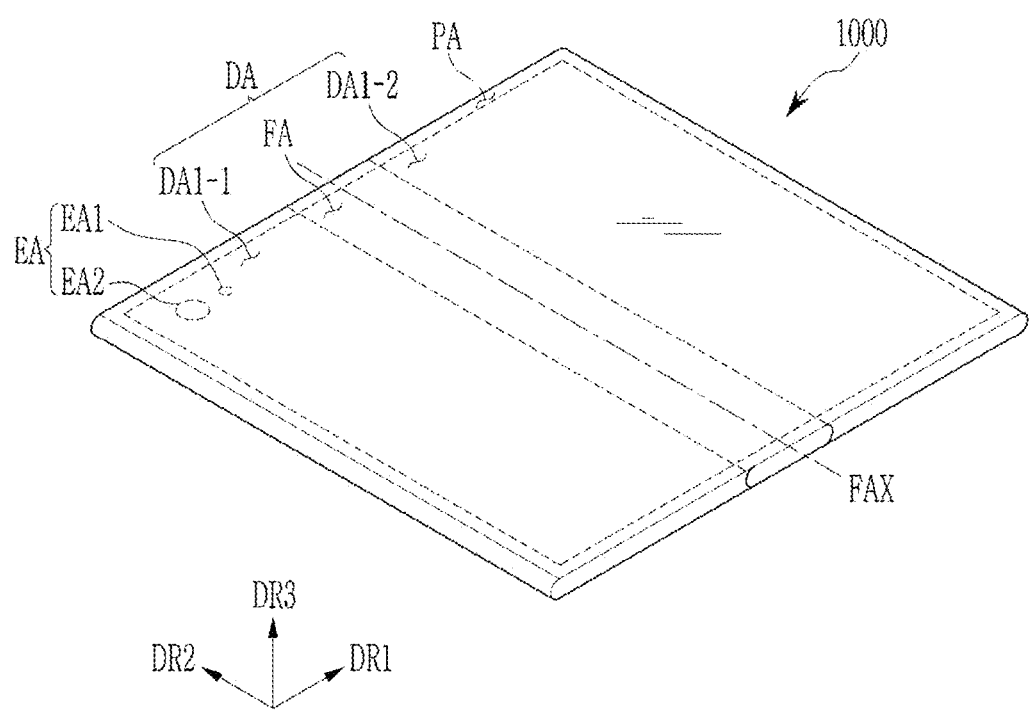
FIG. 4 illustrates a schematic perspective view of a light emitting display device according to another embodiment.

Hereinafter, a structure of a display device 1000 according to another embodiment will be described with reference to FIG. 4. FIG. 4 illustrates a schematic perspective view of a display device according to another embodiment. A description of the same constituent elements as described above will not be provided.

FIG. 4 illustrates a foldable display device in which the display device 1000 is folded through a folding line FAX.

Referring to FIG. 4, in one or more embodiments, the display device 1000 may be a foldable display device. The display device 1000 may be folded outwardly or inwardly based on the folding axis FAX. When the display device 1000 is folded outwardly based on the folding axis FAX, display surfaces thereof are each positioned at outer sides in the third direction DR3, so that images may be displayed in both directions. When the light emitting display device 1000 is folded inwardly based on the folding axis FAX, the display surfaces thereof may not be viewed from the outside.

In one or more embodiments, the display device 1000 may include a display area DA, a component area EA, and a non-display area PA. The display area DA may be divided into a (1-1)-th display area DA1-1, a (1-2)-th display area DA1-2, and a folding area FA. The (1-1)-th display area DA1-1 and the (1-2)-th display area DA1-2 may be positioned at the left and right sides, respectively, based on (or at the center) the folding axis FAX, while the folding area FA may be positioned between the (1-1)-th display area DA1-1 and the (1-2)-th display area DA1-2. In this case, when folded outwardly based on the folding axis FAX, the (1-1)-th display area DA1-1 and the (1-2)-th display area DA1-2 are positioned at opposite sides in the third direction DR3, and an image may be displayed in both directions. In one or more embodiments, when folded inwardly based on the folding axis FAX, the (1-1)-th display area DA1-1 and the (1-2)-th display area DA1-2 may not be viewed from the outside.

Figure 5:
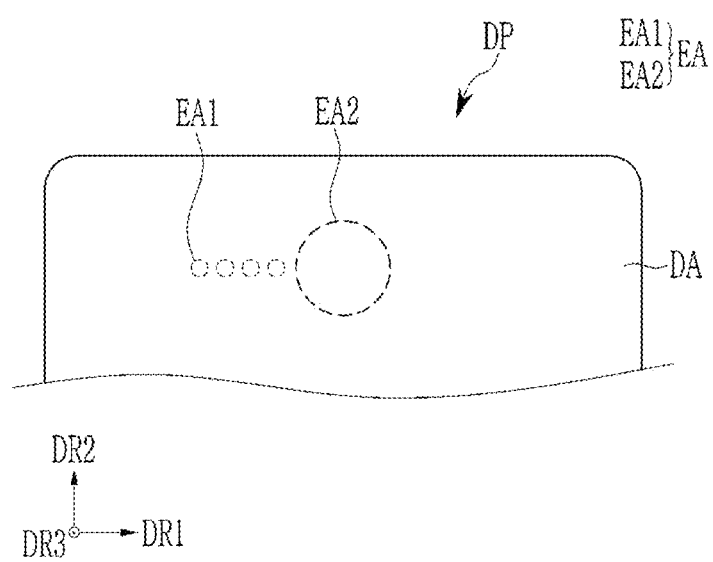
FIG. 5 illustrates an enlarged top plan view of a partial area of a light emitting display device according to one or more embodiments.

FIG. 5 illustrates an enlarged top plan view of a partial area of a light emitting display device according to one or more embodiments.

FIG. 5 illustrates a portion of the light emitting display panel DP of the light emitting display device according to one or more embodiments where the display panel is for a mobile phone.

The light emitting display panel DP has the display area DA positioned on the front surface thereof, and may include the component area EA on the front surface thereof, and specifically, may include the first component area EA1 and the second component area EA2. Additionally, in the embodiment of FIG. 5, the first component area EA1 is positioned to be adjacent to the second component area EA2. In the embodiment of FIG. 5, the first component area EA1 is positioned at the left side of the second component area EA2. The position and number of first component areas EA1 may vary in accordance with one or more embodiments. In FIG. 5, an optical element corresponding to the second component area EA2 may be a camera, and an optical element corresponding to the first component area EA1 may be a light sensor.

A plurality of light emitting diodes, and a plurality of pixel circuits that generate and transmit a light emitting current to each of the plurality of light emitting diodes, are formed in the display area DA. Here, one light emitting diode and one pixel circuit are referred to as a pixel PX. One pixel circuit part and one light emitting diode are formed at a one-to-one ratio in the display area DA. The display area DA is hereinafter also referred to as a 'normal display area'. Although a structure of the light emitting display panel DP below a cutting line is not shown in FIG. 5, the display area DA may be positioned below the cutting line.

The first component area EA1 is configured of only a transparent layer to allow light to pass therethrough, a conductive layer or a semiconductor layer is not positioned therein, it has an optical sensor area (OPS) in a lower panel layer thereof, and an opening (hereinafter also referred to as an additional opening) is formed in a pixel defining layer 380, a light blocking member 220, and a color filter layer 230 of an upper panel layer thereof at a position corresponding to the first component area EA1, so that it may have a structure that does not block light. In one or more embodiments, even if the optical sensor area (OPS) is positioned in the lower panel layer, when there is no opening corresponding to the upper panel layer, it may be the display area DA rather than the first component area EA1. FIG. 7 to FIG. 20, which will be described below, show one pixel and one optical sensor area (OPS) that may have a pixel structure of the first component area EA1 or the display area DA.

The light emitting display panel DP according to one or more embodiments may be largely divided into the lower panel layer and the upper panel layer. The lower panel layer is a portion in which the light emitting diode and the pixel circuit part configuring the pixel are positioned, and may include an encapsulation layer 400 (e.g., see FIG. 20) covering it. For example, the lower panel layer is from a substrate 100 (e.g., see FIG. 20) to the encapsulation layer 400, includes an anode (Anode), a pixel defining layer 380 (e.g., see FIG. 20), a light emitting layer EML (e.g., see FIG. 20), a spacer 385 (e.g., see FIG. 20), a functional layer FL (e.g., see FIG. 20), a cathode (Cathode) (e.g., see FIG. 20), and includes an insulating film, a semiconductor layer, and a conductive layer between the substrate and the anode. In one or more embodiments, the upper panel layer is a portion positioned at an upper portion of the encapsulation layer, may include sensing insulating layers 501, 510, and 511 (e.g., see FIG. 20) capable of sensing a touch and a plurality of sensing electrodes 540 and 541 (e.g., see FIG. 20), and may include a light blocking member 220 (e.g., see FIG. 20), a color filter 230 (e.g., see FIG. 20), and a flattening layer 550 (e.g., see FIG. 20).

In one or more embodiments, a structure of the lower panel layer of the display area DA will be described with reference to FIG. 7 to FIG. 20.

Although not shown in FIG. 5, a peripheral area may be further positioned outside the display area DA. In addition, although FIG. 5 illustrates the display panel for the mobile phone, the present embodiment may be applied as long as it is a display panel in which the optical element may be positioned on the rear surface of the display panel, and it may be a flexible display device. In a case of a foldable display device among the flexible display devices, positions of the second component area EA2 and the first component area EA2 may be different from those of FIG. 5.

Hereinafter, a circuit structure of the pixel positioned in the lower panel layer of the light emitting display panel DP will be described in more detail with reference to FIG. 6.

The following pixel structure may be a pixel structure of the display area DA and/or the second component area EA2 including the optical sensor area (OPS). Here, the optical sensor area (OPS) is a portion that may correspond to the first component area EA1 when a portion blocking light such as a light blocking member is removed from an upper portion of the optical sensor area (OPS), and it may be included in the display area DA when light is blocked by the light blocking member on the upper portion of the optical sensor area (OPS).

Figure 6:
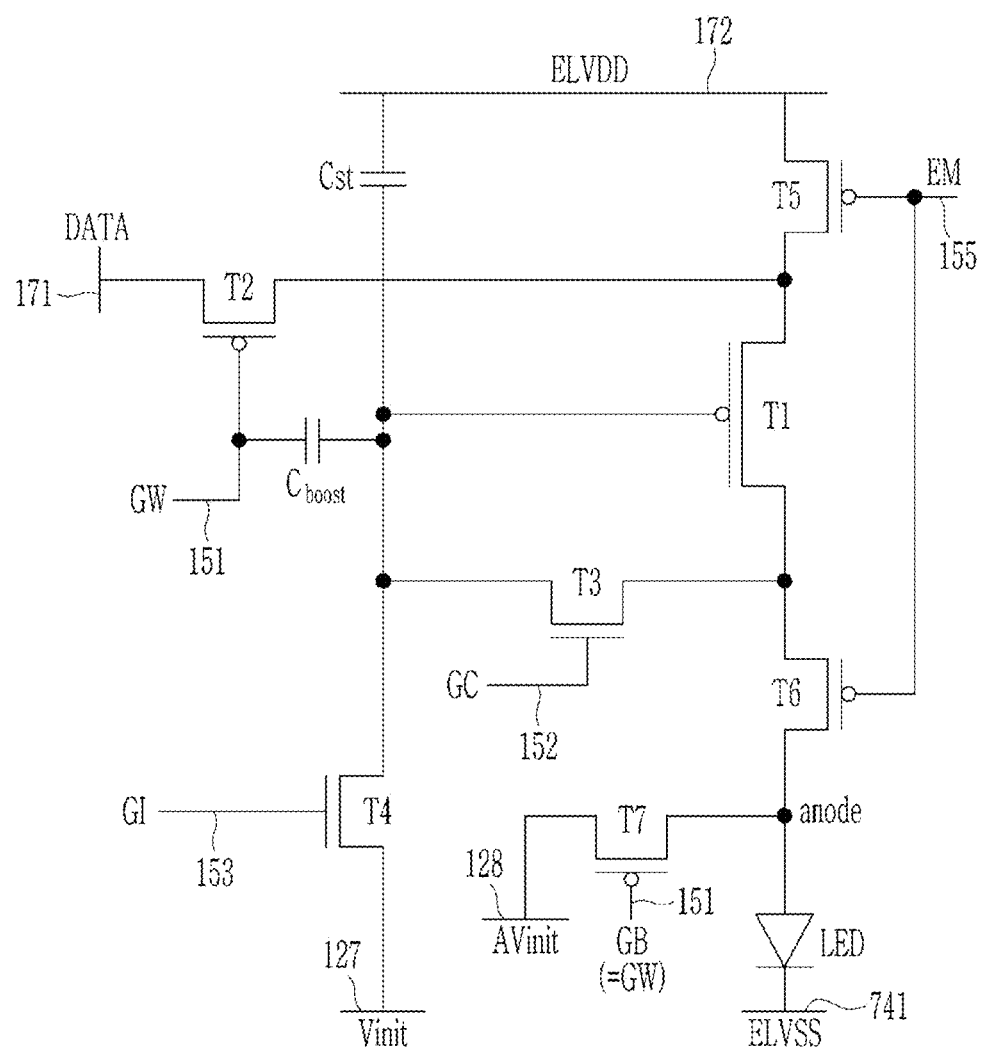
FIG. 6 illustrates a circuit diagram of one pixel included in a light emitting display device according to one or more embodiments.

FIG. 6 illustrates a circuit diagram of one pixel included in a light emitting display device according to one or more embodiments.

One pixel according to one or more embodiments includes transistors T1, T2, T3, T4, T5, T6, and T7, a storage capacitor Cst, a boost capacitor $C_{boost}$, and a light emitting diode LED, connected to a plurality of wires 127, 128, 151, 152, 153, 155, 171, 172, and 741. Here, the transistors and the capacitors excluding the light emitting diode LED form a pixel circuit part. In one or more embodiments, the boost capacitor $C_{boost}$ may not be provided.

The plurality of wires 127, 128, 151, 152, 153, 155, 171, 172, and 741 are connected to one pixel PX. The plurality of wires includes a first initialization voltage line 127, a second initialization voltage line 128, a first scan line 151, a second scan line 152, an initialization control line 153, a light emitting control line 155, a data line 171, a driving voltage line 172, and a common voltage line 741. The first scan line 151 connected to the seventh transistor T7 is also connected to the second transistor T2, but in one or more embodiments, the seventh transistor T7, unlike the second transistor T2, may be connected to a bypass control line.

The first scan line 151 is connected to a scan driver to transmit a first scan signal GW to the second transistor T2 and the seventh transistor T7. The second scan line 152 may be applied with a voltage of an opposite polarity to a voltage applied to the first scan line 151 at the same timing as that of a signal of the first scan line 151. For example, when a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4. The light emitting control line 155 transmits a light emitting control signal EM to the fifth transistor T5 and the sixth transistor T6.

The data line 171 is a line that transmits a data voltage DATA generated by a data driver, and thus, as an amount of a light emitting current transmitted to the light emitting diode LED is changed, and luminance emitted by the light emitting diode LED is also changed. The driving voltage line 172 applies a driving voltage ELVDD. The first initialization voltage line 127 transmits a first initialization voltage Vinit, and the second initialization voltage line 128 transmits a second initialization voltage AVinit. The common voltage line 741 applies a common voltage ELVSS to a cathode of the light emitting diode LED. In the present embodiment, each of voltages applied to the driving voltage line 172, the first and second initialization voltage lines 127 and 128, and the common voltage line 741 may be a constant voltage.

The driving transistor T1 (also referred to as the first transistor) is a p-type transistor, and has a silicon semiconductor as a semiconductor layer. The driving transistor T1 adjusts the amount of the light emitting current outputted to the anode of the light emitting diode LED according to a voltage (e.g., a voltage stored in the storage capacitor Cst) of a gate electrode of the driving transistor T1. Because brightness of the light emitting diode LED is adjusted according to the amount of the light emitting current outputted to the anode electrode of the light emitting diode LED, light emitting luminance of the light emitting diode LED may be adjusted according to the data voltage DATA applied to the pixel. For this purpose, a first electrode of the driving transistor T1 is disposed to receive the driving voltage ELVDD, and is connected to the driving voltage line 172 via the fifth transistor T5. In one or more embodiments, the first electrode of the driving transistor T1 is connected to a second electrode of the second transistor T2 to receive the data voltage DATA. In one or more embodiments, a second electrode of the driving transistor T1 outputs the light emitting current to the light emitting diode LED, and is connected to the anode of the light emitting device LED via the sixth transistor T6 (hereinafter referred to as an output control transistor). In one or more embodiments, the second electrode of the driving transistor T1 is also connected to the third transistor T3 to transmit the data voltage DATA applied to the first electrode thereof to the third transistor T3. In one or more embodiments, a gate electrode of the driving transistor T1 is connected to one electrode of the storage capacitor Cst (hereinafter referred to as a 'second storage electrode'). Accordingly, a voltage of the gate electrode of the driving transistor T1 is changed according to a voltage stored in the storage capacitor Cst, and accordingly, a light emitting current outputted from the driving transistor T1 is changed. The storage capacitor Cst serves to maintain the voltage of the gate electrode of the driving transistor T1 constant for one frame. In one or more embodiments, the gate electrode of the driving transistor T1 may also be connected to the third transistor T3 so that the data voltage DATA applied to the first electrode of the driving transistor T1 passes through the third transistor T3 to be transmitted to the gate electrode of the driving transistor T1. In one or more embodiments, the gate electrode of the driving transistor T1 may also be connected to the fourth transistor T4 to be initialized by receiving the first initialization voltage Vinit.

The second transistor T2 is a p-type transistor, and has a silicon semiconductor as a semiconductor layer. The second transistor T2 is a transistor that allows the data voltage DATA to be received into the pixel. A gate electrode of the second transistor T2 is connected to the first scan line 151 and one electrode of the boost capacitor $C_{boost}$ (hereinafter, referred to as a 'lower boost electrode'). A first electrode of the second transistor T2 is connected to the data line 171. A second electrode of the second transistor T2 is connected to the first electrode of the driving transistor T1. When the second transistor T2 is turned on by a negative voltage of the first scan signal GW transmitted through the first scan line 151, the data voltage DATA transmitted through the data line 171 is transmitted to the first electrode of the driving transistor T1, and finally, the data voltage DATA is transmitted to the gate electrode of the driving transistor T1 to be stored in the storage capacitor Cst.

The third transistor T3 is an n-type transistor, and has an oxide semiconductor as a semiconductor layer. The third transistor T3 connects (e.g., electrically connects) the second electrode of the driving transistor T1 and the gate electrode of the driving transistor T1. As a result, it is a transistor that allows the data voltage DATA to be compensated by a threshold voltage of the driving transistor T1 and then stored in the second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected to the second storage electrode of the storage capacitor Cst, the gate electrode of the driving transistor T1, and the other electrode of the boost capacitor $C_{boost}$ (hereinafter referred to as an 'upper boost electrode'). The third transistor T3 is turned on by a positive voltage of the second scan signal GC transmitted through the second scan line 152 to connect the gate electrode of the driving transistor T1 and the second electrode of the driving transistor T1, and to allow a voltage applied to the gate electrode of the driving transistor T1 to be transmitted to the second storage electrode of the storage capacitor Cst to be stored in the storage capacitor Cst. In this case, the voltage stored in the storage capacitor Cst is stored in a state in which the voltage of the gate electrode of the driving transistor T1 when the driving transistor T1 is turned off is stored and a threshold voltage (Vth) of the driving transistor T1 is compensated.

The fourth transistor T4 is an n-type transistor, and has an oxide semiconductor as a semiconductor layer. The fourth transistor T4 serves to initialize the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by a positive voltage of the initialization control signal GI received through the initialization control line 153, and at this time, it transmits the first initialization voltage Vinit to the gate electrode of the driving transistor T1, the second storage electrode of the storage capacitor Cst, and the upper boost electrode of the boost capacitor $C_{boost}$ to initialize them.

The fifth transistor T5 and the sixth transistor T6 are p-type transistors, and have silicon semiconductors as a semiconductor layer.

The fifth transistor T5 serves to transmit the driving voltage ELVDD to the driving transistor T1. A gate electrode of the fifth transistor T5 is connected to the light emitting control line 155, a first electrode of the fifth transistor T5 is connected to the driving voltage line 172, and a second electrode of the fifth transistor T5 is connected to the first electrode of the driving transistor T1.

The sixth transistor T6 serves to transmit a light emitting current outputted from the driving transistor T1 to the light emitting diode LED. A gate electrode of the sixth transistor T6 is connected to the light emitting control line 155, a first electrode of the sixth transistor T6 is connected to the second electrode of the driving transistor T1, and a second electrode of the sixth transistor T6 is connected to the anode of the light emitting diode LED.

The seventh transistor T7 is a p-type or n-type transistor, and has a silicon semiconductor or oxide semiconductor as a semiconductor layer. The seventh transistor T7 serves to initialize the anode of the light emitting diode LED. A gate electrode of the seventh transistor T7 is connected to the first scan line 151, a first electrode of the seventh transistor T7 is connected to the anode of the light emitting diode LED, and a second electrode of the seventh transistor T7 is connected to the second initialization voltage line 128. When the seventh transistor T7 is turned on by a negative voltage of the first scan line 151, the second initialization voltage AVinit is applied to the anode of the light emitting diode LED to initialize it. In one or more embodiments, the gate electrode of the seventh transistor T7 may be connected to a separate bypass control line, and may separately control it from the first scan line 151. In addition, in one or more embodiments, the second initialization voltage line 128 to which the second initialization voltage AVinit is applied may be the same as the first initialization voltage line 127 to which the first initialization voltage Vinit is applied.

It is described that one pixel PX includes the seven transistors T1 to T7 and two capacitors (the storage capacitor Cst and the boost capacitor $C_{boost}$), but the present disclosure is not limited thereto, and in one or more embodiments, the boost capacitor $C_{boost}$ may be removed. In one or more embodiments, although the third transistor and the fourth transistor are formed as n-type transistors, only one of them may be formed as an n-type transistor or another transistor (e.g., the seventh transistor) may be formed as an n-type transistor.

In the above, the circuit structure of the pixel formed in the display area DA has been described with reference to FIG. 6.

Hereinafter, a detailed planar structure and a stacked structure of the pixel formed in the display area DA will be described with reference to FIG. 7 to FIG. 20 where the pixel of one or more embodiments includes the optical sensor area (OPS).

FIG. 7 to FIG. 19 specifically illustrate structures of respective layers according to a manufacturing sequence of a lower panel layer of a light emitting display device according to one or more embodiments.

Figure 7:
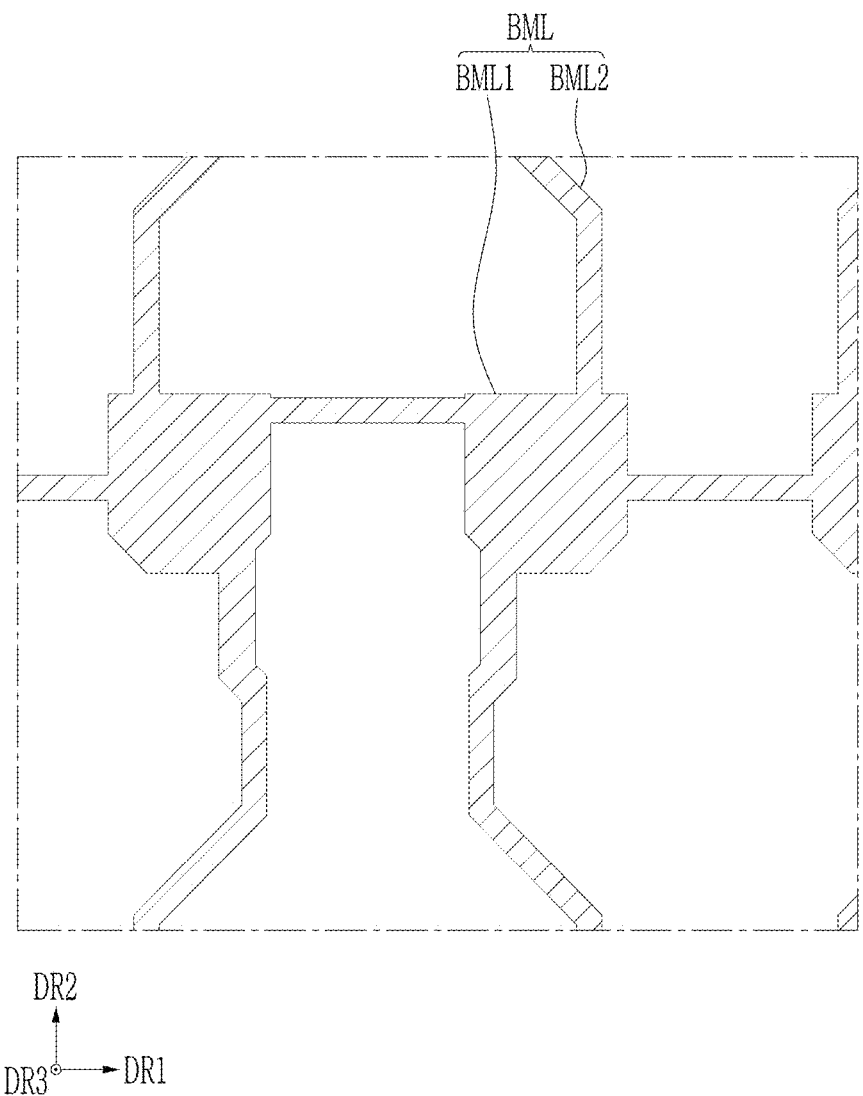
FIG. 7 to FIG. 19 specifically illustrate structures of respective layers according to a manufacturing sequence of a lower panel layer of a light emitting display device according to one or more embodiments.

Referring to FIG. 7, a metal layer BML is positioned on the substrate 110.

The substrate 110 may include a material that has a rigid characteristic such as glass and thus is not bendable, or may include a flexible material such as plastic or polyimide that may be bendable. In a case of a flexible substrate, as shown in FIG. 20, a two-layer structure that has polyimide and a barrier layer formed of an inorganic insulating material thereon may have a double structure.

The metal layer BML includes a plurality of expansions BML1 and a connecting part BML2 for connecting the plurality of expansions BML1 to each other. The expansion BML1 of the metal layer BML may be formed at a position overlapping a channel 1132 of a first semiconductor layer of the driving transistor T1 in a plan view to be described below. The metal layer BML is also referred to as a lower shielding layer, and may contain a metal such as copper (Cu), molybdenum (Mo), aluminum (Al), and titanium (Ti) or a metal alloy thereof, may additionally contain amorphous silicon, and may be formed as a single layer or a multilayer structure.

Figure 20:
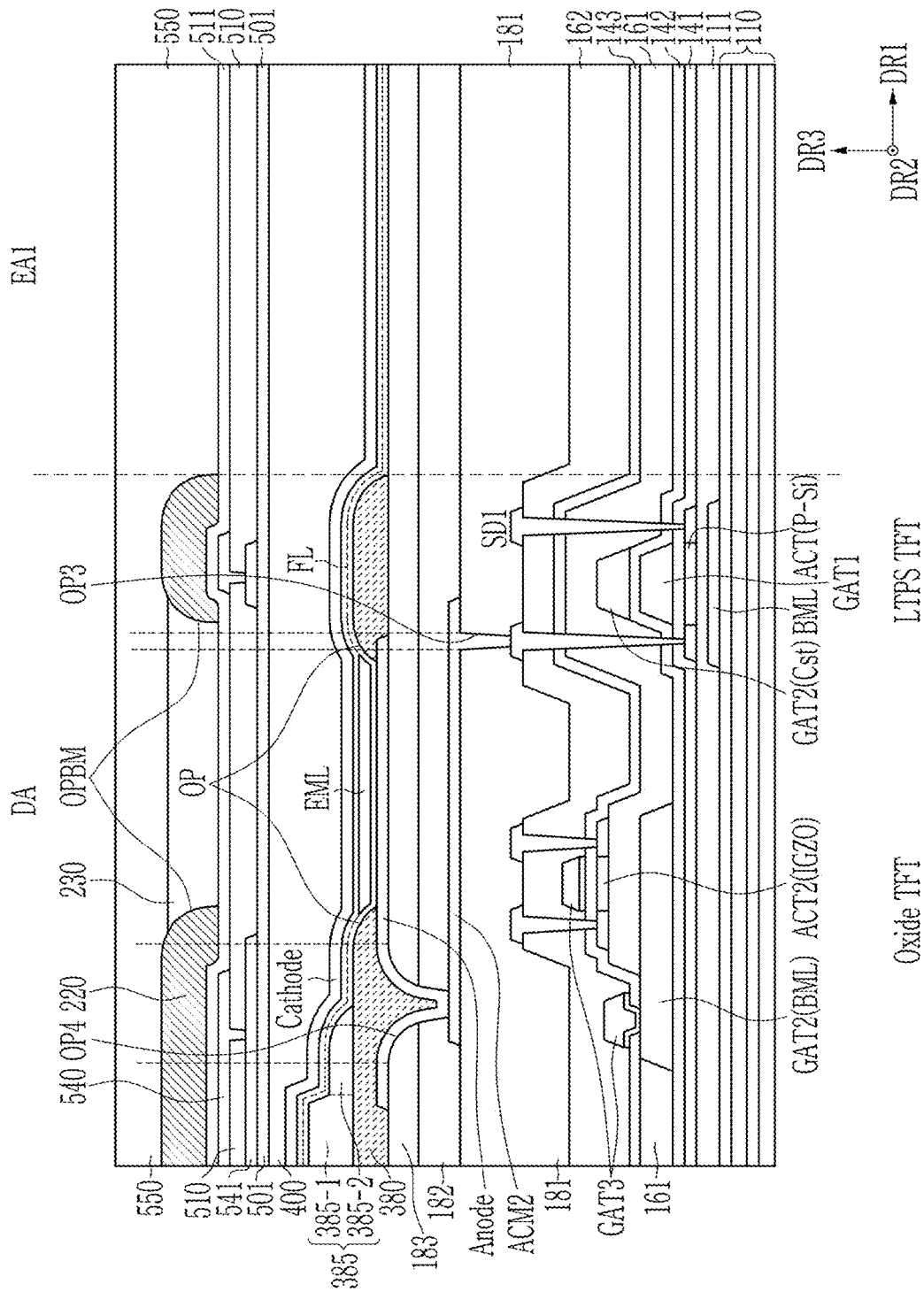
FIG. 20 illustrates a cross-sectional view of a light emitting display device according to one or more embodiments.

Referring to FIG. 20, a buffer layer 111 covering the substrate 110 and the metal layer BML is positioned on them. The buffer layer 111 serves to block or reduce penetration of impurity elements into a first semiconductor layer 130, and may be an inorganic insulating layer including a silicon oxide ($SiO_x$), a silicon nitride ($SiN_x$), and/or a silicon oxynitride ($SiO_xN_y$).

Figure 8:
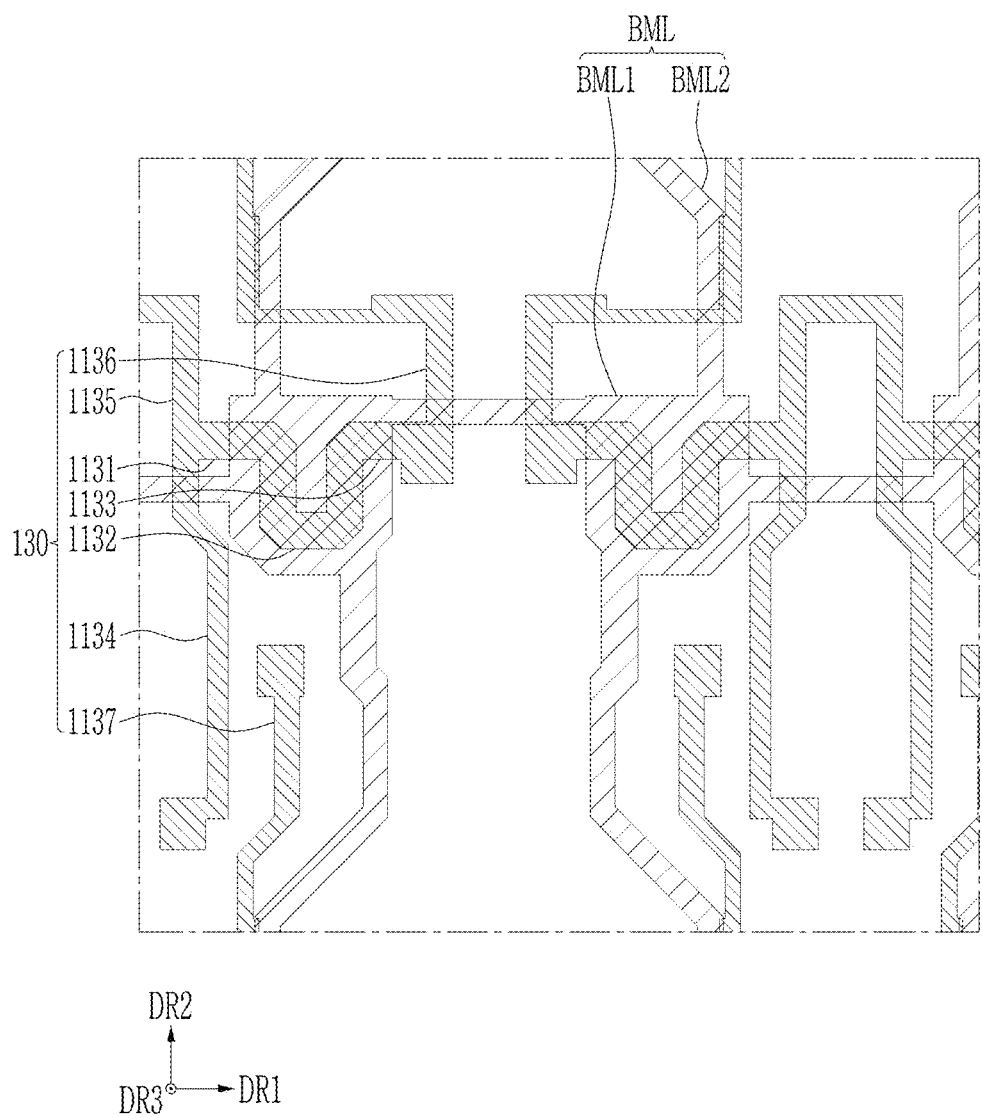

The first semiconductor layer 130 formed of a silicon semiconductor (e.g., a polycrystalline semiconductor) is positioned on the buffer layer 111 as shown in FIG. 8. The first semiconductor layer 130 includes a channel 1132, a first area 1131, and a second area 1133 of the driving transistor T1. In one or more embodiments, the first semiconductor layer 130 includes not only the channel of the driving transistor T1 but also the channels of the second transistor T2, the fifth transistor T5, the sixth transistor T6, and the seventh transistor T7, and respective sides of each channel have areas having conductive layer characteristics formed by plasma treatment or doping to serve as first and second electrodes of the corresponding transistors.

A channel 1132 of the driving transistor T1 may have a curved shape in a plan view. However, the shape of the channel 1132 of the driving transistor T1 is not limited thereto, and may be variously changed in a suitable manner. For example, the channel 1132 of the driving transistor T1 may be bent in a different shape, or may be formed in a rod shape. A first area 1131 and a second area 1133 of the driving transistor T1 may be positioned at respective sides of the channel 1132 of the driving transistor T1. The first area 1131 and the second area 1133 positioned at the first semiconductor layer serve as the first electrode and the second electrode of the driving transistor T1, respectively.

In the first semiconductor layer 130, the channel, the first area, and the second area of the second transistor T2 are positioned in a portion 1134 extending downward from the first area 1131 of the driving transistor T1. The channel, the first area, and the second area of the fifth transistor T2 are positioned in a portion 1135 extending upward from the first area 1131 of the driving transistor T1. The channel, the first area, and the second area of the sixth transistor T6 are positioned in a portion 1136 extending upward from the second area 1133 of the driving transistor T1. The channel, the first area, and the second area of the seventh transistor T7 are positioned in a portion 1137 that is further extended while being bent from the portion 1136 of the first semiconductor layer 130.

Referring to FIG. 20, a first gate insulating film 141 may be positioned on the first semiconductor layer 130 including the channel 1132, the first area 1131, and the second area 1133 of the driving transistor T1. The first gate insulating film 141 may be an inorganic insulating film including a silicon oxide ($SiO_x$), a silicon nitride ($SiN_x$), and/or a silicon oxynitride ($SiO_xN_y$).

Figure 9:
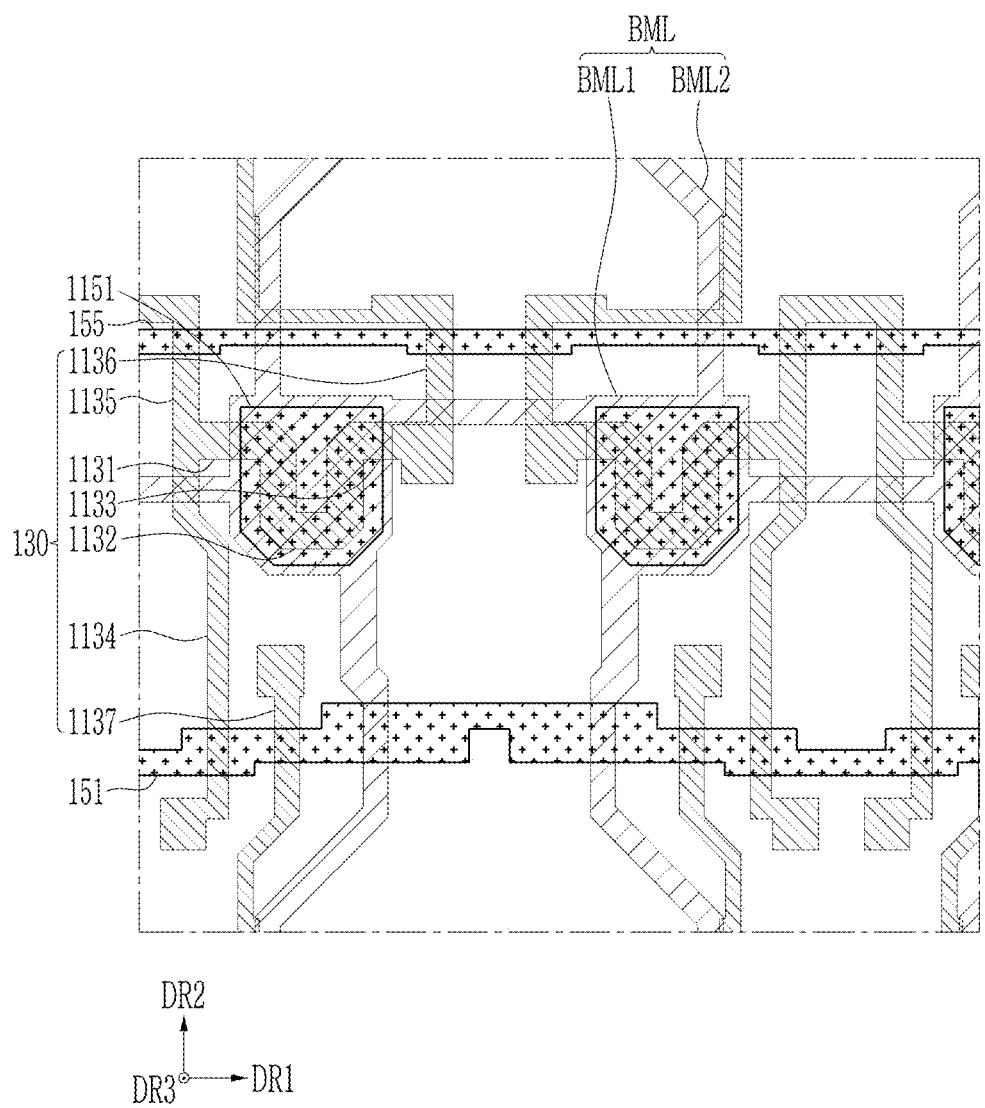

Referring to FIG. 9, a first gate conductive layer including a gate electrode 1151 of the driving transistor T1 may be positioned on the first gate insulating film 141. The first gate conductive layer may include a gate electrode of each of the second transistor T2, the fifth transistor T5, the sixth transistor T6, and the seventh transistor T7, as well as the driving transistor T1. The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may further include the first scan line 151 and the light emitting control line 155. The first scan line 151 and the light emitting control line 155 may substantially extend in a horizontal direction (hereinafter also referred to as the first direction DR1). The first scan line 151 may be connected to the gate electrode of the second transistor T2. The first scan line 151 may be integrated with the gate electrode of the second transistor T2. The first scan line 151 may also be connected to the gate electrode of the seventh transistor T7 of the rear pixel.

In one or more embodiments, the light emitting control line 155 may be connected to the gate electrode of the fifth transistor T5 and the gate electrode of the sixth transistor T6, and the light emitting control line 155 and the gate electrodes of the fifth transistor T5 and the sixth transistor T6 may be integrally formed. In one or more embodiments, the gate electrodes of the fifth transistor T5 and the sixth transistor T6 are formed as a monolithic structure.

The first gate conductive layer may include a metal such as copper (Cu), molybdenum (Mo), aluminum (Al), or titanium (Ti) or a metal alloy thereof, and may be formed as a single layer or a multilayer structure.

After the first gate conductive layer including the gate electrode 1151 of the driving transistor T1 is formed, the exposed area of the first semiconductor layer may be conductive by performing a plasma treatment or a doping process. For example, the first semiconductor layer covered by the first gate conductive layer is not conductive, and a portion of the first semiconductor layer that is not covered by the first gate conductive layer may have the same characteristic as the conductive layer. As a result, the transistor including the conductive portion has a p-type transistor characteristic, so that the driving transistor T1, the second transistor T2, the fifth transistor T5, the sixth transistor T6, and the seventh transistor T7 may be p-type transistors.

Referring to FIG. 20, a second gate insulation film 142 may be positioned on the first gate conductive layer and the first gate insulating film 141 including the gate electrode 1151 of the driving transistor T1. The second gate insulating film 142 may be an inorganic insulating film including a silicon oxide ($SiO_x$), a silicon nitride ($SiN_x$), or a silicon oxynitride ($SiO_xN_y$).

Figure 10:
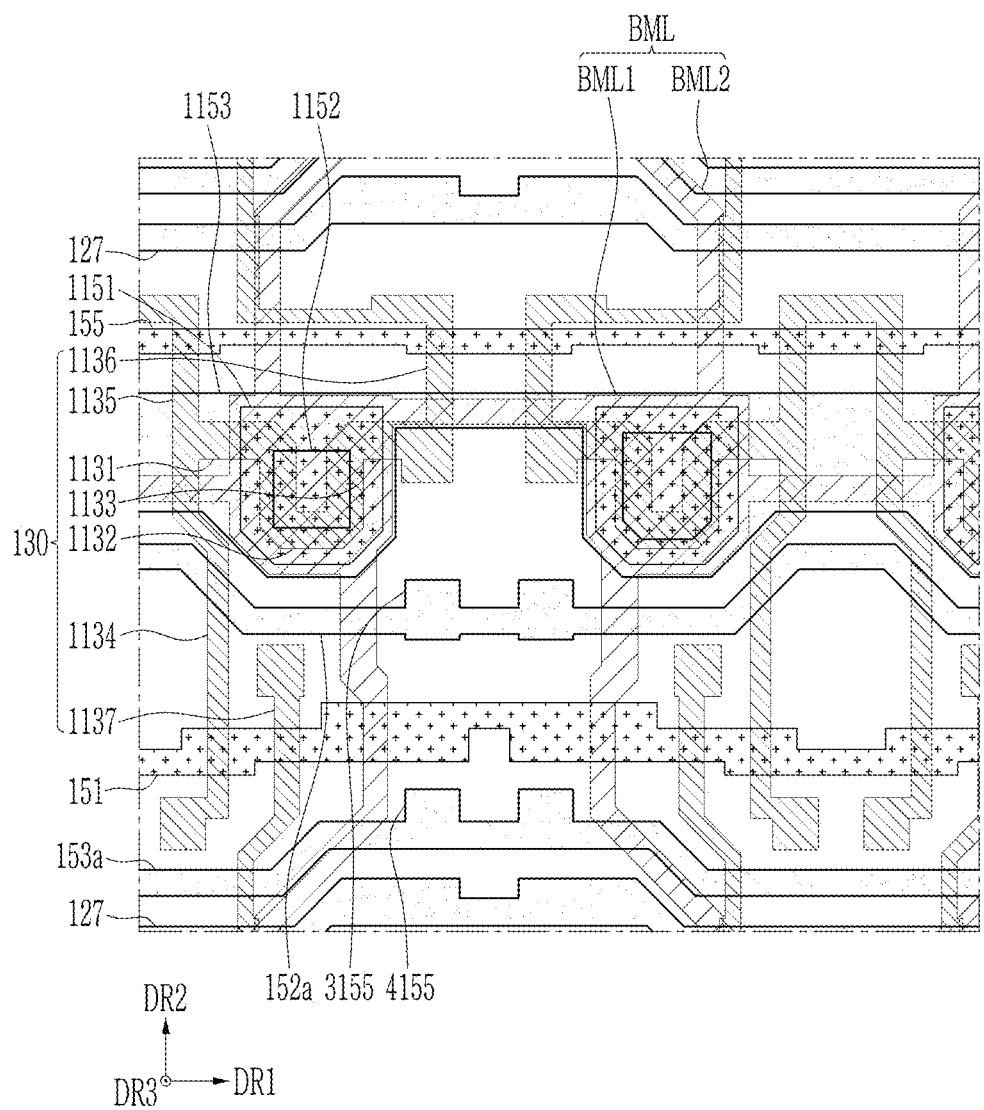

Referring to FIG. 10, a second gate conductive layer including a first storage electrode 1153 of the storage capacitor Cst, a lower shielding layer 3155 of the third transistor T3, and a lower shielding layer 4155 of the fourth transistor T4 may be positioned on the second gate insulating film 142. The lower shielding layers 3155 and 4155 may be positioned under the channels of the third transistor T3 and the fourth transistor T4, respectively, and may serve to shield light or electromagnetic interference provided to the channels from lower sides thereof.

The first storage electrode 1153 overlaps the gate electrode 1151 of the driving transistor T1 to form the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The first storage electrode 1153 extends in the horizontal direction (first direction) to be connected to an adjacent first storage electrode 1153.

The lower shielding layer 3155 of the third transistor T3 may overlap a channel 3137 and a gate electrode 3151 of the third transistor T3. The lower shielding layer 4155 of the fourth transistor T4 may overlap a channel 4137 and a gate electrode 4151 of the fourth transistor T4.

The second gate conductive layer may further include a lower second scan line 152a, a lower initialization control line 153a, and a first initialization voltage line 127. The lower second scan line 152a, the lower initialization control line 153a, and the first initialization voltage line 127 may substantially extend in the horizontal direction (first direction). The lower second scan line 152a may be connected to the lower shielding layer 3155 of the third transistor T3. The lower second scan line 152a may be integrally formed with the lower shielding layer 3155 of the third transistor T3. In one or more embodiments, the lower second scan line 152a and the lower shielding layer 3155 of the third transistor T3 are formed as a monolithic structure. The lower initialization control line 153a may be connected to the lower shielding layer 4155 of the fourth transistor T4. The lower initialization control line 153a may be integrally formed with the lower shielding layer 4155 of the fourth transistor T4. In one or more embodiments, the lower initialization control line 153a and the lower shielding layer 4155 of the fourth transistor T4 are formed as a monolithic structure.

The second gate conductive layer GAT2 may include a metal such as copper (Cu), molybdenum (Mo), aluminum (Al), or titanium (Ti) or a metal alloy thereof, and may be formed as a single layer or a multilayer structure.

Referring to FIG. 20, a first interlayer insulating film 161 may be positioned on the second gate conductive layer including the first storage electrode 1153 of the storage capacitor Cst, the lower shielding layer 3155 of the third transistor T3, and the lower shielding layer 4155 of the fourth transistor T4. The first interlayer insulating film 161 may include an inorganic insulating film including a silicon oxide ($SiO_x$), a silicon nitride ($SiN_x$), acid a silicon oxynitride ($SiO_xN_y$), and in one or more embodiments, the inorganic insulating material may be thickly formed therein.

Figure 11:
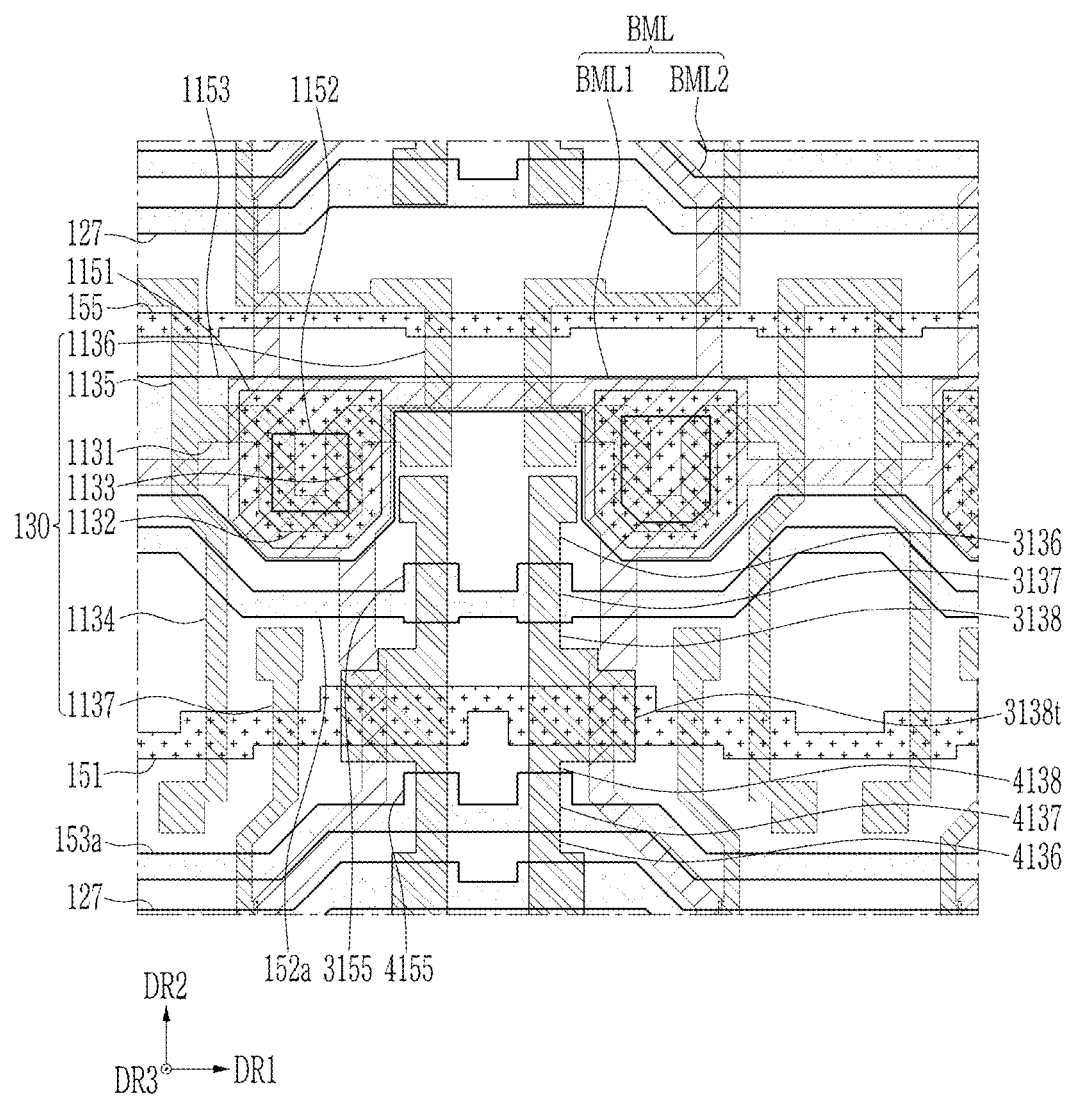

Referring to FIG. 11, an oxide semiconductor layer including a channel 3137, a first area 3136, and a second area 3138 of the third transistor T3 and a channel 4137, a first area 4136, and a second area 4138 of the fourth transistor T4 may be positioned on the first interlayer insulating film 161. In one or more embodiments, the oxide semiconductor layer may include an upper boost electrode 3138t of the capacitor $C_{boost}$.

The channel 3137, the first area 3136, and the second area 3138 of the third transistor T3, and the channel 4137, the first area 4136, and the second area 4138 of the fourth transistor T4 may be connected to each other to be integrally formed. The first area 3136 and the second area 3138 of the third transistor T3 are positioned at respective sides of the channel 3137 of the third transistor T3, while the first area 4136 and the second area 4138 of the fourth transistor T4 are positioned at respective sides of the channel 4137 of the fourth transistor T4. The second area 3138 of the third transistor T3 is connected to the second area 4138 of the fourth transistor T4. The channel 3137 of the third transistor T3 overlaps the lower shielding layer 3155, and the channel 4137 of the fourth transistor T4 overlaps the lower shielding layer 4155.

The upper boost electrode 3138t of the capacitor $C_{boost}$ is positioned between the second area 3138 of the third transistor T3 and the second area 4138 of the fourth transistor T4. The upper boost electrode 3138t of the boost capacitor $C_{boost}$ overlaps the lower boost electrode 151a of the boost capacitor $C_{boost}$ to form the boost capacitor $C_{boost}$.

Referring to FIG. 20, a third gate insulation film 143 may be positioned on the oxide semiconductor layer including the channel 3137, the first area 3136, and the second area 3138 of the third transistor T3, the channel 4137, the first area 4136, and the second area 4138 of the fourth transistor T4, and the upper boost electrode 3138t of the boost capacitor $C_{boost}$.

The third gate insulating film 143 may be positioned on an entire surface of the oxide semiconductor layer and the first interlayer insulating film 161. Therefore, the third gate insulating film 143 may cover upper and lateral surfaces of the channel 3137, the first area 3136, and the second area 3138 of the third transistor T3; upper and lateral surfaces of the channel 4137, the first area 4136, and the second area 4138 of the fourth transistor T4; and upper and lateral surfaces of the upper boost electrode 3138t of the boost capacitor $C_{boost}$. However, the present embodiment is not limited thereto, and the third gate insulating film 143 may not be positioned on the entire surface of the oxide semiconductor layer and the first interlayer insulating film 161. For example, the third gate insulating film 143 may overlap the channel 3137 of the third transistor T3, and it may not overlap the first area 3136 and the second area 3138 thereof. In one or more embodiments, the third gate insulating film 143 may overlap the channel 4137 of the fourth transistor T4, and it may not overlap the first area 4136 and the second area 4138 thereof.

The third gate insulating film 143 may include an inorganic insulating film including a silicon oxide ($SiO_x$), a silicon nitride ($SiN_x$), or a silicon oxynitride ($SiO_xN_y$).

Figure 12:
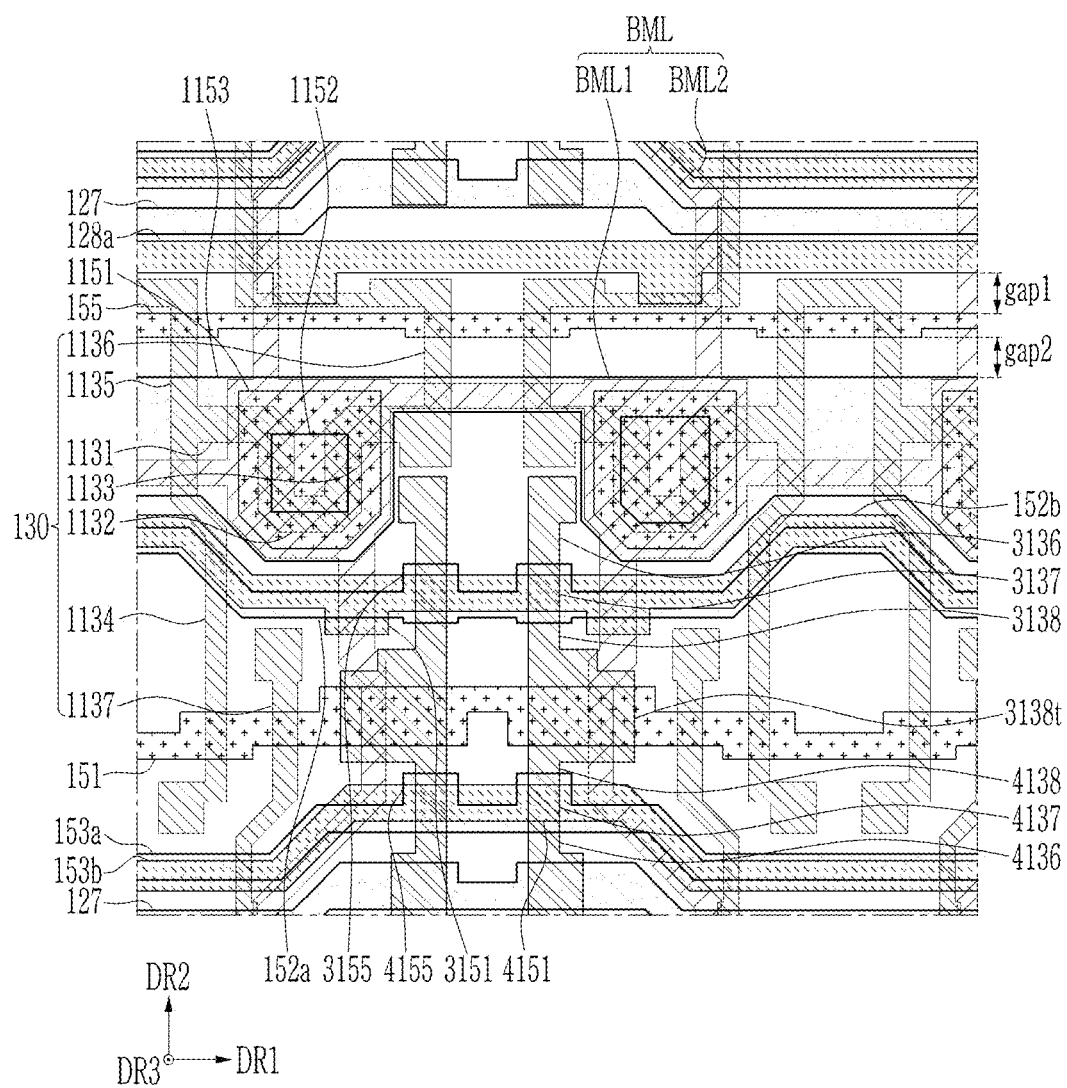

Referring to FIG. 12, a third gate conductive layer including the gate electrode 3151 of the third transistor T3 and the gate electrode 4151 of the fourth transistor T4 may be positioned on the third gate insulating film 143.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The third gate conductive layer may further include an upper second scan line 152b and an upper initialization control line 153b.

The upper second scan line 152b and the upper initialization control line 153b may substantially extend in the horizontal direction (the first direction DR1). The upper second scan line 152b forms the second scan line 152 together with the lower second scan line 152a. The upper second scan line 152b may be connected to the gate electrode 3151 of the third transistor T3. The upper second scan line 152b may be integrally formed with the gate electrode 3151 of the third transistor T3. In one or more embodiments, the upper second scan line 152b and the gate electrode 3151 of the third transistor T3 are formed as a monolithic structure. The upper initialization control line 153b forms the initialization control line 153 together with the lower initialization control line 153a. The upper initialization control line 153b may be connected to the gate electrode 4151 of the fourth transistor T4. The upper initialization control line 153b may be integrally formed with the gate electrode 4151 of the fourth transistor T4. In one or more embodiments, the upper initialization control line 153b and the gate electrode 4151 of the fourth transistor T4 are formed as a monolithic structure.

In one or more embodiments, the third gate conductive layer may further include a lower second initialization voltage line 128a. The lower second initialization voltage line 128a may substantially extend in the horizontal direction (first direction), and the second initialization voltage AVinit is applied thereto.

Referring to the embodiment of FIG. 12, based on the light emitting control line 155 positioned in the first gate conductive layer in a plan view, a gap (gap1) up to the lower second initialization voltage line 128a positioned in the third gate conductive layer and a gap (gap2) up to the first storage electrode 1153 positioned in the second gate conductive layer may be the same (e.g., the same in size). Here, the gap (gap2) is a gap from an extended portion of the light emitting control line 155 to the first storage electrode 1153, but in one or more embodiments, it may be a gap from a portion that is not the extended portion of the light emitting control line 155 to the first storage electrode 1153.

As described above, portions in which the two gaps (gap1 and gap2) are constant may overlap an expansion FL-SD1 (hereinafter also referred to as a first expansion) and/or an anode (Anode) positioned in the first data conductive layer, which will be described below, in a plan view, and may overlap an opening OP of the pixel defining layer 380 in a plan view. In one or more embodiments, a center of the opening OP of the pixel defining layer 380 may be positioned on the light emitting control line 155 serving as a center of the two gaps (gap1 and gap2) in a plan view. In one or more embodiments, an upper boundary of the opening OP of the pixel defining layer 380 may overlap the second initialization voltage line 128a in a plan view, and a lower boundary of the opening OP of the pixel defining layer 380 may overlap the first storage electrode 1153 in a plan view.

As described above, by allowing three wires positioned under the opening OP of the pixel defining layer 380 and/or the anode (Anode) to have the same (e.g., the same in size) gaps (gap1 and gap2), it is possible to make the anode (Anode) flatter (e.g., more planarized). As a result, it is possible to improve display quality by preventing or substantially preventing light reflected from the anode (Anode) from asymmetrically spreading and thus by reducing reflective color bands due to color spread (color separation) caused by the reflected light.

The third gate conductive layer GAT3 may include a metal such as copper (Cu), molybdenum (Mo), aluminum (Al), or titanium (Ti), or a metal alloy thereof, and may be formed as a single layer or a multilayer structure.

After the third gate conductive layer including the gate electrode 3151 of the third transistor T3 and the gate electrode 4151 of the fourth transistor T4 is formed, through a plasma treatment or doping process, a portion of the oxide semiconductor layer that is covered by the third gate conductive layer is formed as a channel, and a portion of the oxide semiconductor layer that is not covered by the third gate conductive layer is conductive. The channel 3137 of the third transistor T3 may be positioned under the gate electrode 3151 to overlap the gate electrode 3151. The first area 3136 and the second area 3138 of the third transistor T3 may not overlap the gate electrode 3151. The channel 4137 of the fourth transistor T4 may be positioned under the gate electrode 4151 to overlap the gate electrode 4151. The first area 4136 and the second area 4138 of the fourth transistor T4 may not overlap the gate electrode 4151. The upper boost electrode 3138t may not overlap the third gate conductive layer. A transistor including an oxide semiconductor layer may have characteristics of an n-type transistor.

Referring to FIG. 20, a second interlayer insulating film 162 may be positioned on the third gate conductive layer including the gate electrode 3151 of the third transistor T3 and the gate electrode 4151 of the fourth transistor T4. The second interlayer insulating film 162 may have a single layer or multilayer structure. The second interlayer insulating film 162 may include an inorganic insulating material such as a silicon nitride ($SiN_x$), a silicon oxide ($SiO_x$), and/or a silicon oxynitride ($SiO_xN_y$), and in one or more embodiments, it may include an organic material.

Figure 13:
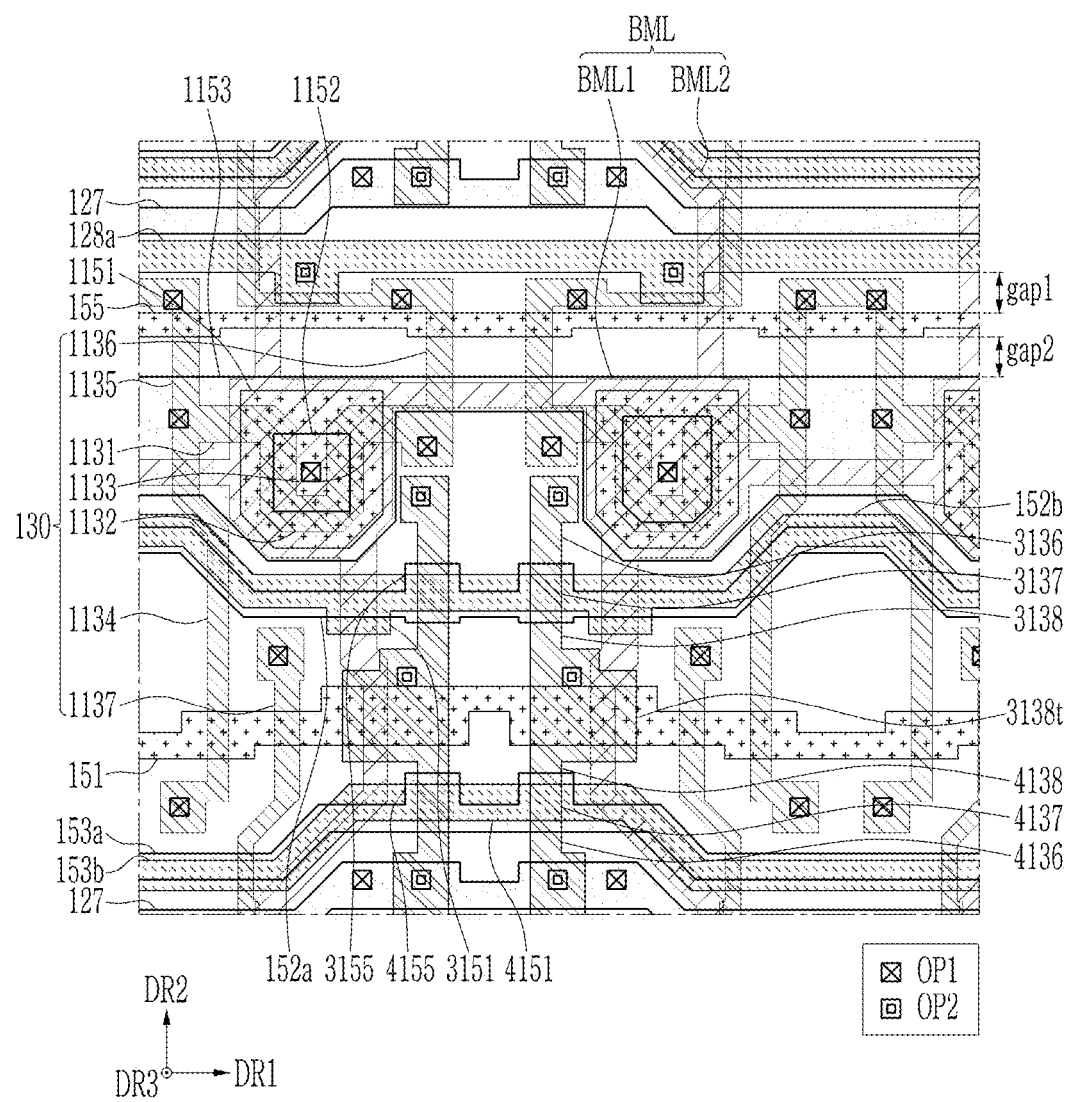

Referring to FIG. 13, two types of openings OP1 and OP2 may be formed in the second interlayer insulating film 162. The two types of openings OP1 and OP2 may be formed by using different masks.

The opening OP1 is formed in at least one of the second interlayer insulating film 162, the third gate insulating film 143, the first interlayer insulating film 161, the second gate insulating film 142, and the first gate insulating film 141, and the opening OP1 may expose the first semiconductor layer 130, the first gate conductive layer, or the second gate conductive layer.

The opening OP2 is formed in the second interlayer insulating film 162 and/or the third gate insulating film 143, and may expose the oxide semiconductor layer or the third gate conductive layer.

One of the openings OP1 overlaps at least a portion of the gate electrode 1151 of the driving transistor T1, and may also be formed in the third gate insulating film 143, the first interlayer insulating film 161, and the second gate insulating film 142. In this case, one of the openings OP1 may overlap the opening 1152 of the first storage electrode 1153, and may be positioned inside the opening 1152 of the first storage electrode 1153.

One of the openings OP2 may overlap at least a portion of the boost capacitor $C_{boost}$, and may be further formed in the third gate insulating film 143.

Another one of the openings OP1 overlaps at least part of the second area 1133 of the driving transistor T1, and the third opening 3165 may be formed in the third gate insulating film 143, the first interlayer insulating film 161, the second gate insulating film 142, and the first gate insulating film 141.

Another one of the openings OP2 overlaps at least a portion of the first area 3136 of the third transistor T3, and may be formed in the third gate insulating film 143.

Figure 14:
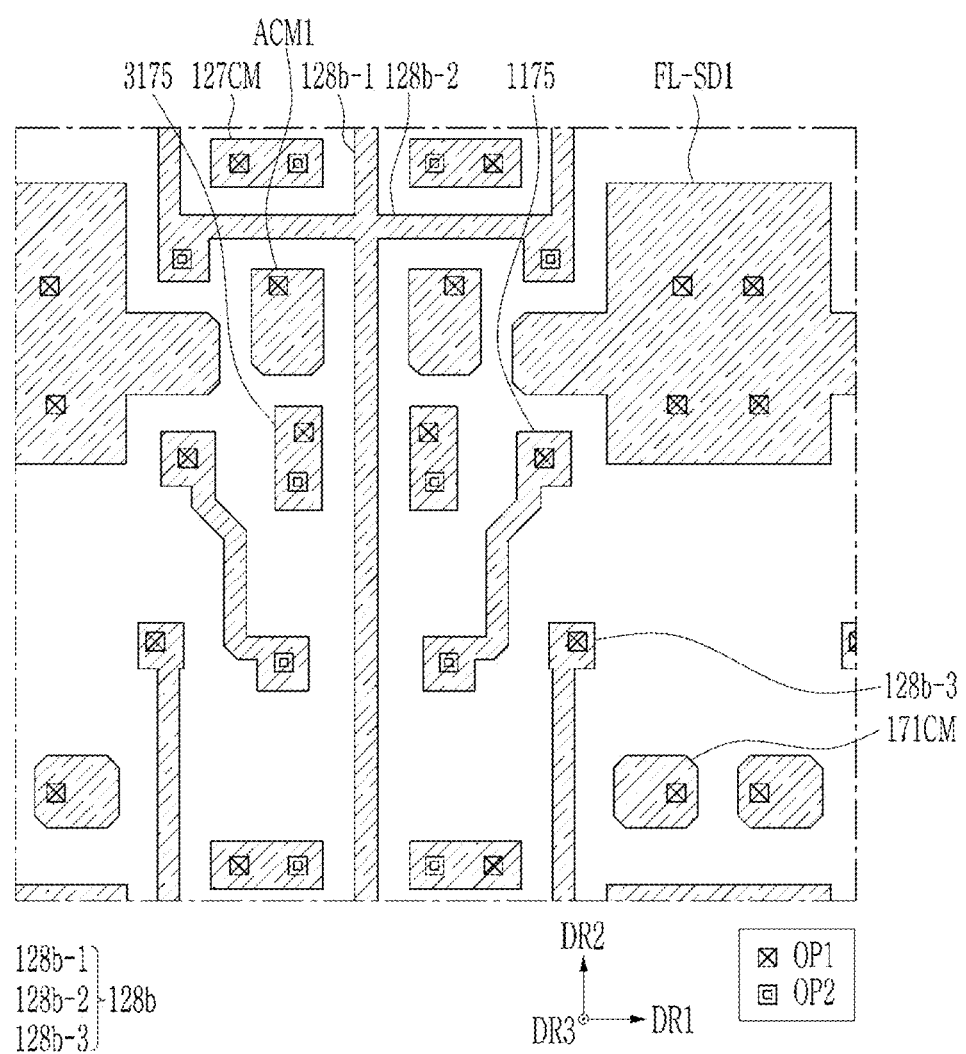
Figure 15:
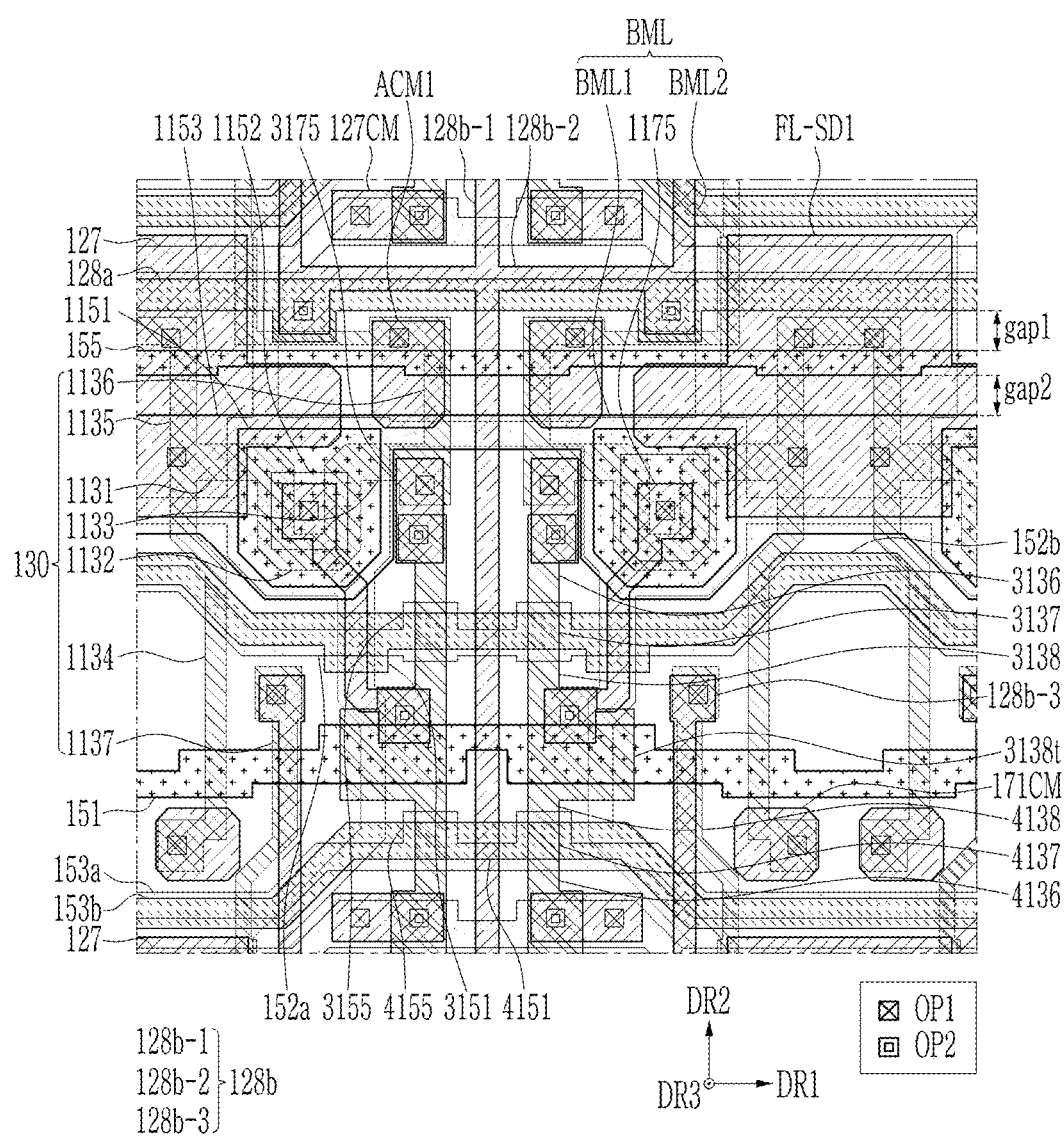

Referring to FIG. 14 and FIG. 15, a first data conductive layer including a first connecting electrode 1175 and a second connecting electrode 3175 may be positioned on the second interlayer insulation film 162. FIG. 14 is a top plan view showing only the first data conductive layer and the openings OP1 and OP2 in FIG. 15 because it may be difficult to easily recognize the first data conductive layer in FIG. 15, and FIG. 15 is a top plan view showing all layers below the first data conductive layer.

The first connecting electrode 1175 may overlap the gate electrode 1151 of the driving transistor T1. The first connecting electrode 1175 may be connected to the gate electrode 1151 of the driving transistor T1 through the openings OP1 and the opening 1152 of the first storage electrode 1153. The first connecting electrode 1175 may overlap the boost capacitor $C_{boost}$. The first connecting electrode 1175 may be connected to the upper boost electrode 3138t of the boost capacitor $C_{boost}$ through the opening OP2. Accordingly, the gate electrode 1151 of the driving transistor T1 and the upper boost electrode 3138t of the boost capacitor $C_{boost}$ may be connected by the first connecting electrode 1175. In this case, the gate electrode 1151 of the driving transistor T1 may be connected to the second area 3138 of the third transistor T3 and the second area 4138 of the fourth transistor T4 by the first connecting electrode 1175.

The second connecting electrode 3175 may overlap the second area 1133 of the driving transistor T1. The second connecting electrode 3175 may be connected to the second area 1133 of the driving transistor T1 through the opening OP1. The second connecting electrode 3175 may overlap the first area 3136 of the third transistor T3. The second connecting electrode 3175 may be connected to the first area 3136 of the third transistor T3 through the opening OP2. Accordingly, the second area 1133 of the driving transistor T1 and the first area 3136 of the third transistor T3 may be connected by the second connecting electrode 3175.

The first data conductive layer may further include the second initialization voltage line 128b. The second initialization voltage line 128 includes a wire part 128b-1 extending in a vertical direction (second direction), a first expansion 128b-2 protruding from both sides of the wire part 128b-1 in the horizontal direction (first direction), and a second expansion 128b-3 positioned while being again bent from the first expansion 128b-2 in the vertical direction (the second direction). At a point where the first expansion 128b-2 and the second expansion 128b-3 meet, they are connected (e.g., electrically connected) to the second initialization voltage line 128a positioned on the third gate conductive layer through the opening OP2. As a result, the second initialization voltage AVinit is transmitted in the horizontal direction (first direction) through the second initialization voltage line 128a positioned on the third gate conductive layer, and is transmitted in the vertical direction (second direction) through the second initialization voltage line 128b positioned on the first data conductive layer.

An end of the second expansion 128b-3 is connected (e.g., electrically connected) to the portion 1137 of the first semiconductor layer 130 through the opening OP1.

The first data conductive layer may further include connecting parts 127CM and 171CM, an anode connecting member ACM1, and an expansion FL-SD1.

The connecting part 127CM is connected to the first initialization voltage line 127 of the second gate conductive layer through the opening OP1, and is connected to the first area 4136 of the second semiconductor layer (oxide semiconductor layer) through the opening OP2, so that the first initialization voltage Vinit flowing through the first initialization voltage line 127 is transmitted to the fourth transistor T4 of the oxide semiconductor layer.

The connecting part 171CM is connected (e.g., electrically connected) to the portion 1137 of the first semiconductor layer 130, that is, the second transistor T2, through the opening OP1.

The anode connecting member ACM1 is connected (e.g., electrically connected) to the portion 1136 of the first semiconductor layer 130, that is, the sixth transistor T6, through the opening OP1.

The expansion FL-SD1 is formed to be wide in order to flatten the anode positioned thereon. In one or more embodiments, the expansion FL-SD1 is connected to the portion 1135 of the first semiconductor layer 130, that is, the fifth transistor T5, through the opening OP1, and is also connected (e.g., electrically connected) to the first storage electrode 1153 through the opening OP1.

Referring to the embodiment of FIG. 15, the gap (gap1) between the light emitting control line 155 positioned in the first gate conductive layer and the lower second initialization voltage line 128a positioned in the third gate conductive layer in a plan view and the gap (gap2) between the light emitting control line 155 positioned in the first gate conductive layer and the first storage electrode 1153 positioned in the second gate conductive layer may be the same (e.g., the same in size). As described above, the portions in which the two gaps (gap1 and gap2) are constant may overlap the expansion FL-SD1 positioned in the first data conductive layer in a plan view. In one or more embodiments, the portions in which the two gaps (gap1 and gap2) are constant may overlap the anode (Anode) and/or the opening OP of the pixel defining layer 380, which will be described below, in a plan view.

The first data conductive layer SD1 may include a metal such as aluminum (Al), copper (Cu), molybdenum (Mo), or titanium (Ti) or a metal alloy thereof, and may be formed as a single layer or a multilayer structure.

Referring to FIG. 20, the first organic film 181 may be positioned on the first data conductive layer including the first connecting electrode 1175 and the second connecting electrode 3175. The first organic film 181 may be an organic insulation film including an organic material, and the organic material may include one or more of polyimide, polyamide, an acryl resin, benzocyclobutene, and a phenol resin.

Figure 16:
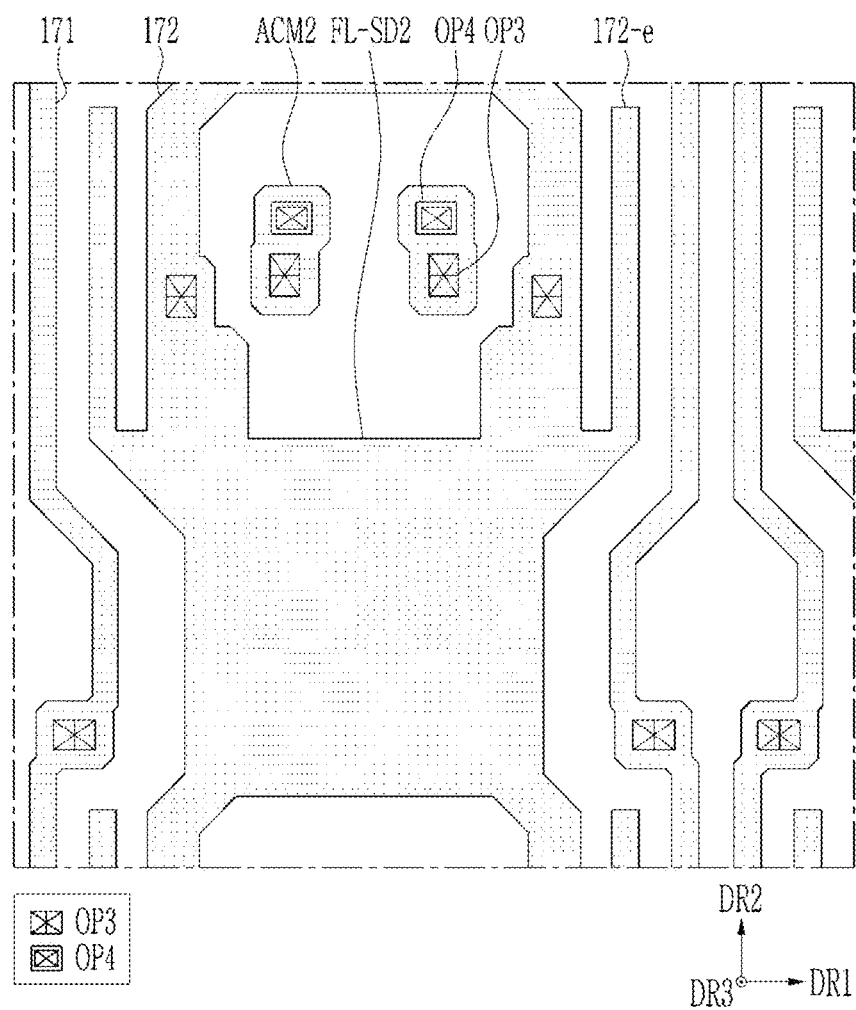
Figure 17:
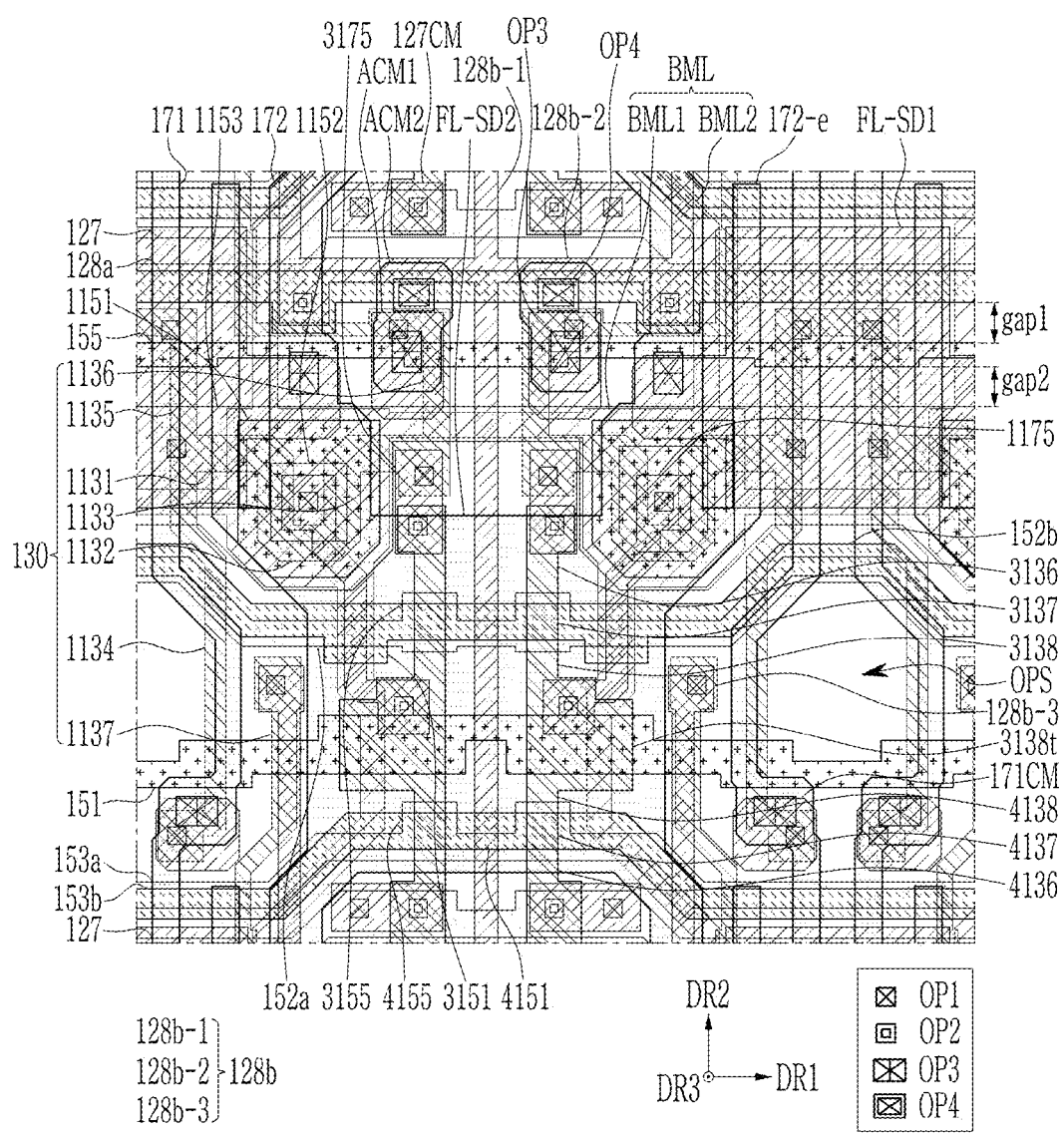
Figure 21:
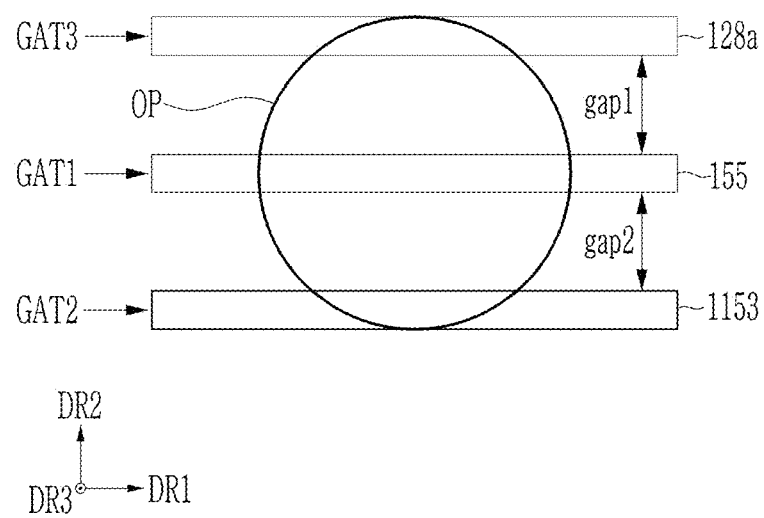
FIG. 21 illustrates a top plan view of only a portion of a conductive layer based on an opening of a pixel defining layer of a light emitting display device according to one or more embodiments.

Referring to FIG. 16, FIG. 17, and FIG. 20, the lower organic film opening OP3 is positioned on the first organic film 181. The second data conductive layer including the data line 171, the driving voltage line 172, and the anode connecting member ACM2 may be positioned on the first organic film 181. The second organic film 182 and the third organic film 183 are positioned on the second data conductive layer, and the opening OP4 for anode connection is formed in the second organic film 182 and the third organic film 183. The anode connecting member ACM2 is connected (e.g., electrically connected) to the anode through the opening OP4 for anode connection. FIG. 16 is a top plan view showing only the second data conductive layer and the openings OP3 and OP4 in FIG. 17 because it may be difficult to easily recognize the second data conductive layer in FIG. 17, and FIG. 21 is a top plan view showing the second data conductive layer and all layers therearound.

Referring to FIG. 16 and FIG. 17, the lower organic film opening OP3 overlaps the connecting part 171CM, the anode connecting member ACM1, and the expansion FL-SD1 positioned on the first data conductive layer to respectively expose them.

The second data conductive layer may include the data line 171, the driving voltage line 172, and the anode connecting member ACM2.

The data line 171 and the driving voltage line 172 may substantially extend in the vertical direction (second direction DR2). The data line 171 is connected to the connecting part 171CM of the first data conductive layer through the lower organic film opening OP3, and is connected to the second transistor T2 through this. The driving voltage line 172 is connected (e.g., electrically connected) to the fifth transistor T5 and the first storage electrode 1153 through the expansion FL-SD1 of the first data conductive layer through the lower organic film opening OP3. The anode connecting member ACM2 is connected (e.g., electrically connected) to the anode connecting member ACM1 of the first data conductive layer through the opening OP3, and is connected (e.g., electrically connected) to the sixth transistor T6.

Referring to FIG. 16, the driving voltage line 172 further includes an expansion FL-SD2 (hereinafter referred to as a second expansion) and a protruding wire part 172-e, and has a structure that is not formed in a portion in which the anode connecting member ACM2 is formed.

The expansion FL-SD2 is formed to be wide in order to flatten the anode positioned thereon.

On the other hand, two protruding wire parts 172-e of the driving voltage line 172 are also formed at both sides of the two data lines 171 so as to flatten the anode positioned thereon, so that a total of four wires 171 and 172-e are positioned below the anode.

Referring to the embodiment of FIG. 17, the portions in which the two gaps (gap1 and gap2) are constant may overlap a structure of the four wires 171 and 172-e positioned in the second data conductive layer in a plan view. In one or more embodiments, the portions in which the two gaps (gap1 and gap2) are constant and the structure of the four wires 171 and 172-e may overlap the anode (Anode) and/or the opening OP of the pixel defining layer 380 to be described below in a plan view.

The anode has a flattening characteristic by the structure of the lower portion of the anode and the organic films 181, 182, and 183 as described above, so that the light reflected from the anode (Anode) does not asymmetrically spread, and as a result, it is possible to improve display quality by reducing reflective color bands due to color spread (color separation) caused by the reflected light.

In the present embodiment, the expansion FL-SD1 and the expansion FL-SD2 are connected (e.g., electrically connected) to the driving voltage line 172 to receive the driving voltage ELVDD.

The second data conductive layer SD2 may include a metal such as aluminum (Al), copper (Cu), molybdenum (Mo), or titanium (Ti) or a metal alloy thereof, and may be formed as a single layer or a multilayer structure.

Referring to FIG. 20, the second organic film 182 and the third organic film 183 are positioned on the second data conductive layer. The second organic film 182 and the third organic film 183 may be an organic insulation film, and may include one or more of polyimide, polyamide, an acryl resin, benzocyclobutene, and a phenol resin. In one or more embodiments, the third organic film 183 may not be provided.

The anode connecting opening OP4 is formed in the second organic film 182 and the third organic film 183, and through this, the anode and the anode connecting member ACM2 are connected (e.g., electrically connected) to each other.

Figure 18:
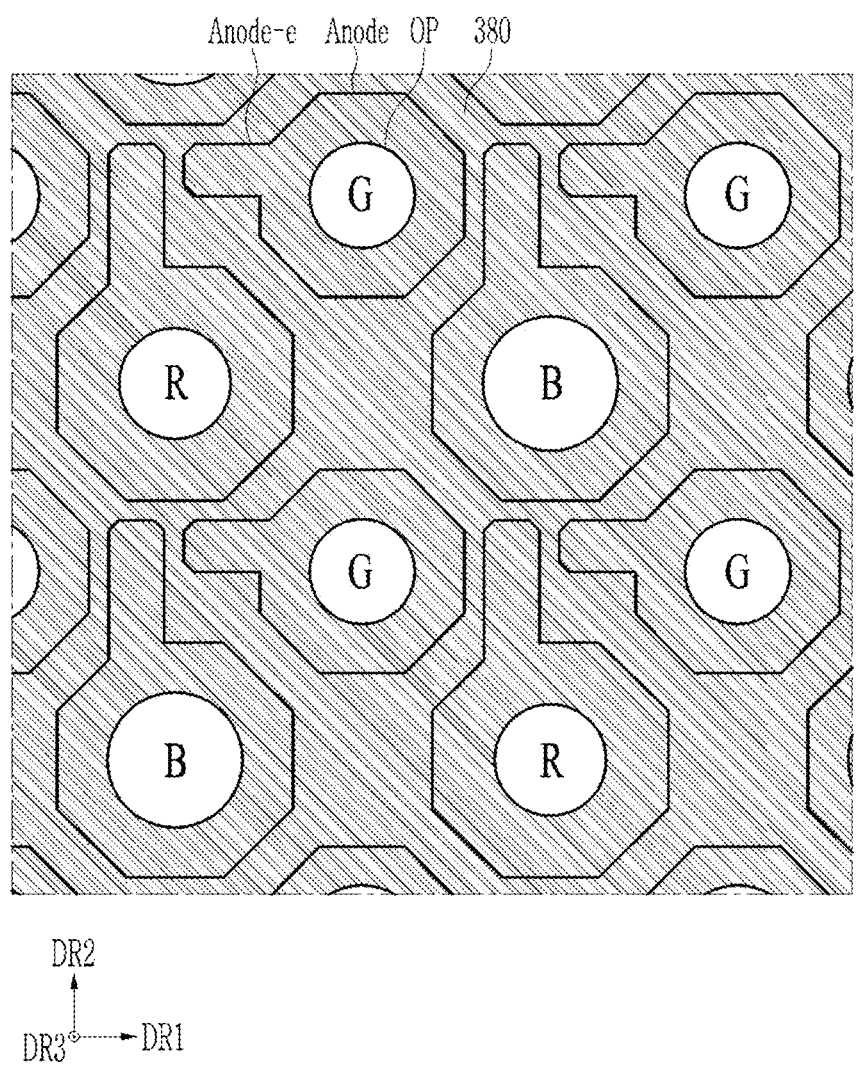

Referring to FIG. 18, the anode (Anode) is formed on the third organic film 183. The anode (Anode) may further include an expansion (Anode-e) to receive a current from the pixel circuit part through the anode connecting opening OP4.

Referring to FIG. 18 and FIG. 20, the pixel defining layer 380 is positioned on the anode (Anode), and the opening OP of the pixel defining layer 380 is formed to overlap the anode (Anode). The expansion (Anode-e) of the anode (Anode) is not exposed by the opening OP of the pixel defining layer 380, and overlaps the pixel defining layer 380 in a plan view. As a result, the anode connecting opening OP4 also overlaps the pixel defining layer 380 in a plan view.

Figure 19:
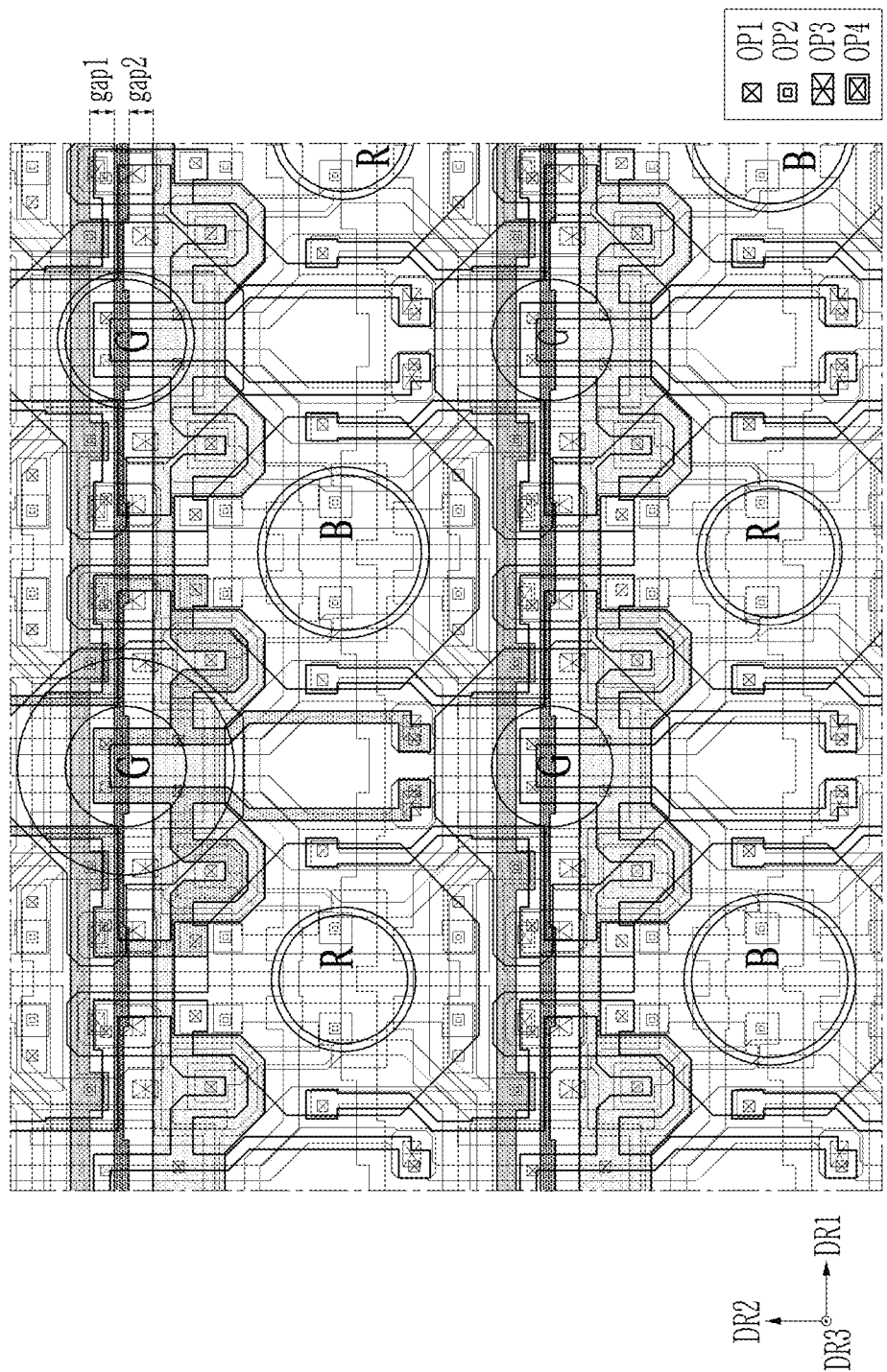

A structure in which the above structures are stacked as a whole is illustrated in FIG. 19.

Referring to FIG. 19, because the anode connecting opening OP4 does not overlap the opening OP of the pixel defining layer 380 and the opening OPBM of the light blocking member 220 in a plan view, it can be seen that the anode connecting opening OP4 overlaps the pixel defining layer 380 and the light blocking member 220.

In one or more embodiments, some (the first lower organic film openings) of the lower organic film openings OP3 at least partially overlap the opening OPBM of the light blocking member 220 in a plan view, and the remaining lower organic film openings OP3, that is, the second lower organic film opening, overlap the light blocking member 220 in a plan view. In one or more embodiments, all of the lower organic film openings OP3 overlap the pixel defining layer 380 in a plan view.

In addition, in the present embodiment, by the expansion FL-SD1 of the first data conductive layer and the expansion FL-SD2 of the second data conductive layer positioned below the anode (Anode), at least a portion of the anode (Anode) exposed by the opening OP of the pixel defining layer 380 may be formed to be flat.

In addition, referring to the embodiment of FIG. 19, the portions in which the two gaps (gap1 and gap2) are constant may overlap the anode (Anode) and/or the opening OP of the pixel defining layer 380 in a plan view. In one or more embodiments, a center of the opening OP of the pixel defining layer 380 may be positioned on the light emitting control line 155 serving as a center of the two gaps (gap1 and gap2) in a plan view. In one or more embodiments, an upper boundary of the opening OP of the pixel defining layer 380 may overlap the second initialization voltage line 128a in a plan view, and a lower boundary of the opening OP of the pixel defining layer 380 may overlap the first storage electrode 1153 in a plan view. The anode has a flattening characteristic by the structure of the lower portion of the anode and the organic films 181, 182, and 183 as described above, so that the light reflected from the anode (Anode) does not asymmetrically spread, and as a result, it is possible to improve display quality by reducing reflective color bands due to color spread (color separation) caused by the reflected light.

Based on the planar structure as described above, an entire cross-sectional structure of the light emitting display device will be described with reference to FIG. 20.

FIG. 20 illustrates a cross-sectional view of a light emitting display device according to one or more embodiments.

FIG. 20 illustrates the stacked structure of the first component area EA1 in addition to the stacked structure of the display area DA.

In the detailed stacked structure of the pixel of the display area DA shown in FIG. 20, the structure up to the anode (Anode) has been described with reference to FIG. 7 to FIG. 19. In the embodiment of FIG. 20, the pixel circuit part may include the second organic film 182 and the third organic film 183 and may refer to a configuration thereunder, and the light emitting diode may be an upper portion of the third organic film 183 and may refer to a configuration positioned under the encapsulation layer 400.

Referring to FIG. 20, the stacked structure on the anode (Anode) in the pixel of the display area DA is as follows.

The pixel defining layer 380 covering at least a portion of the anode (Anode) while having the opening OP exposing the anode (Anode) may be positioned on the anode (Anode). The pixel defining layer 380 may be a black pixel defining layer that is made of an organic material having a black color so that light applied from the outside is not reflected back to the outside, and in one or more embodiments, it may be made of a transparent organic material. Therefore, in one or more embodiments, the pixel defining layer 380 may include an organic material of a negative type of black color, and may include a black color pigment.

The spacer 385 is the first interlayer on the pixel defining layer 380. Unlike the pixel defining layer 380, the spacer 385 may be made of a transparent organic insulating material. In one or more embodiments, the spacer 385 may be made of a positive type of transparent organic material.

On the anode (Anode), the spacer 385, and the pixel defining layer 380, the functional layer FL and the cathode (Cathode) are sequentially formed, and the functional layer FL and the cathode (Cathode) may be entirely positioned in the display area DA and first component area EA1. The light emitting layer EML may be positioned between the functional layers FL, and the light emitting layer EML may be positioned only in the opening OP of the pixel defining layer 380. Hereinafter, a combination of the functional layer FL and the light emitting layer EML may be referred to as an intermediate layer. The functional layer FL may include at least one of auxiliary layers such as an electron injection layer, an electron transport layer, a hole transport layer, and a hole injection layer, and the hole injection layer and the hole transport layer may be positioned at a lower portion of the light emitting layer EML, and the electron transport layer and the electron injection layer may be positioned at an upper portion of the light emitting layer EML.

The encapsulation layer 400 is positioned on the cathode (Cathode). The encapsulation layer 400 includes at least one inorganic layer and at least one organic layer, and in one or more embodiments, it may have a triple-layer structure including a first inorganic encapsulation layer, an organic encapsulation layer, and a second inorganic encapsulation layer. The encapsulation layer 400 may be for protecting the light emitting layer EML from moisture or oxygen that may be introduced from the outside. In one or more embodiments, the encapsulation layer 400 may have a structure in which an inorganic layer and an organic layer are sequentially further stacked.

In the embodiment of FIG. 20, the sensing insulating layers including a first sensing insulating layer 501, a second sensing insulating layer 510, and a third sensing insulating layer 511, and a plurality of sensing electrodes 540 and 541 are positioned on the encapsulation layer 400 for touch sensing. In the embodiment of FIG. 20, a touch may be sensed in a capacitive type by using two sensing electrodes 540 and 541.

For example, the first sensing insulating layer 501 is formed on the encapsulation layer 400, and the plurality of sensing electrodes 540 and 541 are formed thereon. The plurality of sensing electrodes 540 and 541 may be insulated from each other with the second sensing insulation layer 510 therebetween, and some thereof may be connected (e.g., electrically connected) through an opening positioned in the second sensing insulation layer 510. Here, the sensing electrodes 540 and 541 may include a metal such as aluminum (Al), copper (Cu), silver (Ag), gold (Au), molybdenum (Mo), titanium (Ti), or tantalum (Ta), or a metal alloy thereof, and may be formed as a single layer or a multilayer structure. The third sensing insulating layer 511 is formed on the sensing electrode 540.

The light blocking member 220 and the color filter layer 230 are positioned on the sensing electrode 540 (e.g., the upper sensing electrode) and the third sensing insulating layer 511.

The light blocking member 220 may be positioned to overlap the sensing electrodes 540 and 541 in a plan view, and may be positioned so as to not overlap the anode (Anode) in a plan view. This is to prevent or substantially prevent the anode (Anode) capable of displaying an image from being covered by the light blocking member 220 and the sensing electrodes 540 and 541.

The color filter layer 230 may be positioned on the third sensing insulating layer 511 and the light blocking member 220. The color filter layer 230 includes a red color filter that transmits red light, a green color filter that transmits green light, and a blue color filter that transmits blue light. Each color filter layer 230 may be positioned to overlap the anode (Anode) of the light emitting diode in a plan view. Light emitted from the light emitting layer EML may be changed to a corresponding color to be emitted while passing through a color filter.

The light blocking member 220 may be positioned between respective color filter layers 230. In one or more embodiments, the color filter layer 230 may be replaced with a color conversion layer, or may further include a color conversion layer. The color conversion layer may include a quantum dot. In addition, in one or more embodiments, a reflection adjusting layer filling the opening OPBM of the light blocking member 220 may be positioned instead of the color filter layer 230. The reflection adjusting layer may have a structure covering the light blocking member 220, which will be described with reference to FIG. 35.

The flattening layer 550 covering the color filter layer 230 may be positioned on the color filter layer 230. In the present embodiment, a polarizer may not be attached to an upper portion of the flattening layer 550. For example, the polarizer is attached to prevent or substantially prevent external light from being reflected, but in the present embodiment, the pixel defining layer 380 is included in addition to the light blocking member 220, and the anode (Anode) is flattened, thus a non-uniform reflective characteristic does not occur, so that there may be no need to include a polarizer.

In one or more embodiments, FIG. 20 also illustrates a cross-sectional structure of the first component area EA1.

The first component area EA1 is an area in which the optical sensor area (OPS) is positioned on the lower panel layer, and may refer to an area in which the pixel defining layer 380, the light blocking member 220, and the color filter layer 230 are not formed.

The first component area EA1 is configured with only transparent layers so as to allow light to pass through it, and no conductive layer or semiconductor layer is positioned, and an opening (hereinafter also referred to as an additional opening) is formed in the pixel defining layer 380, the light blocking member 220, and the color filter layer 230 at a position corresponding to the optical sensor area (OPS) so that light is not blocked.

For example, based on FIG. 20, a stacked structure of the first component area EA1 according to one or more embodiments will be described.

The buffer layer 111, which is an inorganic insulating film, is positioned on the substrate 110, and the first gate insulating film 141 and the second gate insulating film 142, which are the inorganic insulating films, are sequentially positioned thereon. In one or more embodiments, the first interlayer insulating film 161, the third gate insulating film 143, and the second interlayer insulating film 162, which are inorganic insulating films, are sequentially stacked on the second gate insulating film 142. The first organic film 181, the second organic film 182, and the third organic film 183, which are organic insulating films, are sequentially stacked on the second interlayer insulating film 162. The functional layer FL may be positioned on the third organic film 183, and the cathode (Cathode) may be positioned thereon. The stacked structure from the substrate 110 to the cathode (Cathode) so far may correspond to the optical sensor area (OPS).

The encapsulation layer 400 is positioned on the cathode (Cathode), and the sensing insulating layers 501, 510, and 511 are sequentially positioned thereon. The encapsulation layer 400 may have a triple-layer structure including a first inorganic encapsulation layer, an organic encapsulation layer, and a second inorganic encapsulation layer. In one or more embodiments, all of the sensing insulating layers 501, 510, and 511 may be inorganic insulating films.

Additional openings of the light blocking member 220 and the color filter layer 230 are respectively positioned on the third sensing insulating layer 511, so that the light blocking member 220 and the color filter layer 230 are not formed in the first component area EA1. In one or more embodiments, because an additional opening is also positioned in the pixel defining layer 380, the pixel defining layer 380 is not formed in the first component area EA1.

The flattening layer 550 may be positioned on the third sensing insulating layer 511 in the first component area EA1.

In the above-described first component area EA1 and optical sensor area (OPS), the metal layer BML, a first semiconductor layer ACT1, the first gate conductive layer GAT1, the second gate conductive layer GAT2, an oxide semiconductor layer ACT2, the third gate conductive layer GAT3, the first data conductive layer SD1, the second data conductive layer SD2, and the anode (Anode) are not positioned. In one or more embodiments, the light emitting layer EML and the sensing electrodes 540 and 541 are not formed therein.

Further, additional openings are formed in the pixel defining layer 380, the light blocking member 220, and the color filter layer 230 in the first component area EA1 and the optical sensor area (OPS), so that the pixel defining layer 380, the light blocking member 220, and the color filter layer 230 are not formed.

In the above, one or more embodiments in which a total of three organic films are formed and the anode connecting opening is formed in the second organic film and the third organic film has been described. However, at least two organic films may be formed, and in this case, the anode connecting opening may be positioned in the upper organic film positioned far from the substrate, and the lower organic film opening may be positioned in the lower organic film.

In the above, the structure of the overall light emitting display device and pixel has been described in more detail.

Hereinafter, while the first gate conductive layer, the second gate conductive layer, and the third gate conductive layer overlap the opening OP of the pixel defining layer 380 in a plan view, various suitable embodiments capable of forming an anode (Anode) that is flatter (e.g., more planarized) will be described with reference to FIG. 21 to FIG. 29. For reference, hereinafter, the light emitting control line 155 is illustrated as the first gate conductive layer, the first storage electrode 1153 is illustrated as the second gate conductive layer, and the third gate conductive layer is illustrated as the lower second initialization voltage line 128a. However, in one or more embodiments, the first gate conductive layer, the second gate conductive layer, and the third gate conductive layer may be differently used, and they are not limited to the light emitting control line 155, the first storage electrode 1153, and the lower second initialization voltage line 128a. In one or more embodiments, the opening OP of the pixel defining layer 380 is illustrated in a circular shape below, but is not limited thereto, and it may have various suitable shapes such as a quadrangular shape, a hexagonal shape, and/or an octagonal shape.

First, one or more embodiments of FIG. 21 and FIG. 22 will be described.

Figure 22:
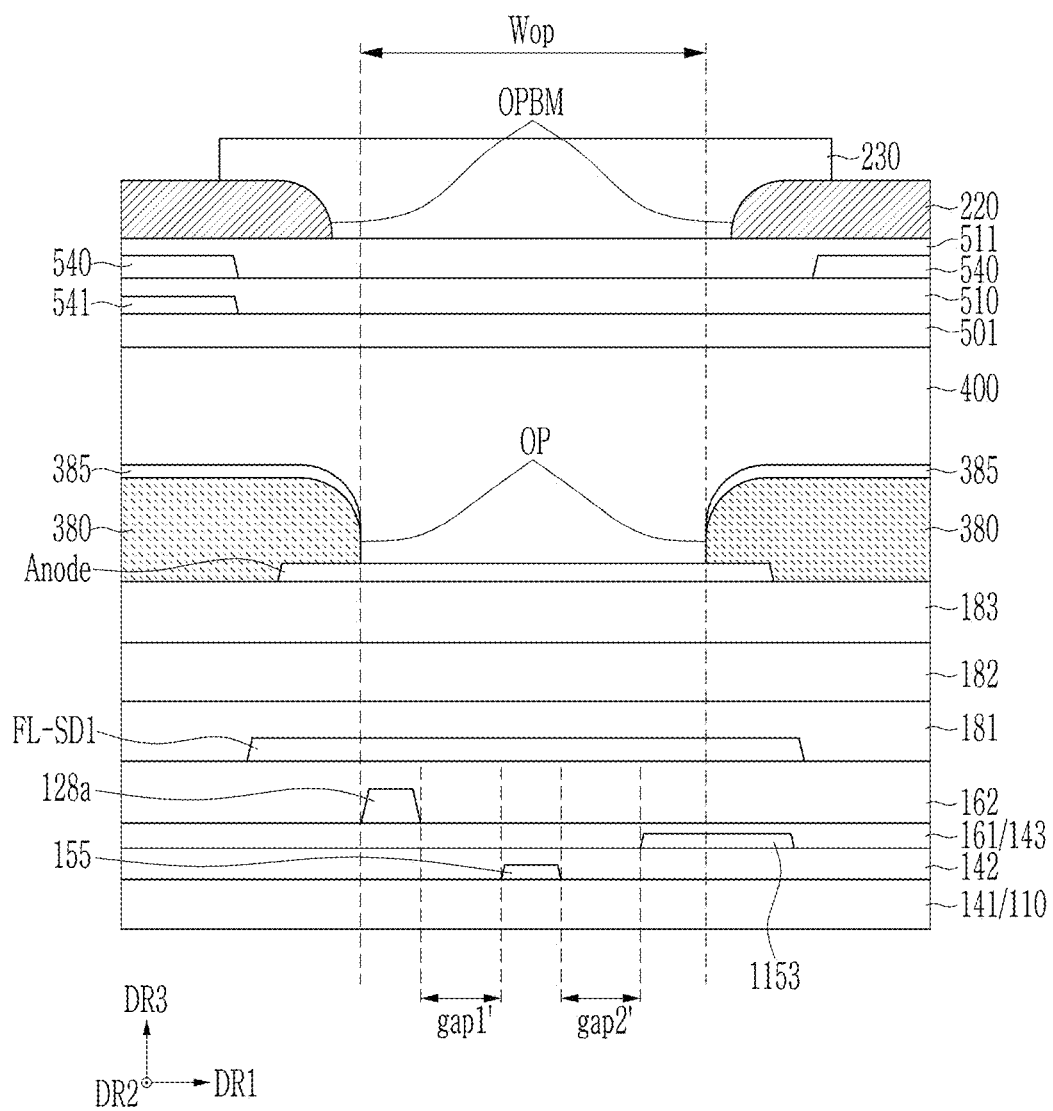
FIG. 22 illustrates a cross-sectional view of the light emitting display device according to the embodiment of FIG. 21.

FIG. 21 illustrates a top plan view of only a portion of a conductive layer based on an opening of a pixel defining layer of a light emitting display device according to one or more embodiments, and FIG. 22 illustrates a cross-sectional view of the light emitting display device according to the embodiment of FIG. 21.

In FIG. 21, only the light emitting control line 155 positioned in the first gate conductive layer, the first storage electrode 1153 positioned in the second gate conductive layer, the lower second initialization voltage line 128a positioned in the third gate conductive layer, and the opening OP of the pixel defining layer 380 are shown. Hereinafter, the lower second initialization voltage line 128a positioned in the third gate conductive layer positioned at an uppermost portion in the second direction DR2 of FIG. 21 in the opening OP of the pixel defining layer 380 is referred to as a first conductive pattern, the light emitting control line 155 positioned in the first gate conductive layer positioned at an intermediate portion is referred to as a second conductive pattern, and the first storage electrode 1153 positioned in the second gate conductive layer positioned at a lowermost portion may be referred to as a third conductive pattern.

Within the opening OP of the pixel defining layer 380 in a plan view of FIG. 21, based on the light emitting control line 155 positioned in the first gate conductive layer, a gap (gap1) up to the lower second initialization voltage line 128a positioned in the third gate conductive layer and a gap (gap2) up to the first storage electrode 1153 positioned in the second gate conductive layer may be the same (e.g., the same in size). Here, the light emitting control line 155 positioned in the first gate conductive layer, the first storage electrode 1153 positioned in the second gate conductive layer, and the lower second initialization voltage line 128a positioned in the third gate conductive layer extend in the first direction DR1, and the two gaps (gap1 and gap2) may be gaps in the second direction DR2 perpendicular to the expansion direction (first direction DR1).

In one or more embodiments, a center of the opening OP of the pixel defining layer 380 may be positioned on the light emitting control line 155, that is, the second conductive pattern, which is a center of the two gaps (gap1 and gap2) in a plan view.

Referring to FIG. 21, it is shown that an upper end of the opening OP of the pixel defining layer 380 coincides with a boundary of the second initialization voltage line 128a, that is, the first conductive pattern, but in one or more embodiments, the upper end of the opening OP of the pixel defining layer 380 may overlap the second initialization voltage line 128a, that is, the first conductive pattern, so that the second initialization voltage line 128a may be formed wider outside the upper side of the opening OP of the pixel defining layer 380. In one or more embodiments, the second initialization voltage line 128a may extend farther in the second direction DR2 away from a center of the opening OP than the outermost upper side of the opening OP of the pixel defining layer 380 is to the center of the opening OP. In addition, it is shown that a lower end of the opening OP of the pixel defining layer 380 coincides with a boundary of the first storage electrode 1153, that is, the third conductive pattern, but in one or more embodiments, the lower end of the opening OP of the pixel defining layer 380 may overlap the first storage electrode 1153, that is, the third conductive pattern, so that the first storage electrode 1153 may be formed wider outside the lower side of the opening OP of the pixel defining layer 380. In one or more embodiments, the first storage electrode 1153 may extend farther in the second direction DR2 away from a center of the opening OP than the outermost lower side of the opening OP of the pixel defining layer 380 is to the center of the opening OP.

Referring to FIG. 22, it is illustrated that the first storage electrode 1153, which is the third conductive pattern, may be formed to extend to the lower portion of the opening OP of the pixel defining layer 380 and/or the anode (Anode).

Figure 29:
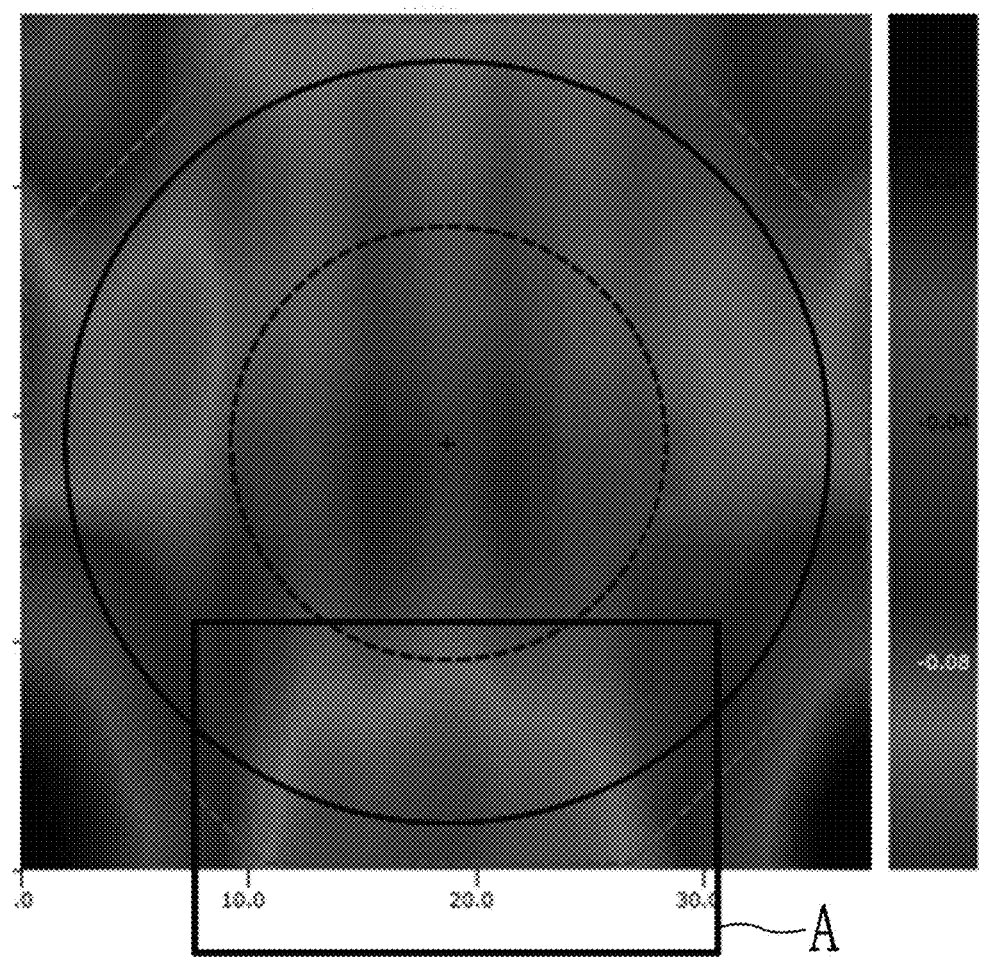
FIG. 29 illustrates measured flatness of an anode according to a comparative example.

In one or more embodiments, referring to FIG. 29, flatness of an anode of a comparative example is shown, and referring to portion 'A' of FIG. 29, it can be seen that a lower portion of the anode has a less flat structure. However, as described above, when three wires positioned under the opening OP of the pixel defining layer 380 and/or the anode (Anode) are adjusted to have the same (e.g., the same in size) gaps (gap1 and gap2) in the second direction, the portion 'A' of FIG. 29 may be more flattened. In one or more embodiments, referring to FIG. 22, the first storage electrode 1153, which is the third conductive pattern, is formed to extend to the lower portion of the opening OP of the pixel defining layer 380 and/or the anode (Anode), so that the portion 'A' of FIG. 29 may be further flattened. As a result, it is possible to improve display quality by preventing or substantially preventing light reflected from the anode (Anode) from asymmetrically spreading and by reducing reflective color bands due to color spread (color separation) caused by the reflected light.

In one or more embodiments, the portions in which the two gaps (gap1 and gap2) are constant may overlap the expansion FL-SD1 positioned in the first data conductive layer and/or the anode (Anode) in a plan view. In one or more embodiments, as described above, the portions in which the two gaps (gap1 and gap2) are constant may overlap a structure of the four wires 171 and 172-e positioned in the second data conductive layer in a plan view as shown in the embodiment of FIG. 17. Here, the four wires 171 and 172-e may have a structure in which protruding wire parts 172-e of the driving voltage line 172 are positioned at respective sides of two data lines 171 and extend in the second direction DR2. By this additionally overlapping structure, portion 'A' of FIG. 29 may be more flattened.

Hereinafter, one or more embodiments of FIG. 23 and FIG. 24 will be described.

Figure 23:
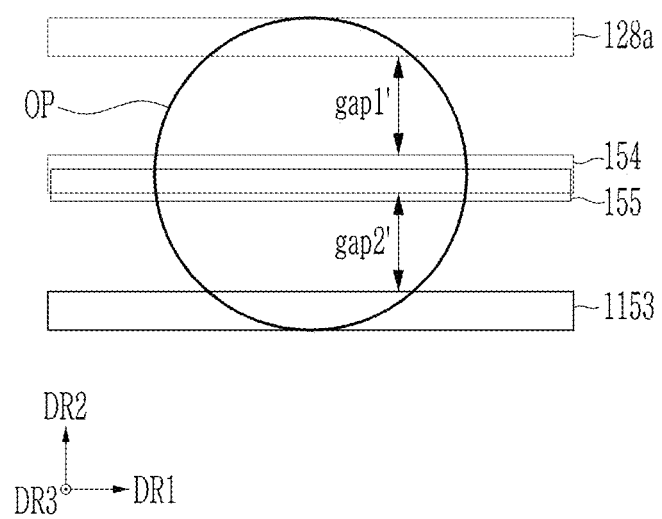
FIG. 23 illustrates a top plan view of only a portion of a conductive layer based on an opening of a pixel defining layer of a light emitting display device according to another embodiment.
Figure 24:
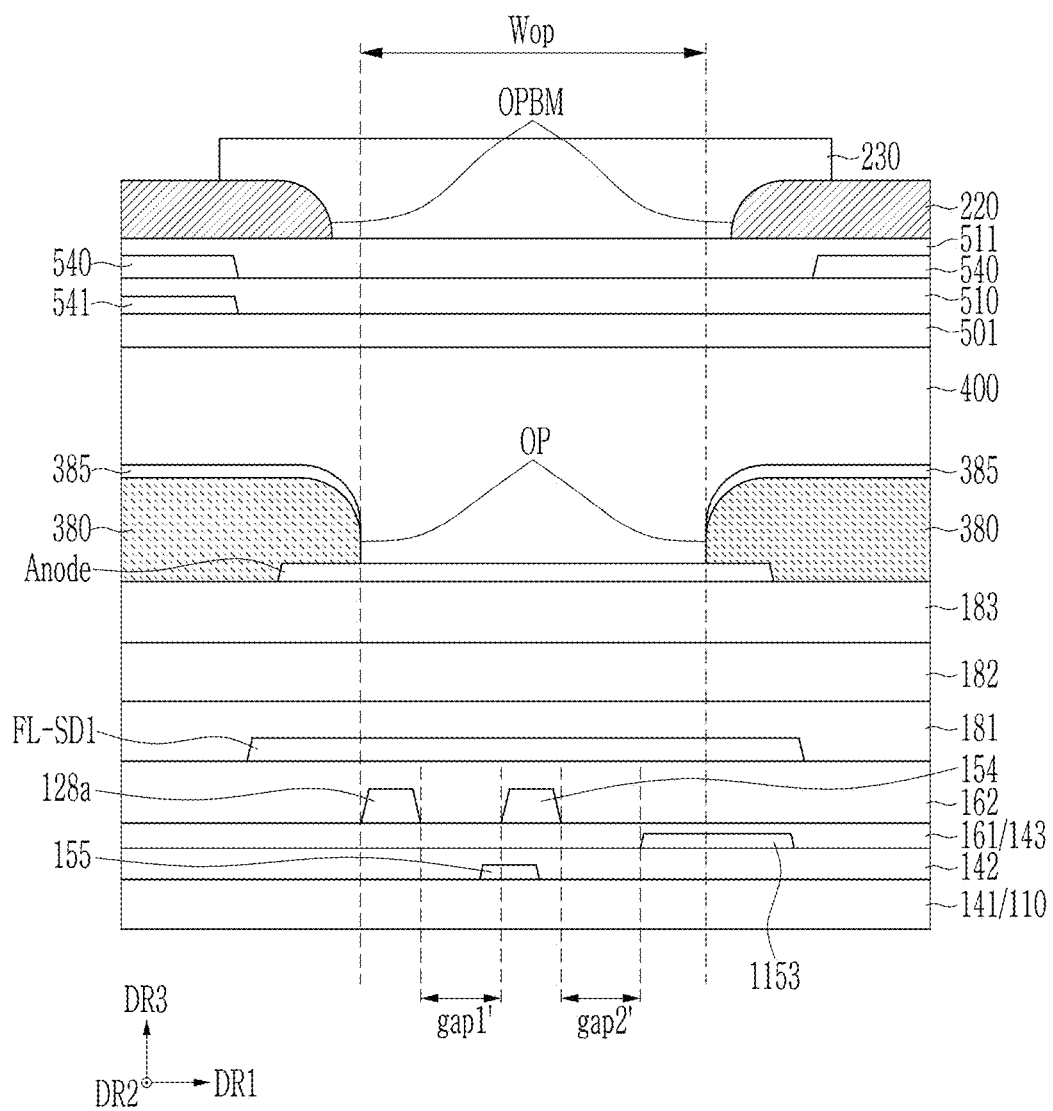
FIG. 24 illustrates a cross-sectional view of the light emitting display device according to the embodiment of FIG. 23.

FIG. 23 illustrates a top plan view of only a portion of a conductive layer based on an opening of a pixel defining layer of a light emitting display device according to another embodiment, and FIG. 24 illustrates a cross-sectional view of a light emitting display device according to one or more embodiments.

The embodiment of FIG. 23 and FIG. 24 is one or more embodiments in which two conductive layers are formed with the second conductive pattern, unlike the embodiment of FIG. 21 and FIG. 22. For example, in the opening OP of the pixel defining layer 380, the first conductive pattern positioned at an uppermost position in the second direction DR2 in FIG. 23 is shown as the lower second initialization voltage line 128*a* positioned in the third gate conductive layer, and the third conductive pattern positioned at a lowermost position is shown as the first storage electrode 1153 positioned in the second gate conductive layer. However, unlike FIG. 21 and FIG. 22, the second conductive pattern includes an additional conductive pattern 154 positioned in the third gate conductive layer and the light emitting control line 155 positioned in the first gate conductive layer positioned thereunder.

In the embodiment of FIG. 23, the additional conductive pattern 154 positioned in the third gate conductive layer is used as a reference for two gaps (gap1' and gap2'). This is because the third gate conductive layer is positioned closer to the anode (Anode) than the first gate conductive layer so that it may significantly affect the flattening of the anode (Anode). Various signals or voltages may be applied to the additional conductive pattern 154, and in one or more embodiments, the same voltage as the lower second initialization voltage line 128*a* or a different voltage may be applied thereto, and in one or more embodiments, a signal for turning on one transistor included in the pixel may be applied thereto.

Referring to FIG. 23 and FIG. 24, the light emitting control line 155 positioned in the first gate conductive layer, which is another second conductive pattern, partially overlaps the additional conductive pattern 154 in a plan view, but in one or more embodiments, the entire light emitting control line 155 may overlap the additional conductive pattern 154 in a plan view in the opening OP of the pixel defining layer 380.

Referring to FIG. 23, it is shown that an upper end of the opening OP of the pixel defining layer 380 coincides with a boundary of the second initialization voltage line 128*a*, that is, the first conductive pattern, but in one or more embodiments, the upper end of the opening OP of the pixel defining layer 380 may overlap the second initialization voltage line 128*a*, that is, the first conductive pattern, so that the second initialization voltage line 128*a* may be formed wider outside the upper side of the opening OP of the pixel defining layer 380. In one or more embodiments, the second initialization voltage line 128*a* may extend farther in the second direction DR2 away from a center of the opening OP than the outermost upper side of the opening OP of the pixel defining layer 380 is to the center of the opening OP. In addition, it is shown that a lower end of the opening OP of the pixel defining layer 380 coincides with a boundary of the first storage electrode 1153, that is, the third conductive pattern, but in one or more embodiments, the lower end of the opening OP of the pixel defining layer 380 may overlap the first storage electrode 1153, that is, the third conductive pattern, so that the first storage electrode 1153 may be formed wider outside the lower side of the opening OP of the pixel defining layer 380. In one or more embodiments, the first storage electrode 1153 may extend farther in the second direction DR2 away from a center of the opening OP than the outermost lower side of the opening OP of the pixel defining layer 380 is to the center of the opening OP.

Hereinafter, one or more embodiments of FIG. 25 and FIG. 26 will be described.

Figure 25:
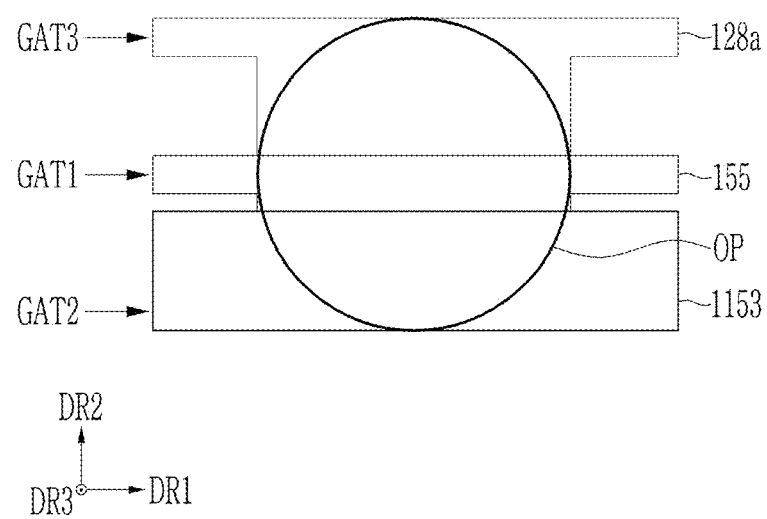
FIG. 25 illustrates a top plan view of only a portion of a conductive layer based on an opening of a pixel defining layer of a light emitting display device according to another embodiment.
Figure 26:
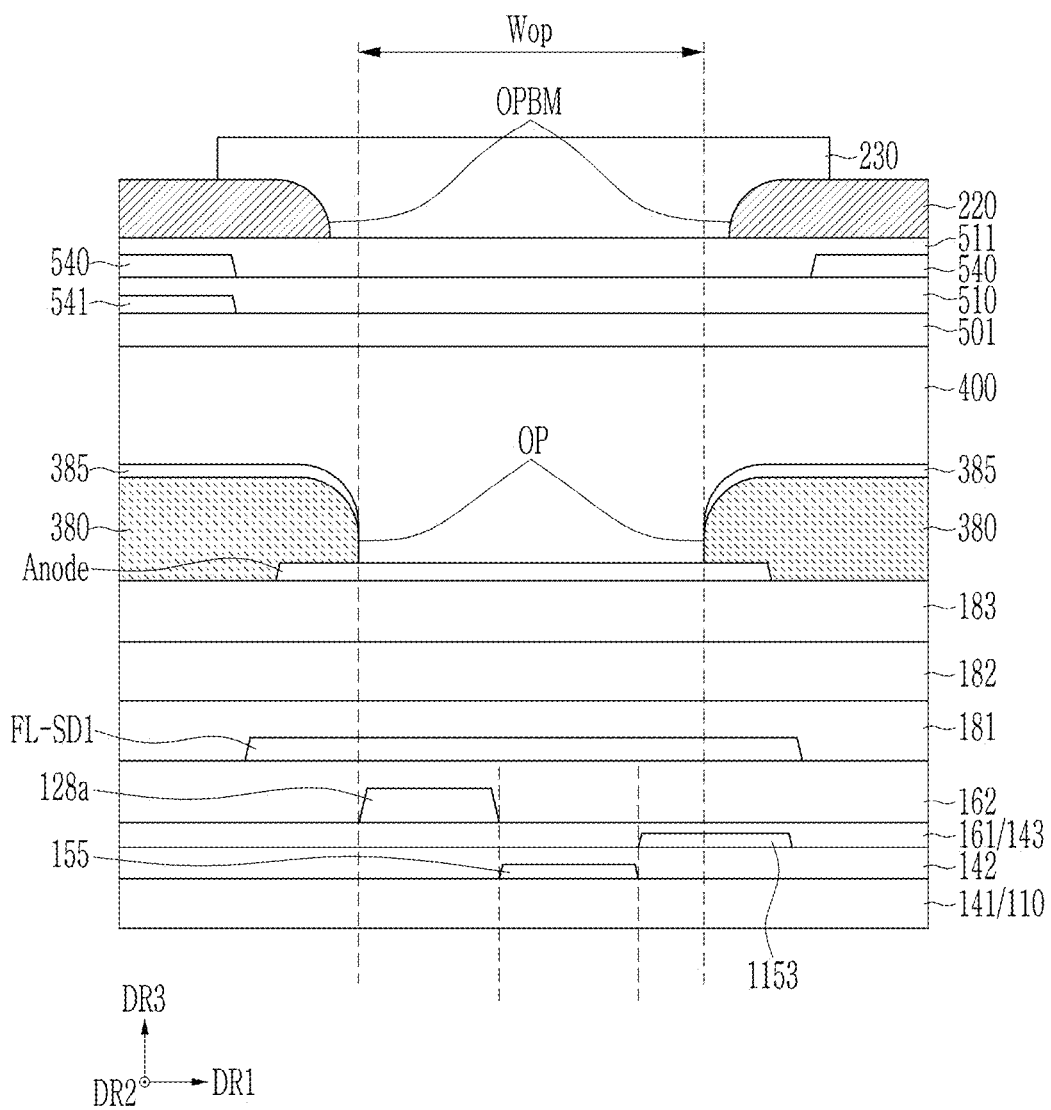
FIG. 26 illustrates a cross-sectional view of the light emitting display device according to the embodiment of FIG. 25.

FIG. 25 illustrates a top plan view of only a portion of a conductive layer based on an opening of a pixel defining layer of a light emitting display device according to another embodiment, and FIG. 26 illustrates a cross-sectional view of the light emitting display device according to the embodiment of FIG. 25.

Unlike the embodiment of FIG. 21 and FIG. 22, in the embodiment of FIG. 25 and FIG. 26, the first conductive pattern, the second conductive pattern, and the third conductive pattern are extended in the opening OP of the pixel defining layer 380, so that there is no portion in which the opening OP of the pixel defining layer 380 does not overlap the first conductive pattern, the second conductive pattern, and the third conductive pattern in a plan view.

FIG. 25 and FIG. 26 show a structure in which one boundary of the first conductive pattern and one boundary of the second conductive pattern completely coincide with each other in the opening OP of the pixel defining layer 380, but in one or more embodiments, the first conductive pattern and the second conductive pattern may at least partially overlap. In one or more embodiments, a structure in which one boundary of the third conductive pattern and one boundary of the second conductive pattern completely coincide with each other in the opening OP of the pixel defining layer 380 is shown, but in one or more embodiments, the third conductive pattern and the second conductive pattern may at least partially overlap.

Referring to FIG. 25, it is shown that an upper end of the opening OP of the pixel defining layer 380 coincides with a boundary of the second initialization voltage line 128*a*, that is, the first conductive pattern, but in one or more embodiments, the upper end of the opening OP of the pixel defining layer 380 may overlap the second initialization voltage line 128*a*, that is, the first conductive pattern, so that the second initialization voltage line 128*a* may be formed wider outside the upper side of the opening OP of the pixel defining layer 380. In one or more embodiments, the second initialization voltage line 128*a* may extend farther in the second direction DR2 away from a center of the opening OP than the outermost upper side of the opening OP of the pixel defining layer 380 is to the center of the opening OP. In addition, it is shown that a lower end of the opening OP of the pixel defining layer 380 coincides with a boundary of the first storage electrode 1153, that is, the third conductive pattern, but in one or more embodiments, the lower end of the opening OP of the pixel defining layer 380 may overlap the first storage electrode 1153, that is, the third conductive pattern, so that the first storage electrode 1153 may be formed wider outside the lower side of the opening OP of the pixel defining layer 380. In one or more embodiments, the first storage electrode 1153 may extend farther in the second direction DR2 away from a center of the opening OP than the outermost lower side of the opening OP of the pixel defining layer 380 is to the center of the opening OP.

Hereinafter, an embodiment of FIG. 27 and FIG. 28 will be described.

Figure 27:
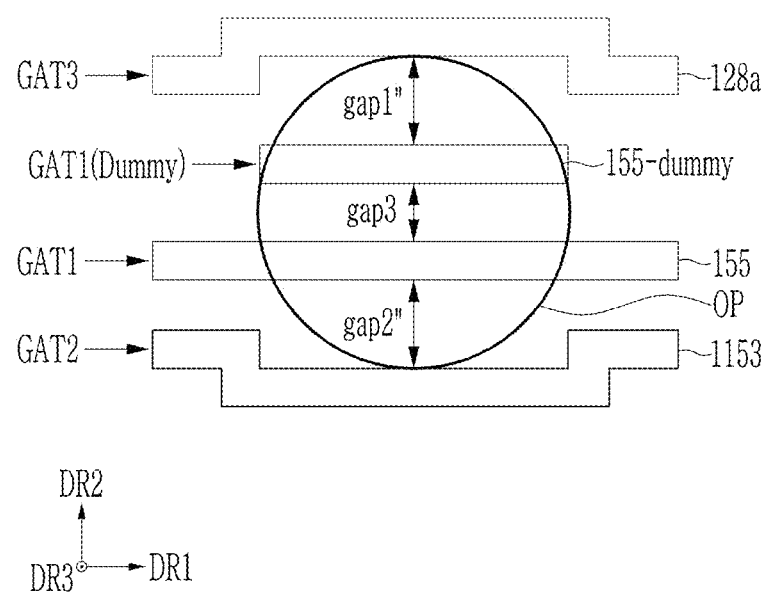
FIG. 27 illustrates a top plan view of only a portion of a conductive layer based on an opening of a pixel defining layer of a light emitting display device according to another embodiment.
Figure 28:
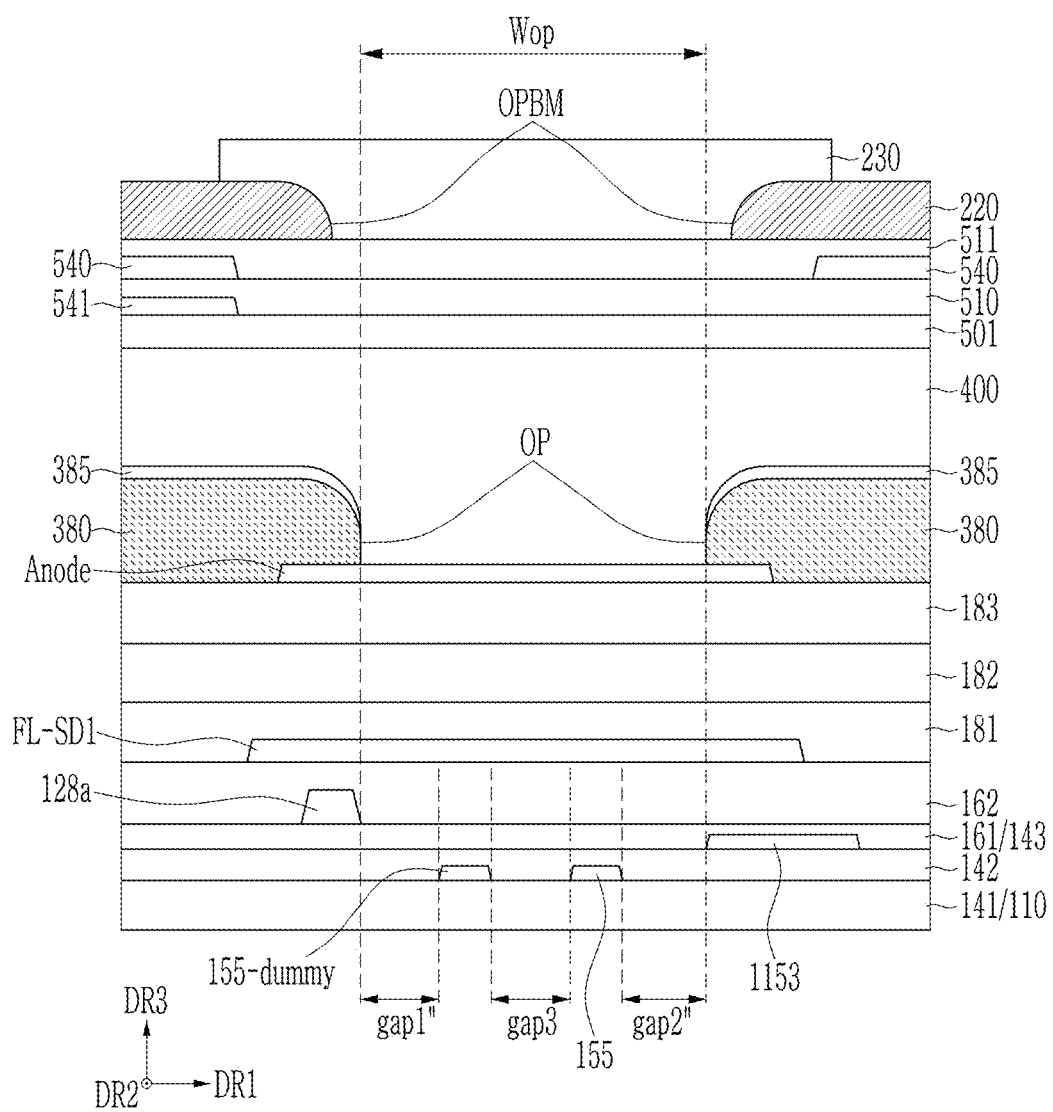
FIG. 28 illustrates a cross-sectional view of the light emitting display device according to the embodiment of FIG. 27.

FIG. 27 illustrates a top plan view of only a portion of a conductive layer based on an opening of a pixel defining layer of a light emitting display device according to another embodiment, and FIG. 28 illustrates a cross-sectional view of the light emitting display device according to the embodiment of FIG. 27.

Unlike the embodiment of FIG. 21 and FIG. 22, the embodiment of FIG. 27 and FIG. 28 is an embodiment in which the first conductive pattern and the third conductive pattern are disposed at the outside of the opening OP of the pixel defining layer 380 and are not positioned within the opening OP of the pixel defining layer 380. In this case, a dummy conductive pattern (155—dummy) is additionally formed in the opening OP of the pixel defining layer 380, and in the embodiment of FIG. 27, an additional conductive pattern is formed in the first gate conductive layer. However, in one or more embodiments, the first conductive pattern and/or the third conductive pattern may be partially positioned inside the opening OP of the pixel defining layer 380.

The dummy conductive pattern (155—dummy) may extend parallel to the first direction DR1 along with the light emitting control line 155, and may be positioned only around the opening OP of the pixel defining layer 380. For example, in FIG. 27, the dummy conductive pattern (155—dummy) is shown as a pattern positioned only within the opening OP of the pixel defining layer 380, but in one or more embodiments, it may also be at least partially positioned outside the opening OP of the pixel defining layer 380 in a plan view.

In FIG. 27 and FIG. 28, a gap between the dummy conductive pattern (155—dummy) and the second initialization voltage line 128a, that is, the first conductive pattern, is shown as gap1", a gap between the dummy conductive pattern (155—dummy) and the light emitting control line 155, that is, the second conductive pattern, is shown as gap3, and a gap between the light emitting control line 155 and the first storage electrode 1153, that is, the third conductive pattern, is shown as gap2". Here, the gap (gap1") between the dummy conductive pattern (155—dummy) and the first conductive pattern (the second initialization voltage line 128a) may be the same (e.g., the same in size) as the gap (gap2") between the second conductive pattern (the light emitting control line 155) and the third conductive pattern (the first storage electrode 1153). In this case, the gap3 between the dummy conductive pattern (155—dummy) and the second conductive pattern (the light emitting control line 155) may also be the same (e.g., the same in size) as the other gaps (gap1" and gap2"). However, in one or more embodiments, at least two of the three gaps (gap1", gap2", and gap3) may be the same (e.g., the same in size) and the other one may be different.

In one or more embodiments, the additional conductive pattern may be positioned in a conductive layer other than the first gate conductive layer.

An effect of the case in which the first conductive pattern, the second conductive pattern, and the third conductive pattern, which are various suitable patterns, are formed will be described with reference to FIG. 29.

FIG. 29 illustrates measured flatness of an anode according to a comparative example.

Portion 'A' of FIG. 29 shows a portion in which the anode is not partially flattened even in a comparative example.

However, according to one or more embodiments described above, at least three conductive patterns positioned below the opening OP of the pixel defining layer 380 and/or the anode (Anode) are adjusted to have a constant gap from each other in the second direction, so that the portion 'A' in FIG. 29 may be further flattened. For example, at least three conductive patterns may be positioned in one of the first gate conductive layer, the second gate conductive layer, and the third gate conductive layer.

In one or more embodiments, as in the embodiments of FIG. 22, FIG. 24, FIG. 26, and FIG. 28, in one or more embodiments, the third conductive pattern (the first storage electrode 1153) extends to the lower portion of the opening OP of the pixel defining layer 380 and/or the anode (Anode), so that the portion 'A' of FIG. 29 may be more flattened. As a result, it is possible to improve display quality by preventing or substantially preventing light reflected from the anode (Anode) from asymmetrically spreading and by reducing reflective color bands due to color spread (color separation) caused by the reflected light.

Hereinafter, another embodiment of making the anode flatter (e.g., more planarized) will be described with reference to FIG. 30 to FIG. 33.

Figure 30:
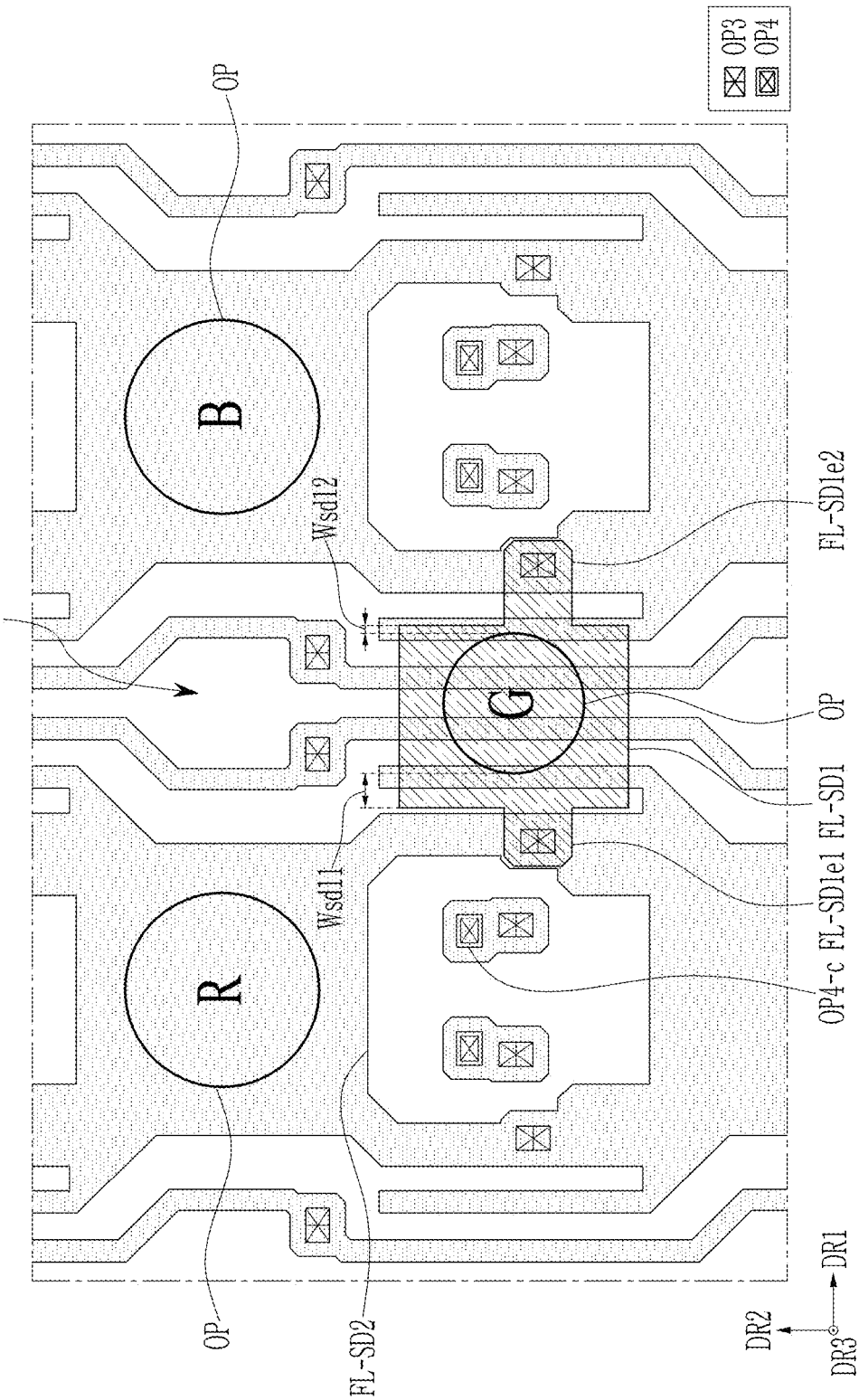
FIG. 30 illustrates a top plan view of only a portion of a conductive layer of a light emitting display device according to one or more embodiments.
Figure 31:
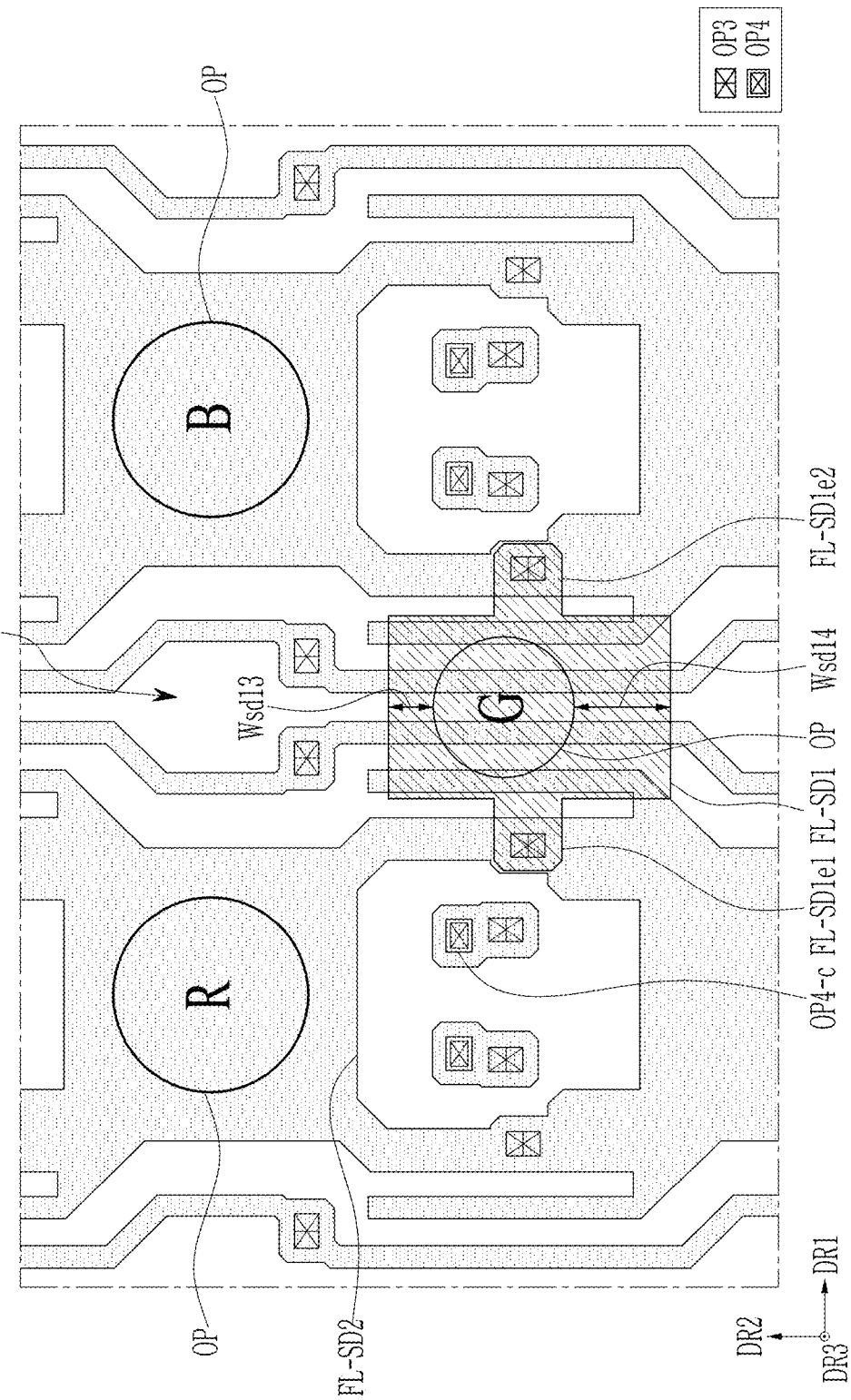
FIG. 31 and FIG. 32 respectively illustrate a top plan view of only a portion of a conductive layer of a light emitting display device according to another embodiment.
Figure 32:
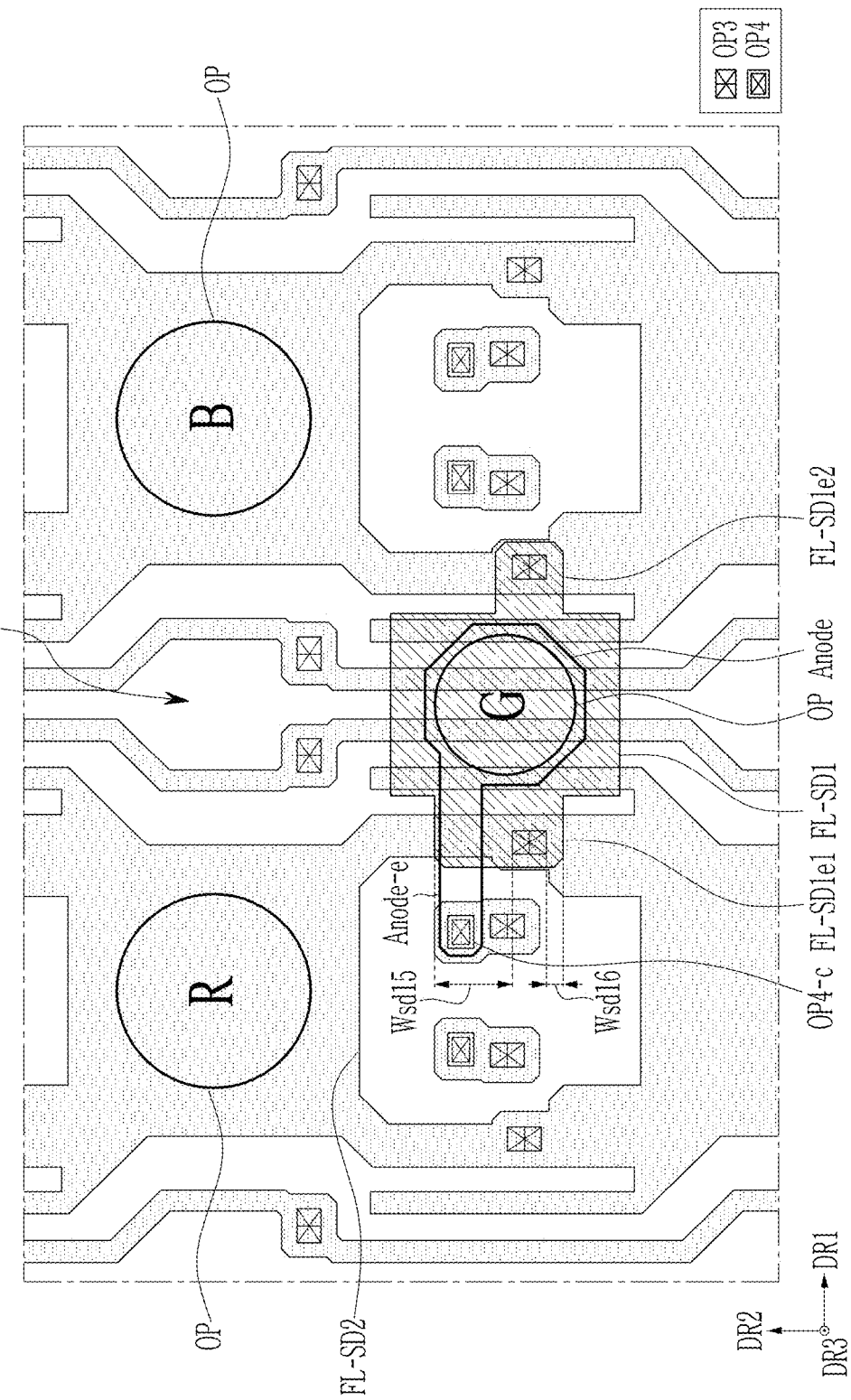

FIG. 30 to FIG. 32 show only the expansion FL-SD1 of the first data conductive layer and the opening OP of the pixel defining layer 380 shown in FIG. 14 in addition to the top plan view of the second data conductive layer shown in FIG. 16, so that an embodiment that additionally improves the flatness characteristic of the anode by changing the structure of the expansion FL-SD1 positioned in the first data conductive layer will be described. Portions not shown in FIG. 30 to FIG. 32 may correspond to portions shown in other drawings and/or the like. Here, the opening OP4 to which the anode overlapping the expansion FL-SD1 of the opening OP4 (also referred to as an anode connecting opening) may be connected (e.g., electrically connected) is shown as OP4-c.

First, an embodiment of FIG. 30 will be described.

FIG. 30 illustrates a top plan view of only a portion of a conductive layer of a light emitting display device according to one or more embodiments.

In the embodiment of FIG. 30, the expansion FL-SD1 positioned in the first data conductive layer has an asymmetry (hereinafter also referred to as left-right asymmetry) structure in the first direction DR1. For example, gaps Wsd11 and Wsd12 formed by left and right sides of the expansion FL-SD1 and at opposite ends of the first direction DR1 of the opening OP of the pixel defining layer 380 overlapping in a plan view are different (e.g., different in size) from each other where the left gap Wsd11 is formed to be larger than the right gap Wsd12.

Figure 33:
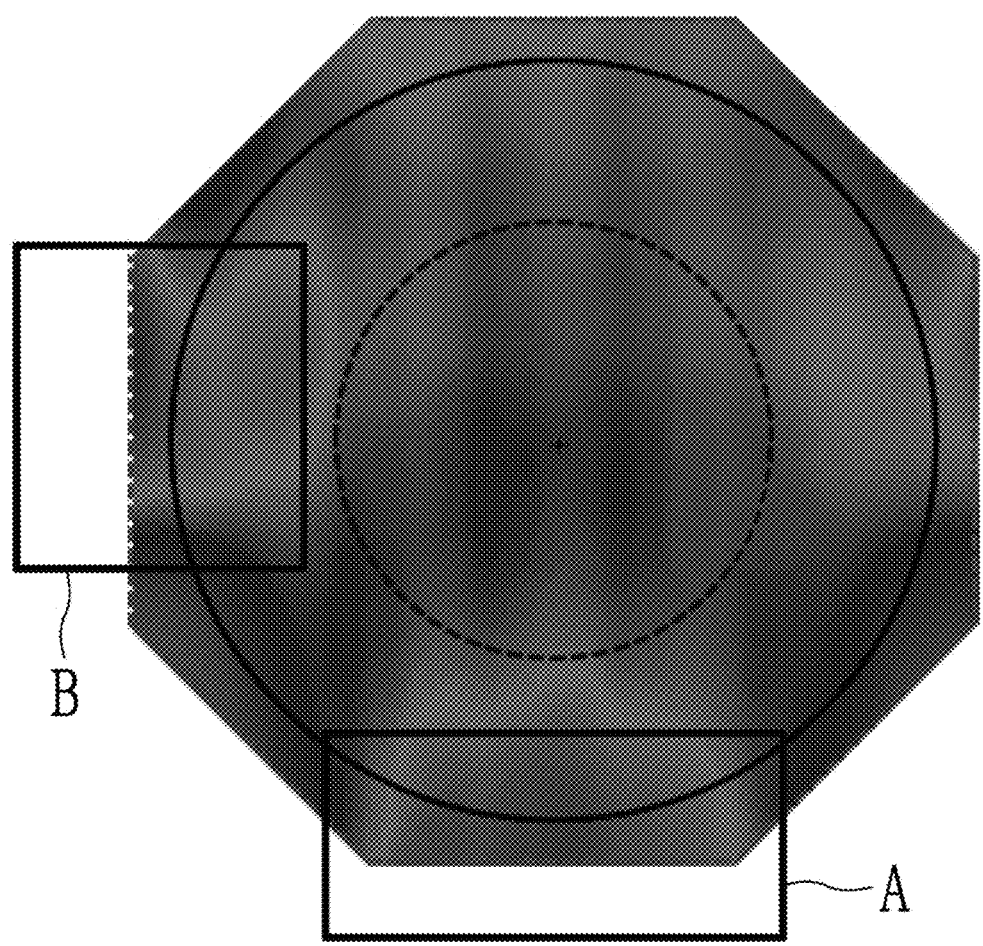
FIG. 33 illustrates measured flatness of an anode according to another comparative example.

As a result, in the comparative example shown in FIG. 33, although the anode is not flat even in portion 'B', the expansion FL-SD1 is formed to extend to the left side so that it may additionally have a flat structure even at the left side of the anode.

The expansion FL-SD1 positioned in the first data conductive layer includes expansions FL-SD1e1 and FL-SD1e2 that are extended to the left and right to be connected to the second data conductive layer through the opening OP3 (hereinafter also referred to as a data conductive layer connecting opening). In the embodiment of FIG. 30, among the left and right expansions of the expansion FL-SD1, a length of the first direction DR1 of the first expansion FL-SD1e1 formed at the left may be shorter than a length of the first direction DR1 of the second expansion FL-SD1e2 formed at the right.

Hereinafter, embodiments of FIG. 31 and FIG. 32 will be respectively described.

FIG. 31 and FIG. 32 respectively illustrate a top plan view of only a portion of a conductive layer of a light emitting display device according to another embodiment.

First, in FIG. 31, unlike FIG. 30, the expansion FL-SD1 positioned in the first data conductive layer has an asymmetry (hereinafter also referred to as up-down asymmetry) structure in the second direction DR2. For example, gaps Wsd13 and Wsd14 formed by upper and lower sides of the expansion FL-SD1 and at opposite ends of the second direction DR2 of the opening OP of the pixel defining layer 380 overlapping in a plan view are different (e.g., different in size) from each other where the upper gap Wsd13 is formed to be smaller than the lower gap Wsd14.

As a result, in the comparative example shown in FIG. 33, although the anode is not flat even in portion 'A', the expansion FL-SD1 is formed to extend to the lower side so that it may additionally have a flat structure even at the lower side of the anode.

Meanwhile, FIG. 32 illustrates an embodiment in which the first expansion FL-SD1e1 of the expansion FL-SD1 at a side where the opening OP4-c allowing the anode (Anode)

overlapping the expansion FL-SD1 to be connected (e.g., electrically connected) is positioned is formed thicker. For example, the expansion FL-SD1 positioned in the first data conductive layer includes two expansions FL-SD1e1 and FL-SD1e2 extending left and right to be connected to the second data conductive layer through the opening OP3, and widths of the left and right expansions FL-SD1e1 and FL-SD1e2 in the second direction DR2 are different from each other. Because the opening OP4-c that allows the anode (Anode) overlapping the expansion FL-SD1 to be connected (e.g., electrically connected) to each other is positioned at the left side, the left expansion of the left and right expansions of the expansion FL-SD1 is formed to have a thicker width. In one or more embodiments, in the embodiment of FIG. 32, in the first expansion FL-SD1e1 at the left side of the expansion FL-SD1, a gap Wsd15 between the opening OP3 and the upper side is larger than a gap Wsd16 between the opening OP3 and the lower side. On the other hand, in the embodiment of FIG. 32, in the second expansion FL-SD1e3 at the right side of the expansion FL-SD1, because the opening OP3 is positioned between the upper side and the lower side, a gap between the opening OP3 and the upper side and a gap between the opening OP3 and the lower side may be equal to each other.

As a result, in the comparative example shown in FIG. 33, although the anode is not flat even in the portion 'B', the left expansion of the expansion FL-SD1 is formed to be wide, so that it may additionally have a flat structure at the left side of the anode.

FIG. 30 to FIG. 32 are different from each other in the deformable portion of the expansion FL-SD1, but in one or more embodiments, at least two of the embodiments of FIG. 30 to FIG. 32 may be applied together.

The effect of the deformable structures of the various suitable expansions FL-SD1 will be described with reference to FIG. 33.

FIG. 33 illustrates measured flatness of an anode according to another comparative example.

Portion 'A' and portion 'B' of FIG. 33 show portions in which the anode is not partially flattened even in a comparative example.

However, according to the embodiments of FIG. 30 to FIG. 32, the portions 'A' and/or 'B' of FIG. 33 may be more flattened by various suitable modified structures of the expansion FL-SD1 positioned below the opening OP of the pixel defining layer 380 and/or the anode (Anode). In the embodiments of FIG. 30 and FIG. 32, the portion 'B' of FIG. 33 may be flattened, and in the embodiment of FIG. 31, the portion 'A' of FIG. 33 may be flattened. As a result, it is possible to improve display quality by preventing or substantially preventing light reflected from the anode (Anode) from asymmetrically spreading and by reducing reflective color bands due to color spread (color separation) caused by the reflected light.

In the above-described embodiments, it is shown that the opening OP of the pixel defining layer 380 corresponds to the green pixel. However, the above-described embodiments may be equally applied to a blue pixel or a red pixel.

Hereinafter, an embodiment of allowing the anode to be more flattened will be described with reference to FIG. 34, by adjusting relative positions of the expansion FL-SD2 (hereinafter also referred to as a second expansion) of the second data conductive layer SD2 and the opening OP of the pixel defining layer 380 positioned thereon in a plan view.

Figure 34:
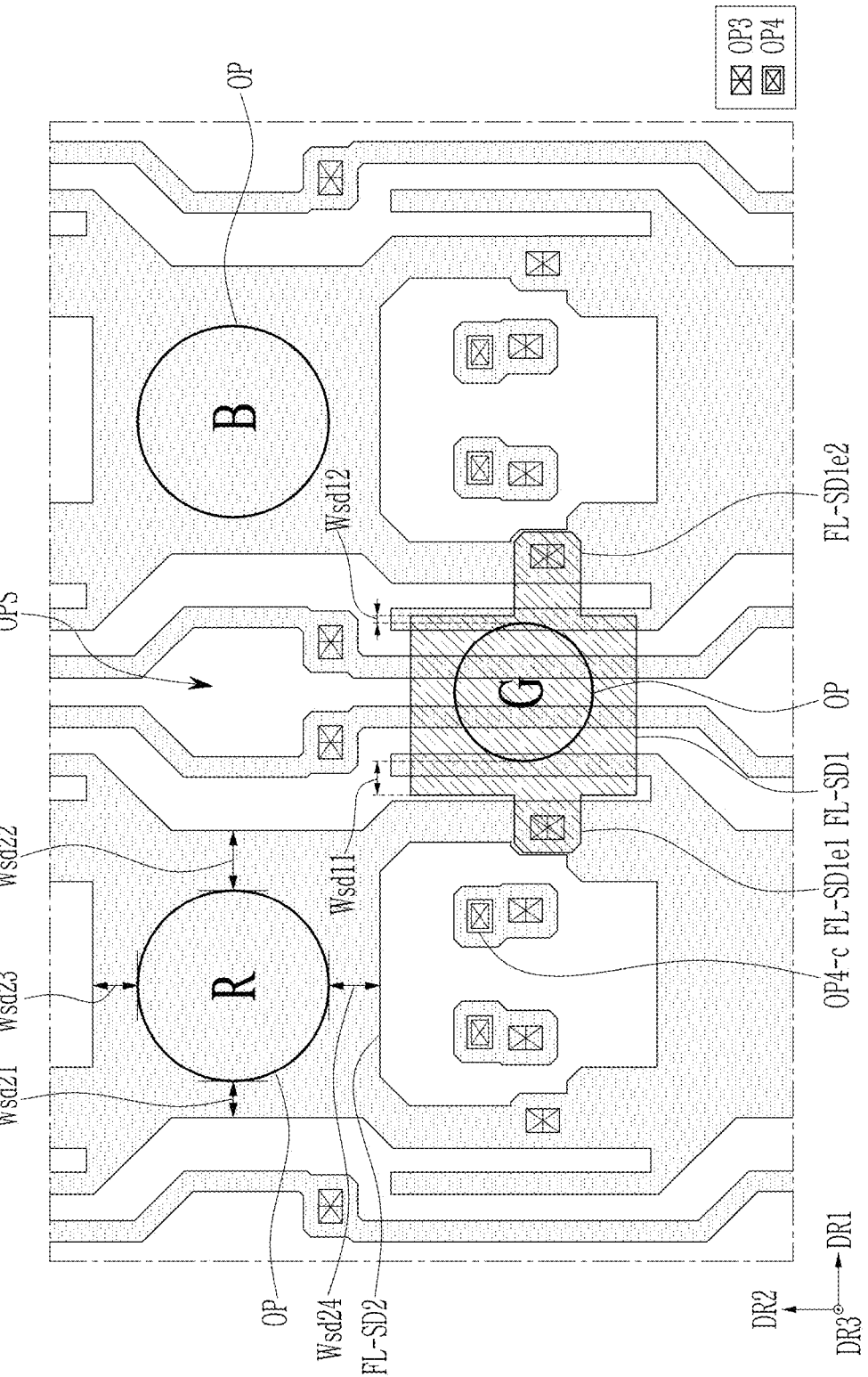
FIG. 34 illustrates a top plan view of only a portion of a conductive layer of a light emitting display device according to one or more embodiments.

FIG. 34 illustrates a top plan view of only a portion of a conductive layer of a light emitting display device according to one or more embodiments.

FIG. 34 illustrates that, in the embodiment of FIG. 31, the openings OP of the red (R) and blue (B) overlapping the expansion FL-SD2 of the second data conductive layer SD2 are not positioned in a center and are additionally asymmetrically positioned. For example, the embodiment of FIG. 34 is an embodiment in which the openings OP of the red (R) and the blue (B) are positioned closer to the left side and the upper side of the expansion FL-SD2 of the second data conductive layer SD2.

Therefore, the expansion FL-SD2 positioned in the second data conductive layer has asymmetry (hereinafter, also referred to as left-right asymmetry) structure in the first direction DR1, and also has an asymmetry (hereinafter, also referred to as up-down asymmetry) structure in the second direction DR2. However, in one or more embodiments, it may have only a left-right asymmetry structure or only an up-down asymmetry structure.

For example, gaps Wsd21 and Wsd22 formed by left and right sides of the expansion FL-SD2 and at opposite ends of the first direction DR1 of the opening OP of the pixel defining layer 380 overlapping in a plan view are different (e.g., different in size) from each other where the left gap Wsd21 is formed to be smaller than the right gap Wsd22. However, in one or more embodiments, the gap Wsd21 at the left side may be formed to be larger than the gap Wsd22 at the right side.

In one or more embodiments, in FIG. 34, gaps Wsd23 and Wsd24 formed by the upper and lower sides of the expansion FL-SD2 positioned in the second data conductive layer and at opposite ends of the second direction DR2 of the opening OP of the pixel defining layer 380 overlapping each other in a plan view are different (e.g., different in size) from each other where the upper gap Wsd23 is formed to be smaller than the lower gap Wsd24. Meanwhile, in one or more embodiments, the upper gap Wsd23 may be formed to be larger than the lower gap Wsd22.

As described above, as the opening OP of the pixel defining layer 380 is asymmetrically positioned in the expansion FL-SD2 of the second data conductive layer SD2 positioned thereunder, the anodes of the red (R) and the blue (B) may be more flattened, light reflected from the anodes may not asymmetrically spread, and the reflective color band due to the color spread (color separation) caused by the reflected light may be reduced, thereby improving display quality.

In the embodiment of FIG. 34, the anode of the green (G) pixel is also asymmetrically positioned in the expansion FL-SD1 positioned in the first data conductive layer, and the anodes of the pixels of the other two colors are also asymmetrically positioned in the expansion FL-SD2 positioned in the second data conductive layer. However, in one or more embodiments, at least one of them may be applied, or it may be symmetrically positioned in the expansion FL-SD1 positioned in the first data conductive layer, but it may be asymmetrically positioned in the expansion FL-SD2 positioned in the second data conductive layer.

In the above embodiment, in the opening OP of the pixel defining layer 380, the pixel corresponding to the expansion FL-SD1 positioned in the first data conductive layer is shown as the green pixel, and the pixels corresponding to the expansions FL-SD2 positioned in the second data conductive layer are shown as the red and blue pixels, but the positions of the green, blue, and red pixels may be changed with each other.

In addition, in the above, the embodiment in which the color filter 230 is used has been mainly described. However, the reflection adjusting layer may be used instead of the color filter 230, and hereinafter, a stacked structure of an embodiment in which a reflection adjusting layer 235 is applied instead of the color filter 230 will be described with reference to FIG. 35.

Figure 35:
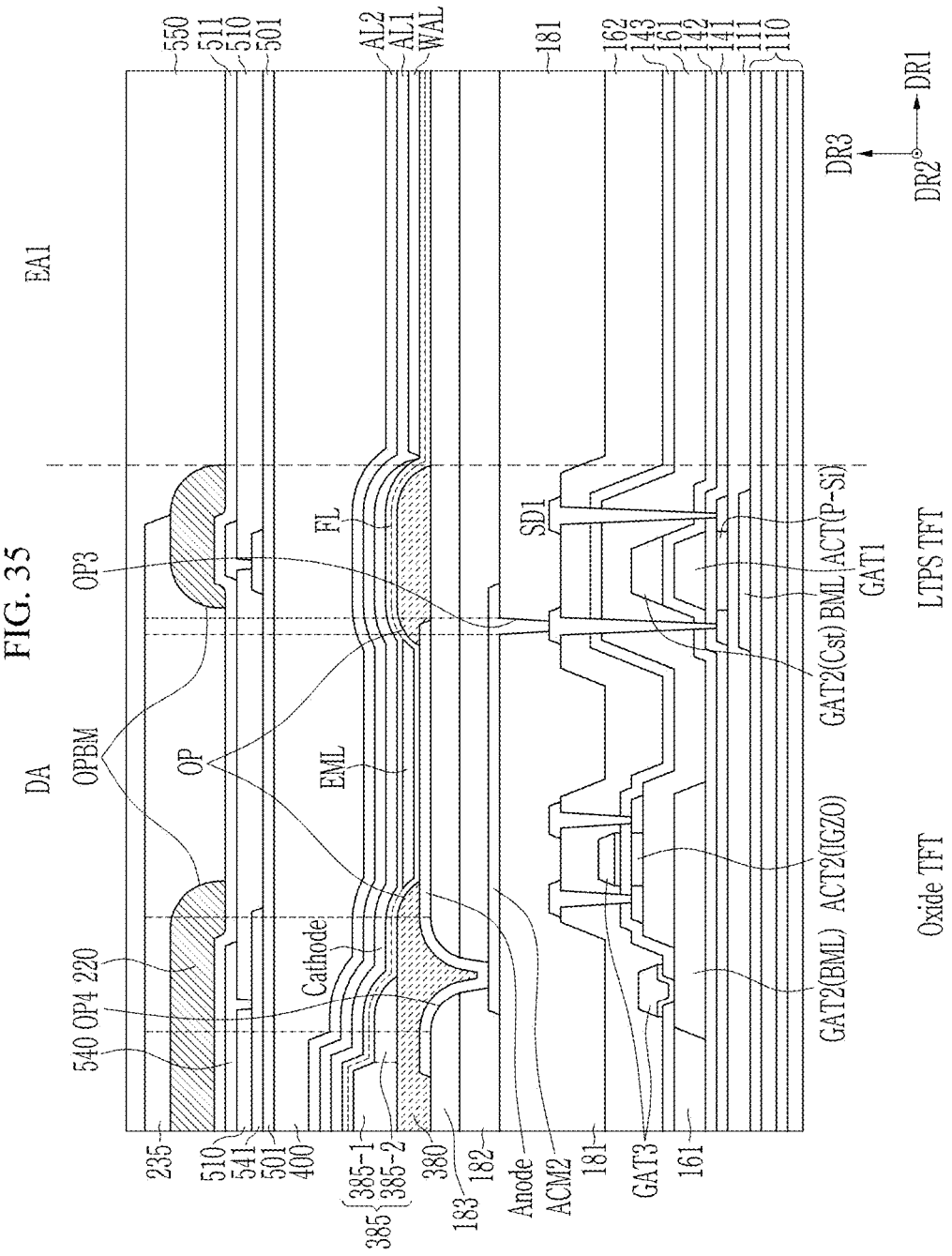
FIG. 35 illustrates a cross-sectional view of a light emitting display device according to another embodiment.

FIG. 35 illustrates a cross-sectional view of a light emitting display device according to another embodiment.

FIG. 35 is a cross-sectional view corresponding to FIG. 20, and hereinafter, portions different from those of FIG. 20 will be mainly described.

The reflection adjusting layer 235 may be disposed on the light blocking member 220. The reflection adjusting layer 235 may selectively absorb light of a wavelength of a partial band in light reflected from inside the display device or light incident from outside the display device. The reflection adjusting layer 235 may fill the opening OP of the light blocking member 220.

For example, the reflection adjusting layer 235 absorbs a first wavelength region of 490 nm to 505 nm and a second wavelength region of 585 nm to 600 nm, so that it may have light transmittance of 40% or less in the first wavelength region and the second wavelength region. The reflection adjusting layer 235 may absorb light of a wavelength that is out of the red, green, or blue light emitting wavelength range emitted from a light emitting element ED. As such, because the reflection adjusting layer 235 absorbs light of a wavelength that is not included in the wavelength range of red, green, or blue emitted from the light emitting element, it is possible to prevent, reduce, or minimize a decrease in the luminance of the display device, and at the same time, it is possible to prevent, reduce, or minimize a decrease in the luminous efficiency of the display device and to improve visibility.

In one or more embodiments, the reflection adjusting layer 235 may be provided as an organic material layer including dye, pigment, or a combination thereof. The reflection adjusting layer 235 may include a tetraazaporphyrin (TAP)-based compound, a porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, an xanthene-based compound, a diimmonium-based compound, a dipyrromethene-based compound, a cyanine-based compound, and/or a combination thereof.

In one or more embodiments, a reflectance measured in a specular component included (SCI) mode on a surface of the reflection adjusting layer 235 may be 10% or less. For example, the reflection adjusting layer may absorb external light reflection of the display device, so that visibility may be improved.

In one or more embodiments, the reflection adjusting layer 235 may have transmittance of about 64% to about 72%. The transmittance of the reflection adjusting layer 235 may be adjusted according to contents of pigment and/or dye included in the reflection adjusting layer 235.

In one or more embodiments, the reflection adjustment layer 235 may not be positioned in the first component area EA1.

In addition, in one or more embodiments including the reflection adjusting layer 235, a capping layer AU and a low reflecting layer AL2 may be additionally formed between the cathode (Cathode) and the encapsulation layer 400.

The capping layer AL1 may serve to improve the luminous efficiency of the light emitting element according to the principle of constructive interference. The capping layer AL1 may include, for example, a material having a refractive index of 1.6 or more with respect to light having a wavelength of 589 nm.

The capping layer AL1 may be an organic capping layer including an organic material, an inorganic capping layer including an inorganic material, or a composite capping layer including an organic material and an inorganic material. For example, the capping layer AL1 may include a carbocyclic compound, a heterocyclic compound, an amine group-containing compound, porphyrin derivatives, phthalocyanine derivatives, naphthalocyanine derivatives, an alkali metal complex, an alkaline earth metal complex, or a combination thereof. The carbocyclic compound, the heterocyclic compound, and the amine group-containing compound may be selectively substituted with a substituent including oxygen (O), nitrogen (N), sulfur (S), selenium (Se), silicon (Si), fluorine (F), chlorine (Cl), bromine (Br), iodine (I), or a combination thereof.

The low reflecting layer AL2 may be disposed on the capping layer AL1. The low reflection layer AL2 may overlap a front surface of a substrate SUB.

The low reflecting layer AL2 may include an inorganic material having low reflectance, and for example, may include a metal or a metal oxide. When the low reflecting layer AL2 includes the metal, for example, it may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof. In one or more embodiments, when the low reflecting layer AL2 includes the metal oxide, for example, it may include $SiO_2$, $TiO_2$, $ZrO_2$, $Ta_2O_5$, $HfO_2$, $Al_2O_3$, $ZnO$, $Y_2O_3$, $BeO$, $MgO$, $PbO_2$, $WO_3$, $SiN_x$, $LiF$, $CaF_2$, $MgF_2$, $CdS$, or a combination thereof.

In one or more embodiments, an absorption coefficient (k) of the inorganic material included in the low reflecting layer AL2 may be 4.0 or less and 0.5 or more ($0.5 < k \leq 4.0$). In one or more embodiments, the inorganic material included in the low reflecting layer AL2 may have a refractive index (n) of 1 or more ($n \geq 1.0$).

The low reflecting layer AL2 induces destructive interference between the light incident inside the display device and the light reflected from the metal disposed under the low reflecting layer AL2, thereby reducing external light reflectivity. Accordingly, it is possible to improve the display quality and visibility of the display device by reducing the external light reflectance of the display device through the low reflecting layer AL2.

In one or more embodiments, the capping layer AL1 may not be provided so that the low reflecting layer AL2 may be in contact with the cathode (Cathode).

The encapsulation layer 400 is positioned on the low reflecting layer AL2, and the other elements may each independently be the same as those of FIG. 20, so descriptions thereof will not be provided.

In one or more embodiments, the cathode (Cathode) formed in the display area may not be formed in the first component area EA1, and in the embodiment of FIG. 35, a low adhesive layer WAL may be positioned at the position of the cathode (Cathode) in the first component area EA1. The low adhesive layer WAL may be positioned on the functional layer FL in the first component area EA1. The low adhesive layer WAL is a material with weak adherence, and in one or more embodiments, the cathode (Cathode) may not be disposed on an upper surface of the low adhesive layer WAL, or the low adhesive layer WAL may include a material having a characteristic that the cathode (Cathode) is formed very thinly.

For example, the low adhesive layer WAL may be formed by using a material such as 8-quinolinatolithium (Liq; [8-quinolinolato lithium]); N,N-diphenyl-N,N-bis(9-phenyl-9H-carbazol-3-yl)biphenyl-4,4'-diamine (HT01); N(diphenyl-4-yl)9,9-dimethyl-N-(4(9-phenyl-9H-carbazol-3-yl)phenyl)-9H-fluorene-2-amine (HT211); or 2-(4-9,10-di(naphthalene-2-yl)anthracene-2-yl)phenyl)-1-phenyl-1H-benzo-[D]imidazole (LG201).

In the present disclosure, one or more embodiments in which the low adhesive layer WAL is positioned in the first component area EA1 are illustrated and described, but in another embodiment, it may be removed through a laser process and/or the like. In this case, the laser process may be a laser process performed on the cathode (Cathode).

In the first component area EA1, the capping layer AL1, the low reflecting layer AL2, and the encapsulation layer 400 may be disposed on the low adhesive layer WAL.

While this disclosure has been described in connection with what is presently considered to be practical embodiments, it is to be understood that the present disclosure is not limited to the disclosed embodiments, but, on the contrary, is intended to cover various suitable modifications and equivalent arrangements included within the spirit and scope of the appended claims and equivalents thereof.

What is claimed is:

1. A light emitting display device comprising:
   a substrate;
   a first conductive pattern, a second conductive pattern, and a third conductive pattern on the substrate, the first conductive pattern, the second conductive pattern, and the third conductive pattern extending in a first direction;
   an organic film covering the first conductive pattern, the second conductive pattern, and the third conductive pattern;
   an anode on the organic film; and
   a pixel defining layer having an opening overlapping the anode,
   wherein the opening of the pixel defining layer overlaps the first conductive pattern, the second conductive pattern, and the third conductive pattern in a plan view,
   wherein the first conductive pattern, the second conductive pattern, and the third conductive pattern are sequentially positioned in a second direction perpendicular to the first direction, and
   wherein, in a portion overlapping the opening of the pixel defining layer in a plan view, a gap between the first conductive pattern and the second conductive pattern in the second direction and a gap between the second conductive pattern and the third conductive pattern in the second direction are the same.

2. The light emitting display device of claim 1, wherein the first conductive pattern, the second conductive pattern, and the third conductive pattern are at different conductive layers.

3. The light emitting display device of claim 2, wherein the first conductive pattern is at a third gate conductive layer, the second conductive pattern is at a first gate conductive layer, and the third conductive pattern is at a second gate conductive layer.

4. The light emitting display device of claim 1, wherein the first conductive pattern and the second conductive pattern are at a same conductive layer, and the third conductive pattern is at a different conductive layer.

5. The light emitting display device of claim 4, wherein the first conductive pattern and the second conductive pattern are at a third gate conductive layer, and the third conductive pattern is at a second gate conductive layer.

6. The light emitting display device of claim 5, further comprising an additional conductive pattern at a different conductive layer from the first conductive pattern, the second conductive pattern, and the third conductive pattern.

7. The light emitting display device of claim 6, wherein the additional conductive pattern at least partially overlaps the second conductive pattern in a plan view.

8. The light emitting display device of claim 7, wherein the additional conductive pattern is at a first gate conductive layer.

9. A light emitting display device comprising:
   a substrate;
   a first conductive pattern, a second conductive pattern, and a third conductive pattern on the substrate and at different conductive layers, the first conductive pattern, the second conductive pattern, and the third conductive pattern extending in a first direction;
   an organic film covering the first conductive pattern, the second conductive pattern, and the third conductive pattern;
   an anode on the organic film; and
   a pixel defining layer having an opening overlapping the anode,
   wherein the opening of the pixel defining layer overlaps the first conductive pattern, the second conductive pattern, and the third conductive pattern in a plan view,
   wherein the first conductive pattern, the second conductive pattern, and the third conductive pattern are sequentially positioned in a second direction perpendicular to the first direction, and
   wherein, in a portion overlapping the opening of the pixel defining layer in a plan view, at least two of the first conductive pattern, the second conductive pattern, and the third conductive pattern have boundaries that coincide with each other in a plan view.

10. The light emitting display device of claim 9, wherein the first conductive pattern is at a third gate conductive layer, the second conductive pattern is at a first gate conductive layer, and the third conductive pattern is at a second gate conductive layer.

11. The light emitting display device of claim 10, wherein the first conductive pattern extends in the opening of the pixel defining layer to contact the second conductive pattern in a plan view.

12. The light emitting display device of claim 11, wherein the second conductive pattern extends in the opening of the pixel defining layer to contact the third conductive pattern in a plan view.

13. A light emitting display device comprising:
    a substrate;
    a first conductive pattern, a second conductive pattern, a third conductive pattern, and a dummy conductive pattern on the substrate, the first conductive pattern, the second conductive pattern, the third conductive pattern, and the dummy conductive pattern extending in a first direction;
    an organic film covering the first conductive pattern, the second conductive pattern, the third conductive pattern, and the dummy conductive pattern;
    an anode on the organic film; and
    a pixel defining layer having an opening overlapping the anode, wherein the opening of the pixel defining layer overlaps the second conductive pattern and the dummy conductive pattern in a plan view;

wherein the first conductive pattern, the second conductive pattern, and the third conductive pattern are sequentially positioned in a second direction perpendicular to the first direction; and wherein the first conductive pattern and the third conductive pattern do not overlap the opening of the pixel defining layer in a plan view, and are formed along an outer edge of the opening of the pixel defining layer.

14. The light emitting display device of claim 13, wherein the dummy conductive pattern is between the first conductive pattern and the second conductive pattern in a plan view; and wherein in a portion overlapping the opening of the pixel defining layer in a plan view, a gap between the first conductive pattern and the dummy conductive pattern in the second direction and a gap between the second conductive pattern and the third conductive pattern in the second direction are the same.

15. The light emitting display device of claim 14, wherein in a portion overlapping the opening of the pixel defining layer in a plan view, a gap between the second conductive pattern and the dummy conductive pattern in the second direction is the same as the gap between the first conductive pattern and the dummy conductive pattern in the second direction and the gap between the second conductive pattern and the third conductive pattern in the second direction.

16. The light emitting display device of claim 14, wherein the first conductive pattern is at a third gate conductive layer, the second conductive pattern and the dummy conductive pattern are at a first gate conductive layer, and the third conductive pattern is at a second gate conductive layer.

17. A light emitting display device comprising:
a substrate;
a first data conductive layer on the substrate and comprising a first expansion comprising a first expansion portion and a second expansion portion;
a first organic film covering the first data conductive layer and comprising a data conductive layer connecting opening overlapping the first expansion portion and the second expansion portion;
a second data conductive layer on the first organic film and comprising a second expansion;
a second organic layer covering the second data conductive layer and comprising a first anode connecting opening and a second anode connecting opening;
a first anode on the second organic layer, overlapping the first expansion in a plan view, and connected through the first anode connecting opening;
a second anode overlapping the second expansion in a plan view and connected through the second anode connecting opening; and
a pixel defining layer having a first opening overlapping the first anode and a second opening overlapping the second anode,
wherein the first expansion is asymmetric in a plan view with respect to the first opening of the pixel defining layer.

18. The light emitting display device of claim 17, wherein the first expansion portion and the second expansion portion of the first expansion protrude in a first direction,
wherein gaps from two sides perpendicular to the first direction of the first expansion up to the first opening of the pixel defining layer are different from each other, and
wherein gaps from two sides in the first direction of the first expansion up to the first opening of the pixel defining layer are different from each other.

19. The light emitting display device of claim 17, wherein the first expansion portion and the second expansion portion of the first expansion protrude in a first direction, and
wherein a width of the first expansion in a second direction perpendicular to the first direction is different from a width of the second expansion in the second direction.

20. A light emitting display device comprising:
a substrate;
a first data conductive layer on the substrate and comprising a first expansion comprising a first expansion portion and a second expansion portion;
a first organic film covering the first data conductive layer and comprising a data conductive layer connecting opening overlapping the first expansion portion and the second expansion portion;
a second data conductive layer on the first organic film and comprising a second expansion;
a second organic layer covering the second data conductive layer and comprising a first anode connecting opening and a second anode connecting opening;
a first anode on the second organic layer, overlapping the first expansion in a plan view, and connected through the first anode connecting opening;
a second anode overlapping the second expansion in a plan view and connected through the second anode connecting opening; and
a pixel defining layer having a first opening overlapping the first anode and a second opening overlapping the second anode,
wherein the second expansion is asymmetric in a plan view with respect to the second opening of the pixel defining layer.

* * * * *